(12) United States Patent
Sugimoto et al.

(10) Patent No.: US 9,334,556 B2
(45) Date of Patent: May 10, 2016

(54) DEPOSITION MASK, PRODUCING METHOD THEREFOR AND FORMING METHOD FOR THIN FILM PATTERN

(71) Applicant: V TECHNOLOGY CO., LTD., Yokohama-shi (JP)

(72) Inventors: Shigeto Sugimoto, Yokohama (JP); Koichi Kajiyama, Yokohama (JP); Michinobu Mizumura, Yokohama (JP); Syuji Kudo, Yokohama (JP); Eriko Kimura, Yokohama (JP); Hany Maher Aziz, Oakville (CA); Yoshitaka Kajiyama, Waterloo (CA)

(73) Assignee: V Technology Co., Ltd., Yokohama-Shi (JP)

( * ) Notice: Subject to any disclaimer, the term of this patent is extended or adjusted under 35 U.S.C. 154(b) by 0 days.

(21) Appl. No.: 14/214,428

(22) Filed: Mar. 14, 2014

(65) Prior Publication Data

US 2014/0199808 A1 Jul. 17, 2014

Related U.S. Application Data

(63) Continuation of application No. PCT/JP2012/073617, filed on Sep. 14, 2012.

(30) Foreign Application Priority Data

| Sep. 16, 2011 | (JP) | 2011-203154 |
| Sep. 16, 2011 | (JP) | 2011-203155 |
| Oct. 24, 2011 | (JP) | 2011-232538 |
| Nov. 4, 2011 | (JP) | 2011-242089 |
| Nov. 4, 2011 | (JP) | 2011-242090 |
| Nov. 22, 2011 | (JP) | 2011-255298 |
| Feb. 20, 2012 | (JP) | 2012-033657 |
| Feb. 24, 2012 | (JP) | 2012-038101 |
| Mar. 30, 2012 | (JP) | 2012-079207 |
| Mar. 30, 2012 | (JP) | 2012-080707 |

(51) Int. Cl.
*C23C 14/04* (2006.01)
*B05B 15/04* (2006.01)
(Continued)

(52) U.S. Cl.
CPC ............. *C23C 14/042* (2013.01); *B05B 15/045* (2013.01); *B23K 26/381* (2013.01);
(Continued)

(58) Field of Classification Search
CPC ...... C23C 14/042; C23C 14/24; C23C 14/48; C23C 14/34; H01L 51/0011; B05B 15/045; Y10T 156/10
See application file for complete search history.

(56) References Cited

U.S. PATENT DOCUMENTS

2006/0240338 A1 10/2006 Satoh et al.

FOREIGN PATENT DOCUMENTS

| JP | 57-034579 | 2/1982 |
| JP | 61-123570 U | 8/1986 |

(Continued)

OTHER PUBLICATIONS

Japanese Patent Office Communication mailed Dec. 3, 2013 in Appln. No. 2012-033657 with partial English language translation thereof.
(Continued)

*Primary Examiner* — David Vu
(74) *Attorney, Agent, or Firm* — McDermott Will & Emery LLP

(57) ABSTRACT

A deposition mask for forming a thin film pattern having a predetermined shape on a substrate by deposition, includes a resin film that transmits visible light and has an opening pattern penetrating through the resin film and having the same shape and dimension as those of the thin film pattern so as to correspond to a preliminarily determined forming region of the thin film pattern on the substrate.

28 Claims, 51 Drawing Sheets

(51) Int. Cl.
    *B23K 26/38* (2014.01)
    *H01L 51/00* (2006.01)
    *C23C 14/24* (2006.01)
    *C23C 14/34* (2006.01)
    *C23C 14/48* (2006.01)

(52) U.S. Cl.
    CPC ............... *B23K26/382* (2015.10); *C23C 14/24* (2013.01); *C23C 14/34* (2013.01); *C23C 14/48* (2013.01); *H01L 51/0011* (2013.01); *Y10T 156/10* (2015.01)

(56) References Cited

FOREIGN PATENT DOCUMENTS

| | | |
|---|---|---|
| JP | 09-143677 A1 | 6/1997 |
| JP | 10-261486 A | 9/1998 |
| JP | 11-158605 | 6/1999 |
| JP | 2000-208254 A | 7/2000 |
| JP | 2001-118679 A | 4/2001 |
| JP | 2001-237071 A | 8/2001 |
| JP | 2002-216957 A | 8/2002 |
| JP | 2003-073804 A | 3/2003 |
| JP | 2003-101188 A | 4/2003 |
| JP | 2004-043898 A | 2/2004 |
| JP | 2004-087466 A | 3/2004 |
| JP | 2004-190057 A | 7/2004 |
| JP | 2004-225077 A | 8/2004 |
| JP | 2004-362908 A | 12/2004 |
| JP | 2005-517810 A | 6/2005 |
| JP | 2007-053134 A | 3/2007 |
| JP | 2008-001959 A | 1/2008 |
| JP | 2008-255433 A | 10/2008 |
| JP | 2008-255435 A | 10/2008 |
| JP | 2008-274373 A | 11/2008 |
| JP | 2009-062565 A | 3/2009 |
| JP | 2009-164020 A | 7/2009 |
| JP | 2009-249706 A | 10/2009 |
| JP | 2011-501380 A | 1/2011 |
| JP | 2011-65837 | 3/2011 |
| JP | 2011-071335 A | 4/2011 |
| JP | 2011-165581 A | 8/2011 |
| JP | 2012-111985 A | 6/2012 |
| TW | 200520056 | 6/2005 |
| WO | 03/069016 A2 | 8/2003 |
| WO | 2009/054896 A1 | 4/2009 |

OTHER PUBLICATIONS

International Preliminary Report on Patentability dated Mar. 27, 2014, which issued in PCT/JP2012/073617; and English language translation thereof.

Japanese Office Action dated Oct. 6, 2015, which issued in Japanese Application No. 2011-232538, and English language translation thereof.

Japanese Office Action dated Oct. 27, 2015, which issued in Japanese Application No. 2012-033657, and its English language translation.

Japanese Office Action dated Nov. 10, 2015, which issued in Japanese Application No. 2011-242089, and its English language translation.

Chinese Office Action dated Mar. 2, 2016, which issued in Chinese Application No. 201280044893.9, together with a partial English language translation thereof.

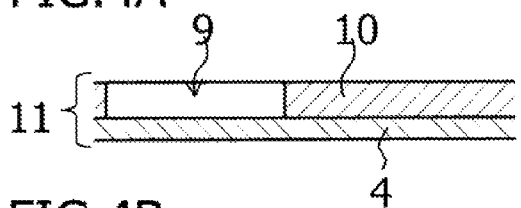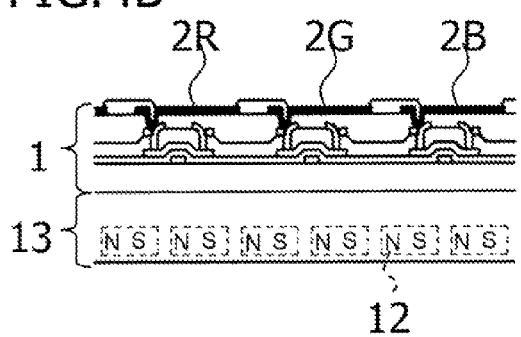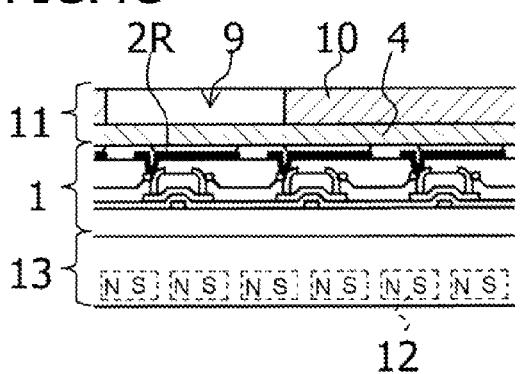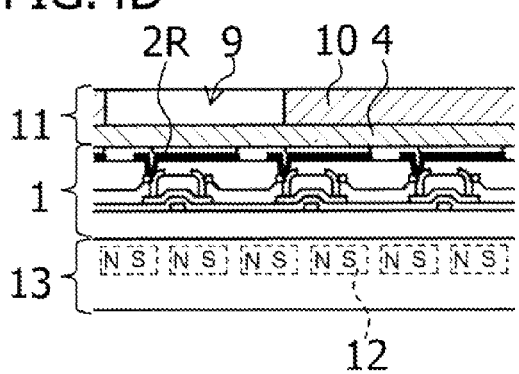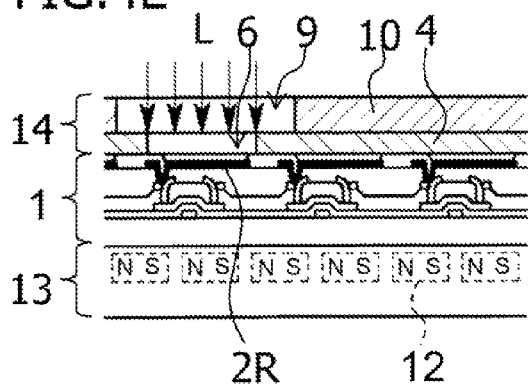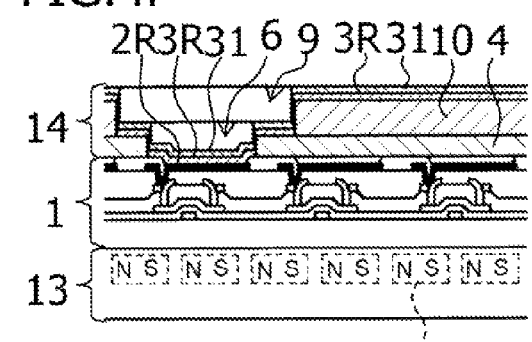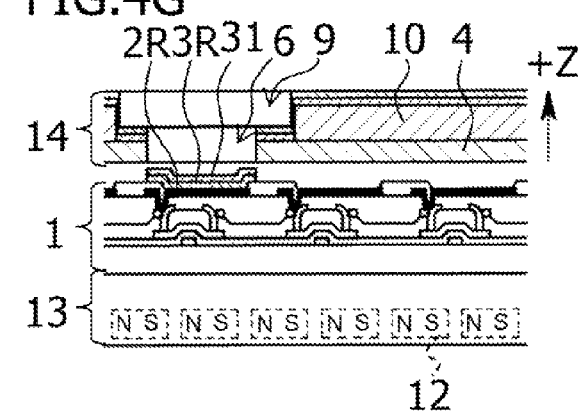

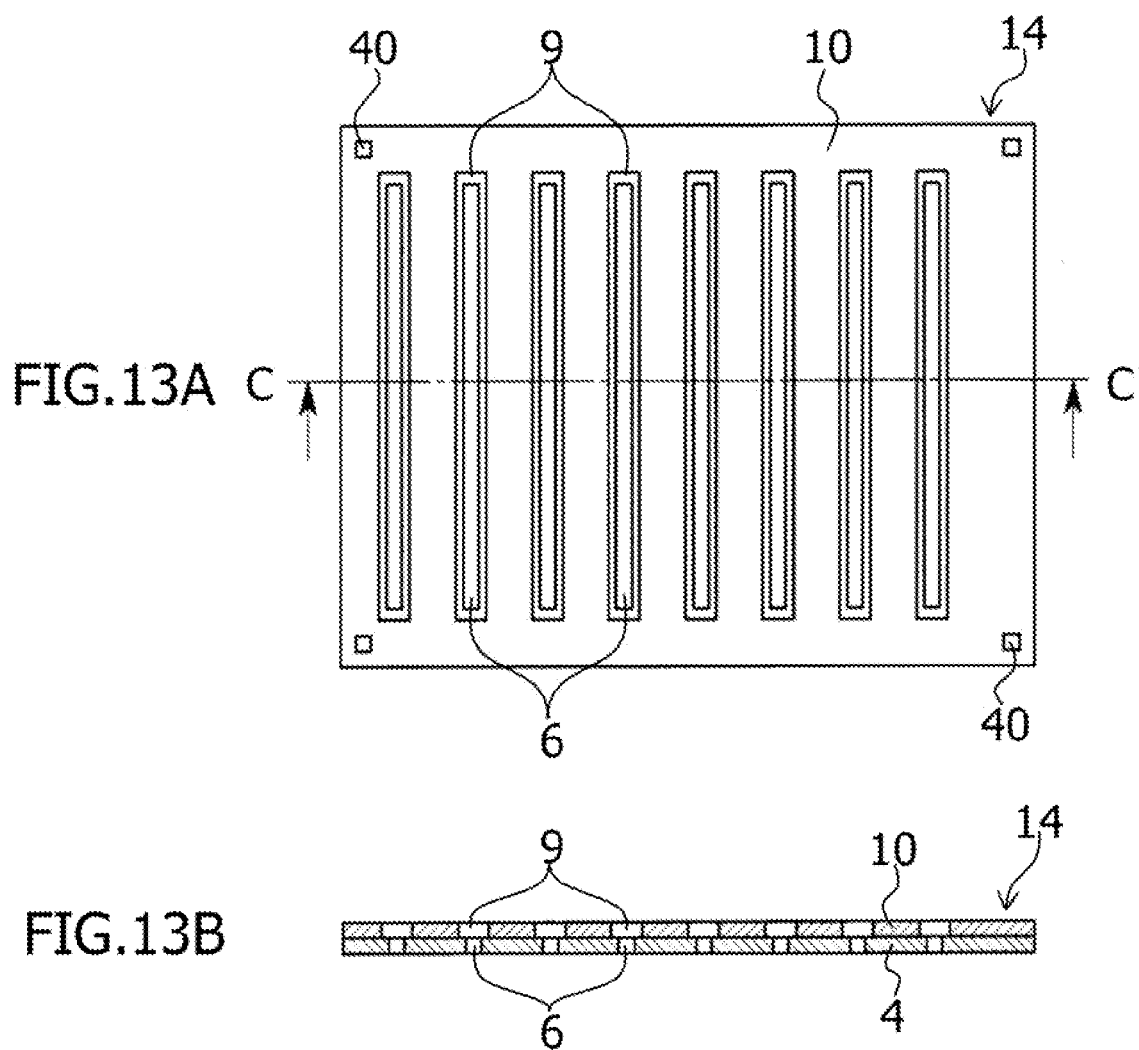

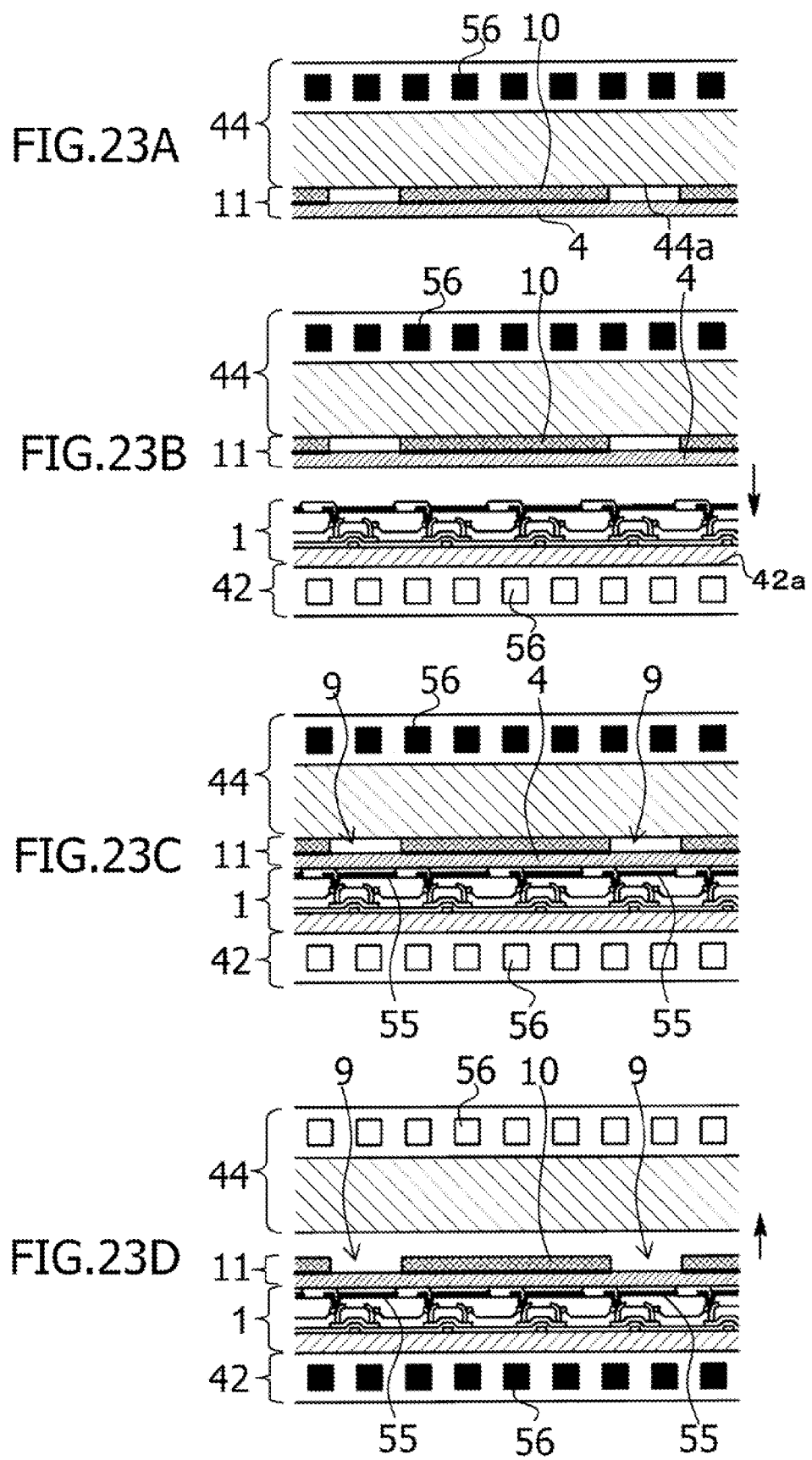

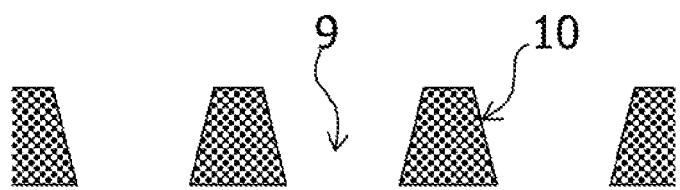
FIG.25A
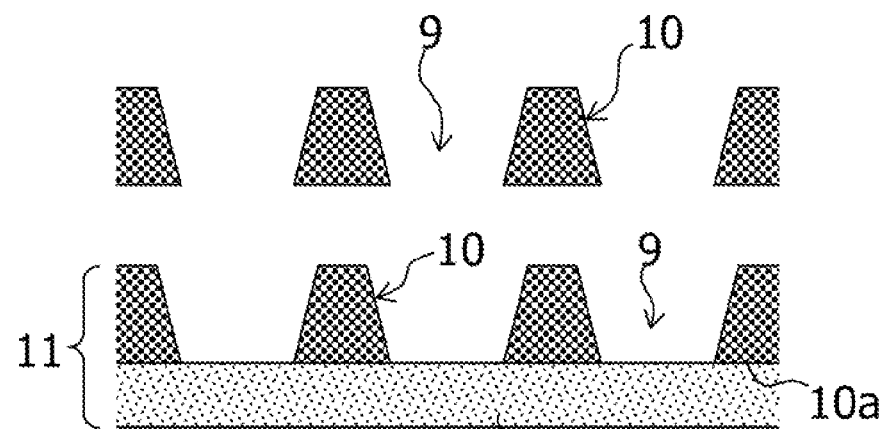
FIG.25B
FIG.25C
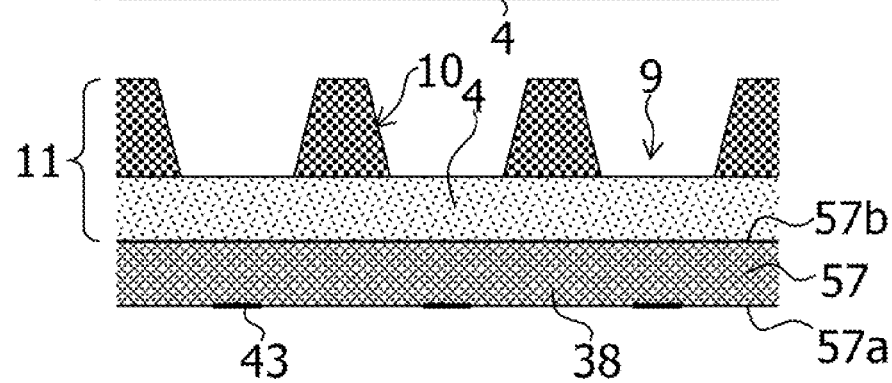
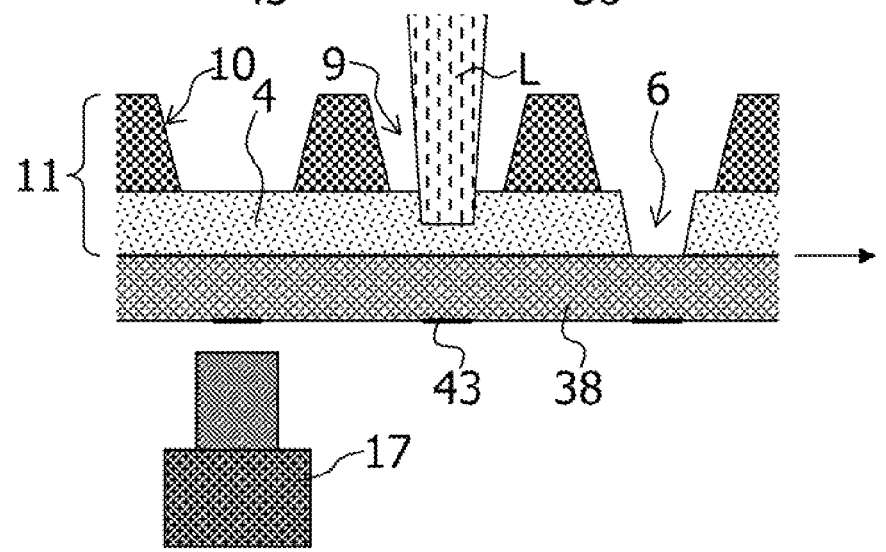
FIG.25D
FIG.25E
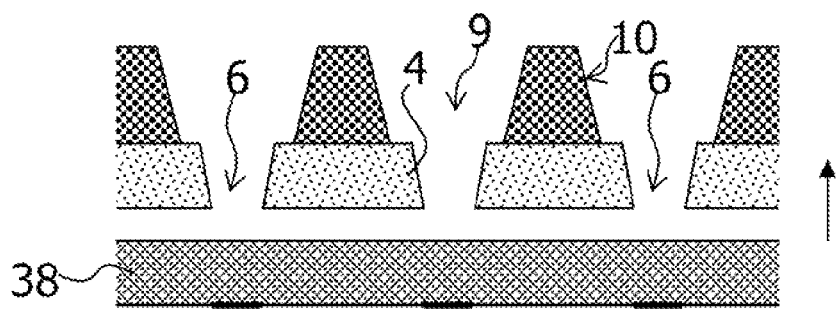

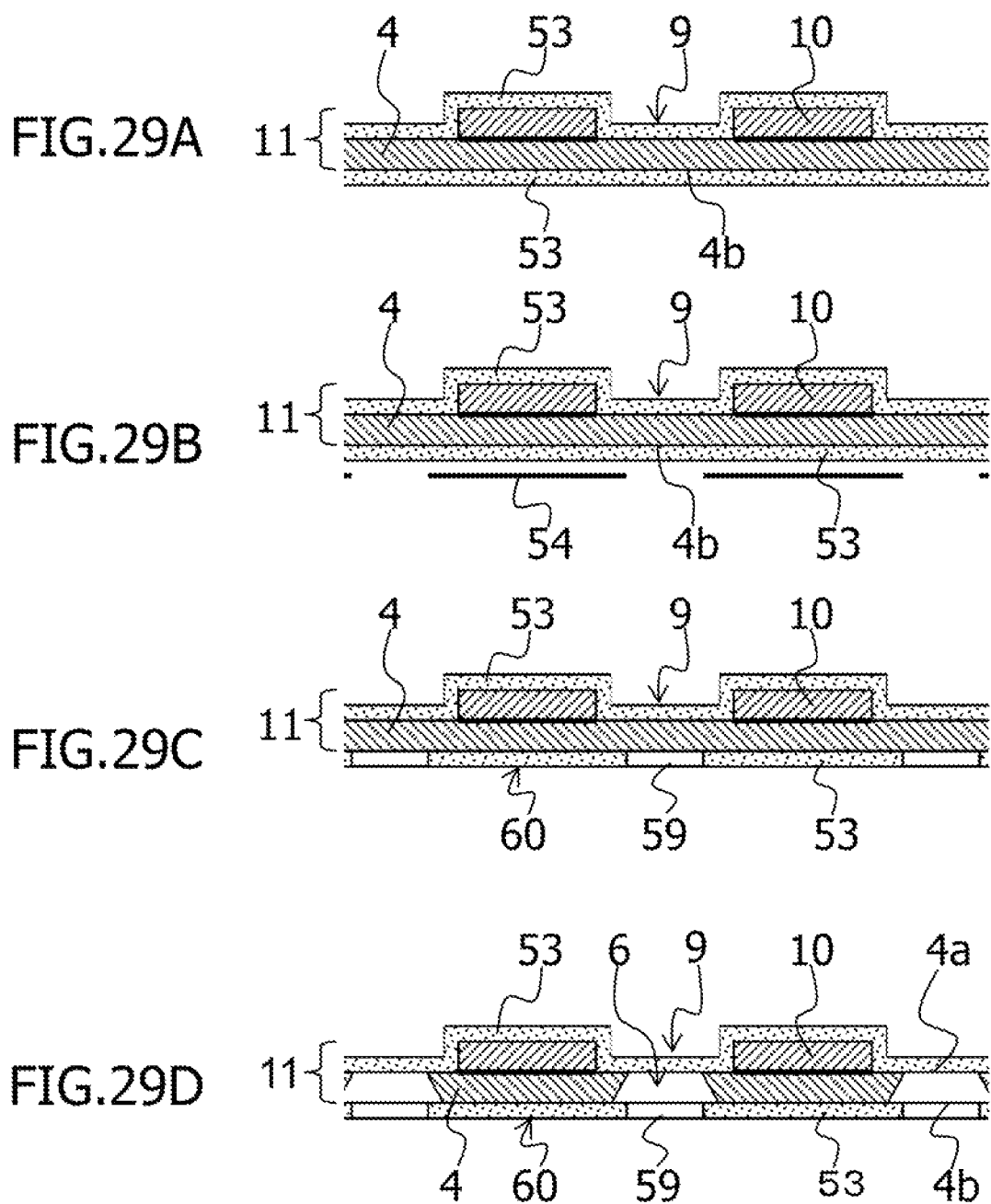

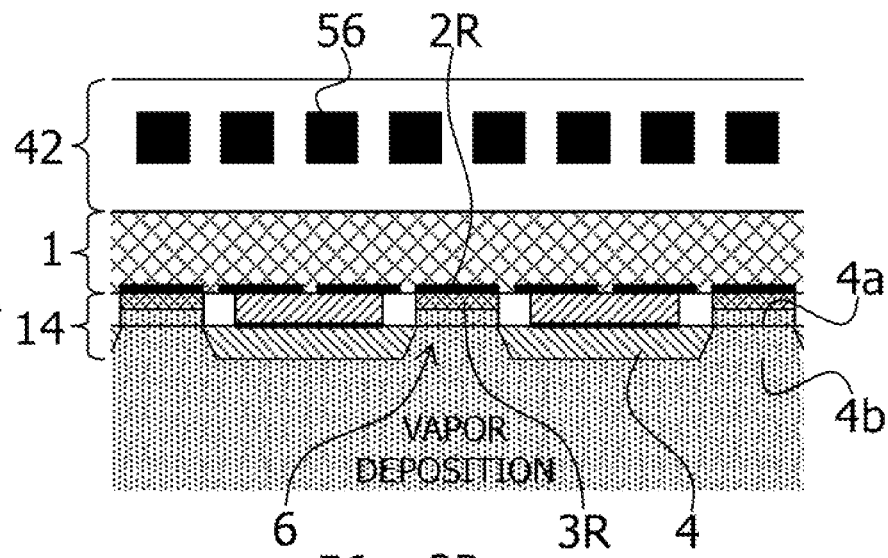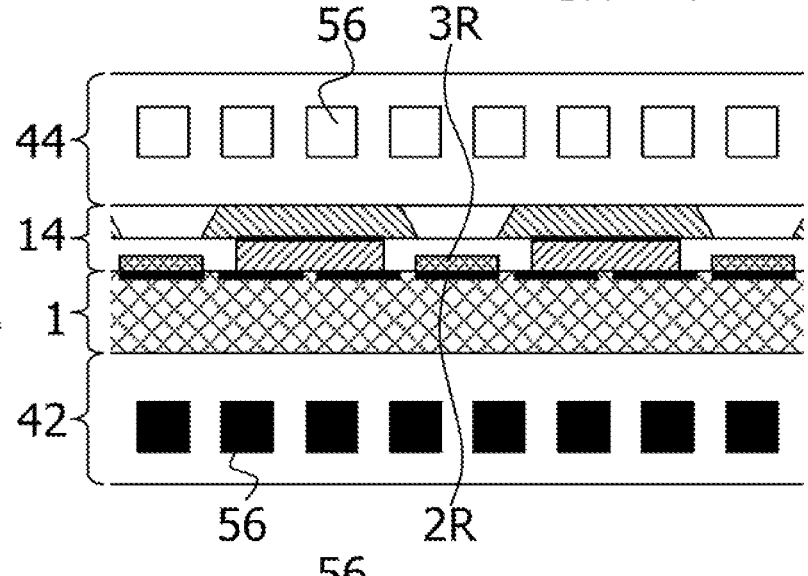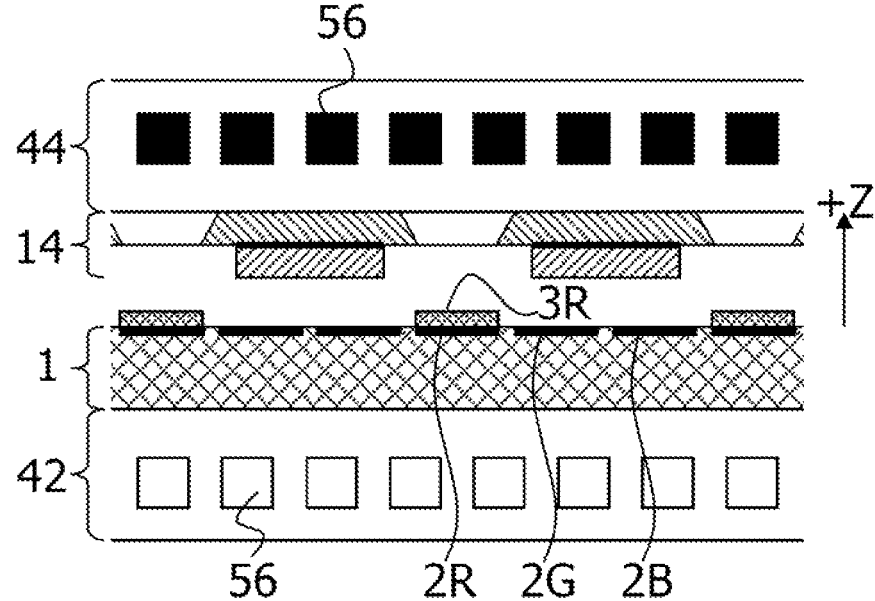

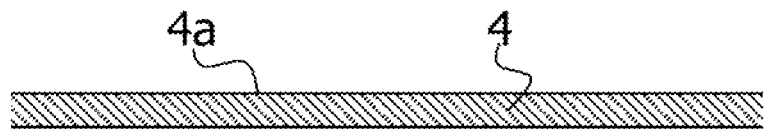
FIG.35A
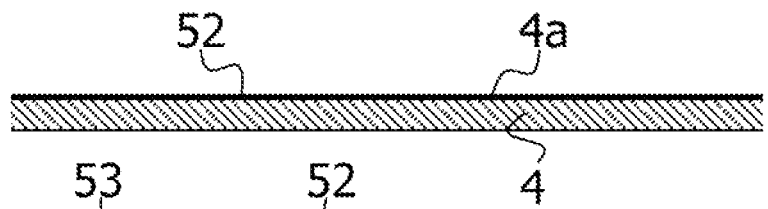
FIG.35B
FIG.35C
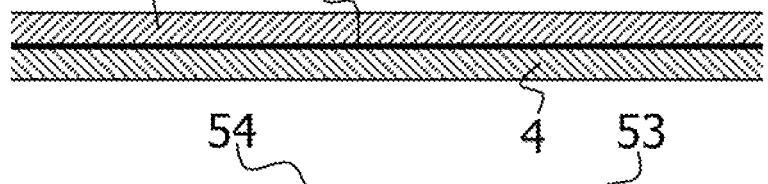
FIG.35D
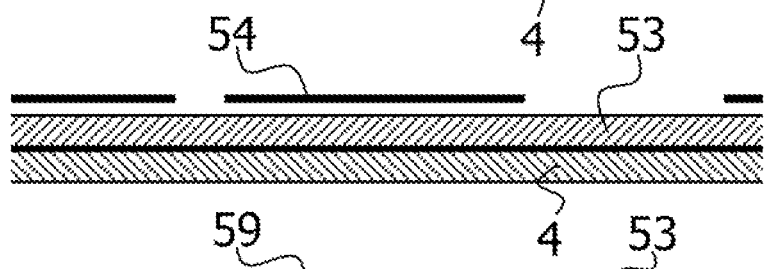
FIG.35E
FIG.35F
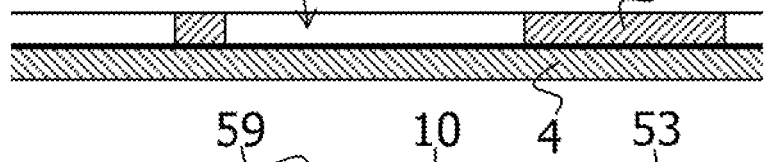
FIG.35G
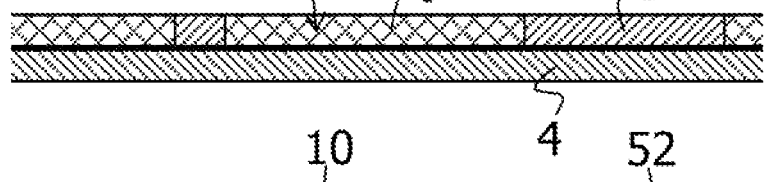
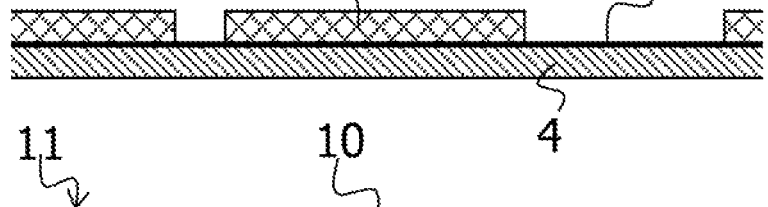
FIG.35H

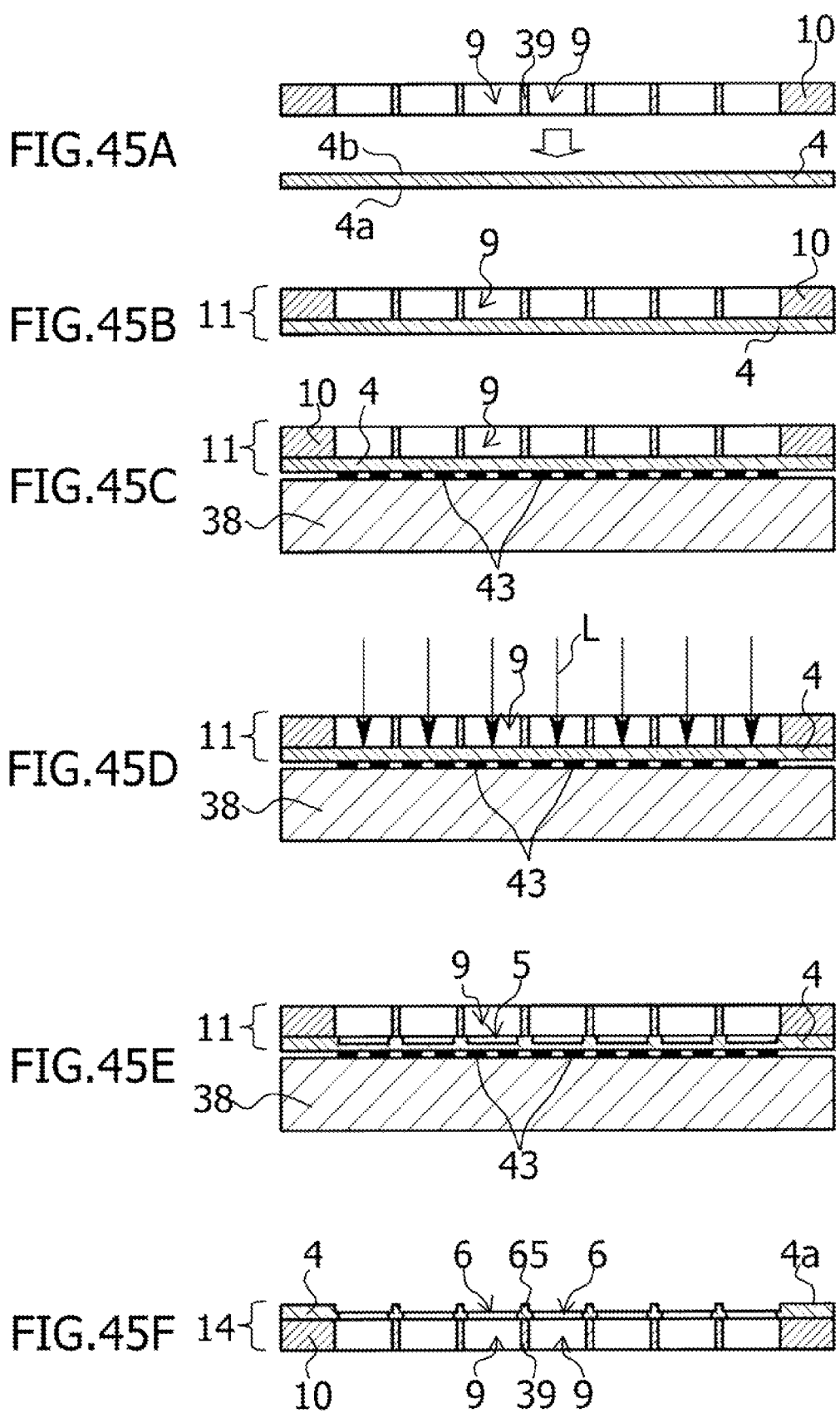

DEPOSITION MASK, PRODUCING METHOD THEREFOR AND FORMING METHOD FOR THIN FILM PATTERN

CROSS-REFERENCE TO RELATED APPLICATION

This application is a continuation application of PCT/JP2012/073617, filed on Sep. 14, 2012.

BACKGROUND OF THE INVENTION

1. Field of the Invention

The present invention relates to a deposition mask for forming a plurality of thin film patterns on a substrate by deposition, and in particular, relates to a deposition mask enabling formation of fine thin film patterns, a method for producing the deposition mask and forming thin film patterns.

2. Description of Related Art

Conventionally, this sort of mask has openings having a shape corresponding to a predetermined pattern, and which is configured to be aligned to a substrate, brought into close contact with the substrate and used for deposition to the substrate through the openings to form the patterns (for example, refer to Japanese Laid-open (Kokai) Patent Application Publication No. 2003-73804 (Patent Document 1)).

Furthermore, another deposition mask is a metal mask made of a ferromagnetic material provided with openings corresponding to a predetermined pattern, which is configured to be brought into close contact with a substrate so as to cover one surface thereof and is fixed to the substrate by using a magnetic force of a magnet disposed on the other side of the substrate, and is used for adhering a deposition material to the surface of the substrate through the above openings in a vacuum chamber of a vacuum deposition apparatus, to thereby form a thin film pattern (for example, refer to Japanese Laid-open (Kokai) Patent Application Publication No. 2009-164020 (Patent Document 2)).

However, among conventional deposition masks, the deposition mask disclosed in Patent Document 1 is, in general, a thin metal plate having openings corresponding to a thin film pattern formed by etching, for example. Thus, it is difficult to form the openings with high accuracy, and due to alignment error caused by thermal expansion or warp of the metal plate, it is difficult to form a fine thin film pattern of, for example, 300 dpi or higher.

Furthermore, the deposition mask disclosed in Patent Document 2 is improved in close contact with the substrate as compared with the deposition mask of Patent Document 1. However, in the same manner as the deposition mask of Patent Document 1, since the mask is a thin metal plate having openings corresponding to a thin film pattern formed by etching, for example, it is difficult to form the openings with high accuracy, and it is difficult to form a fine pattern of, for example, 300 dpi or higher.

Therefore, in view of the abovementioned problem, it is an object of the present invention to provide a deposition mask enabling formation of a fine thin film pattern, a method for producing the deposition mask and a method for forming a thin film pattern.

SUMMARY OF THE INVENTION

In order to achieve the above object, a deposition mask according to a first aspect of the present invention is a deposition mask for forming a thin film pattern having a predetermined shape on a substrate by deposition, including a resin film that transmits visible light and has an opening pattern penetrating through the resin film and having the same shape and dimension as those of the thin film pattern so as to correspond to a preliminarily determined forming region of the thin film pattern on the substrate.

It is preferred that the deposition mask has a metal member provided on a portion of the film outside the opening pattern. In this case, it is preferred that the metal member be a thin plate that has an opening corresponding to the opening pattern and having a dimension greater than the opening pattern, and be provided in close contact with one surface of the film. As an alternative, the metal member may be a plurality of thin pieces provided so as to be distributed on one surface or inside of the film.

Furthermore, in a method for producing a deposition mask according to a second aspect of the present invention, an opening pattern having the same shape and dimension as those of the thin film pattern is formed through a resin film that transmits visible light so as to correspond to a preliminarily determined forming region of the thin film pattern on a substrate. The method includes: a first step of bringing the film into close contact with a substrate on which the thin film pattern is to be formed, or with a reference substrate provided with a plurality of reference patterns having the same pitch as that of the thin film pattern and having the same shape and dimension of those of the thin film pattern; and a second step of processing a portion of the film corresponding to the forming region of the thin film pattern on the substrate on which the thin film pattern is to be formed or the reference patterns on the reference substrate, to form an opening pattern having the same shape and dimension as those of the thin film pattern.

It is preferred that the first step is performed, after bringing a metal member having an opening formed so as to correspond to the thin film pattern and having a shape and size greater than those of the thin film pattern, into close contact with one surface of the film, thereby forming a masking member, by aligning the masking member so that the region corresponding to the forming region of the thin film pattern on the substrate on which the thin film pattern is to be formed or the reference patterns on the reference substrate, is within the openings.

Furthermore, it is preferred that the second step is performed by irradiating the portion of the film with laser light. In this case, it is preferred that the second step includes irradiating the film with laser light having a predetermined energy density to process the film at a predetermined speed to form a hole of a predetermined depth, followed by irradiating a bottom portion of the hole with laser light having a lowered energy density to process the portion at a lower speed than the above speed to make the hole penetrate through the film.

As an alternative, the second step includes irradiating the film with laser light having a predetermined energy density to form the hole in the film, followed by etching the bottom portion of the hole by using a reactive gas that reacts with carbon of the film to evaporate the carbon, or by using radical ions produced by ionizing the reactive gas, to make the hole penetrate through the film.

Here, the laser light preferably has a wavelength of 400 nm or less.

Furthermore, in a method for producing a deposition mask according to a third aspect of the present invention, an opening pattern having the same shape and dimension as those of the thin film pattern is formed through a resin film that transmits visible light so as to correspond to a preliminarily determined forming region of the thin film pattern on a substrate, the method includes: a first step of bringing a metal member into close contact with one surface of the film, and the metal member having an opening having a shape and dimension greater than those of the thin film pattern so as to correspond to a preliminarily determined forming region of the thin film pattern on a substrate, to form a masking member; and a second step of performing an etching process to the film within the opening to form an opening pattern having the same shape and dimension as those of the thin film pattern.

It is preferred that the second step includes performing the etching process to the film from the other side thereof to form the opening pattern so that the opening area on one side of the film is the same as that of the thin film pattern and the opening area on the other side of the film is greater than the opening area on said one side of the film.

Furthermore, in a method for forming a thin film pattern according to a fourth aspect of the present invention, a thin film pattern is formed by using a deposition mask that is produced by forming through a resin film that transmits visible light an opening pattern having the same shape and dimension as those of the thin film pattern so as to correspond to a preliminarily determined forming region of the thin film pattern on a substrate. The method includes: a first step of bringing the film into close contact with the substrate; a second step of irradiating a portion of the film corresponding to the forming region of the thin film pattern with laser light, to form an opening pattern having the same shape and dimension of those of the thin film pattern on the film to thereby form the deposition mask; a third step of performing deposition on the portion corresponding to the forming region of the thin film pattern on the substrate through the opening of the deposition mask; and a fourth step of detaching the deposition mask.

It is preferred that the first step includes placing the substrate on a stage having a chucking device provided therein, aligning a masking member, that is formed by bringing a metal member into close contact with one surface of the film, the metal member being made of a magnetic or non-magnetic material having an opening having a shape and a dimension larger than those of the thin film pattern so as to correspond to the thin film pattern, so that the forming region of the thin film pattern on the substrate is present within the opening, and attracting the metal member on to the substrate by the chucking device to sandwich the film.

Furthermore, in a method for forming a thin film pattern according to a fifth aspect of the present invention, a thin film pattern is formed by using a deposition mask that is produced by forming through a resin film, that transmits visible light, an opening pattern having the same shape and dimension as those of the thin film pattern so as to correspond to a preliminarily determined forming region of the thin film pattern on a substrate. The method includes: a first step of placing on the substrate, the deposition mask having a metal member on the outside portion of the opening pattern of the film, in a state that the opening pattern is aligned to the forming region of the thin film pattern on the substrate; and a second step of performing deposition on the forming region of the thin film pattern on the substrate through the opening pattern of the deposition mask to form the thin film pattern.

It is preferred that the first step includes retaining the deposition mask so that the metal member side thereof is attracted to contact a flat surface of a retaining device, while aligning the deposition mask so that the opening pattern is aligned to the forming region of the thin film pattern of the substrate placed on a chucking device, followed by attracting the metal member by the chucking device to transfer the deposition mask from the retaining device on to the substrate.

In this case, it is preferred that in a case in which there is a plurality of sorts of thin film patterns and the opening pattern formed through the film is formed so as to correspond to one sort of thin film pattern among the plurality of sorts of thin film patterns, the method further includes: a step of detaching the deposition mask from the substrate after performing the first and the second steps to form one sort of thin film pattern; a step of aligning the opening pattern of the deposition mask to the forming region of another thin film pattern of the substrate, and placing the deposition mask onto the substrate; and a step of performing deposition on a forming region of another thin film pattern through the opening pattern of the deposition mask, to form another thin film pattern.

As an alternative, in a case in which a plurality of sorts of thin film patterns are formed so as to be arranged at a predetermined pitch; the opening pattern formed through the film is formed so as to correspond to one sort of thin film pattern among the plurality of sorts of thin film patterns, the method further includes: a step of sliding the deposition mask on the substrate along an arrangement direction of the plurality of sorts of thin film patterns by the same distance as the arrangement pitch of the plurality of sorts of thin film patterns after performing the first step and the second step to form one sort of thin film pattern; and a step of performing deposition on a forming region of another thin film pattern through the opening pattern of the deposition mask, to form another thin film pattern.

According to the embodiment of the present invention, the opening pattern through which the deposition material passes is formed in a film having smaller thickness than a metal mask, thus enabling to enhance forming accuracy of the opening pattern. Accordingly, it is possible to form a fine thin film pattern.

BRIEF DESCRIPTION OF THE DRAWINGS

FIGS. 4A to 4G are views illustrating a second embodiment of a method for producing a deposition mask of the present invention, and a second embodiment of a method for forming a thin film pattern of the present invention, which are cross-sectional explanation views illustrating a process for forming a red (R) organic electroluminescence (EL) layer of an organic EL display device.

FIGS. 10A and 10B are views illustrating a construction example of a photomask to be used in the laser processing apparatus, in which FIG. 10A is a front view and FIG. 10B is a cross-sectional view of a B-B section of FIG. 10A.

FIGS. 13A and 13B are views illustrating a construction example of the deposition mask, in which FIG. 13A is a front view and FIG. 13B is a cross-sectional view of a C-C section of FIG. 13A.

FIGS. 23A to 23D are a view illustrating modified example of the third embodiment of the method for producing the deposition mask of the present invention, which are cross-sectional views illustrating a first half process of the method.

FIGS. 25A to 25E are process views illustrating still modified example of the third embodiment of the method for producing the deposition mask of the present invention.

FIGS. 29A to 29D are cross-sectional views illustrating a forth embodiment of a method for producing a deposition mask of the present invention which forms an opening pattern by an etching process.

FIGS. 31A to 31C are a view illustrating a method for forming a thin film pattern by using the deposition mask produced the method illustrated in FIGS. 29A to 29D, in which are cross-sectional views illustrating a second half process of the method.

FIGS. 32A and 32B are explanation views illustrating merits of the deposition mask of the present invention having the opening pattern formed by the etching process, as compared with a conventional metal mask, in which FIG. 32A shows the metal mask and FIG. 32B shows the deposition mask of the present invention.

FIGS. 33A and 33B are views illustrating still another modified example of the deposition mask of the present invention, in which FIG. 33A is a plan view and FIG. 33B is a cross-sectional view of a D-D section in FIG. 33A.

FIGS. 34A and 34B are views illustrating a construction example of the deposition mask that forms a basis of the present invention, in which FIG. 34A is a plan view and FIG. 34B is a side view.

FIGS. 35A to 35H are views illustrating the method for producing the deposition mask of 33A to 33B, which are cross-sectional views illustrating a process for forming a mask member in the method.

FIGS. 44A to 44D are views illustrating still another modified example of the deposition mask, in which FIG. 44A is a plan view, FIG. 44B is a bottom view, FIG. 44C is a cross-sectional view of an E-E section of FIG. 44A, and FIG. 44D is a partial enlarged view of FIG. 44C.

FIGS. 45A to 45F are process views illustrating a process for producing the deposition mask of FIGS. 44A to 44D.

DESCRIPTION OF THE PREFERRED EMBODIMENTS

Figure 1A:
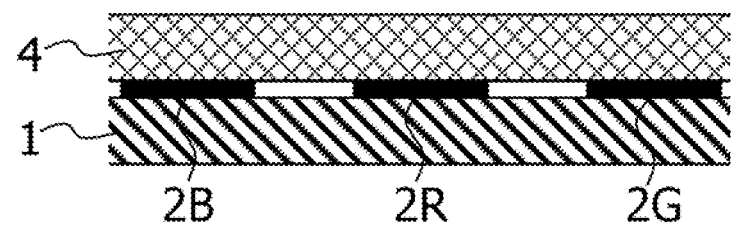
FIGS. 1A to 1E are cross-sectional explanation views illustrating a first embodiment of a method for producing a deposition mask of the present invention, and a first embodiment of a method for forming a thin film pattern of the present invention.

Hereinbelow, embodiments of the present invention will be explained with reference to the accompanying drawings. FIGS. 1A to 1E are cross-sectional explanation views illustrating a first embodiment of a method for forming a thin film pattern by using a deposition mask of the present invention. The deposition mask of the present invention has a film that is made of a resin transmitting light and has an opening pattern penetrating therethrough, so that the opening pattern corresponds to a forming region of a predetermined thin film pattern on a substrate and the opening pattern has the same shape and size of those of the thin film pattern. The mask is produced in the process of the first embodiment of the method for producing a thin film pattern. In a case in which the substrate is a TFT substrate 1 of an organic electroluminescence (EL) display device and the thin film pattern is a red (R) organic EL layer 3R formed on an anode electrode 2R corresponding to red (R), a first embodiment of a deposition mask of the present invention will be explained while describing a first embodiment of the method for producing a thin film pattern for forming the R organic EL layer 3R.

Here, the R organic EL layer 3R is formed on the anode electrode 2R corresponding to R by sequentially performing deposition of a hole injection layer, a hole transportation layer, a red light-emission layer, an electron transportation layer, and the like. However, for convenience of explanation, it is assumed that the R organic EL layer 3R is formed by a single deposition step.

The first embodiment of the method for forming a thin film pattern includes a first step of placing a film 4 that is made of a resin transmitting visible light on a TFT substrate (it may be simply referred to as "substrate") 1; a second step 2 of irradiating an anode electrode 2R portion for R on a TFT substrate 1 with laser light L1 having a predetermined energy density to dig the portion of the film 4 at a predetermined speed to a predetermined depth to form a hole 5, and processing a bottom portion of the hole 5 at a speed slower than the above speed to make the hole 5 penetrate through the film to thereby form a first embodiment of the deposition mask 7 of the present invention having an opening pattern 6 having the same shape and dimension as those of an R organic layer 3R; a third step of forming the R organic EL layer 3R on the anode electrode 2R for R by deposition through the opening pattern 6 of the deposition mask 7; and a step 4 of detaching the deposition mask 7.

In more detail, in the first step, above a surface of the TFT substrate 1 on which anode electrodes 2R to 2B for respective colors are formed, a sheet-shaped film 4 of, for example, polyethylene terephthalate (PET) or polyimide having a thickness of from 10 μm to 30 μm to which UV laser abrasion is possible, is stretched, and thereafter, as illustrated in FIG. 1A, the film 4 is placed on a surface of the TFT substrate 1. In this case, an upper surface of the film 4 is preferably uniformly pressed by an elastic member such as a urethane rubber to bring the film 4 into close contact with the surface of the TFT substrate 1. As an alternative, a surface of the film 4 to contact with the surface of the TFT substrate 1 may be provided with an adhesion layer, and the film 4 may be brought into close contact with the surface of the TFT substrate 1 via the adhesion layer. As another alternative, a film having a self-adhesion function may be employed. As still another alternative, the film 4 may be electrostatically attracted to the surface of the TFT substrate 1 by using for example, an electrostatic chuck. As still another alternative, the TFT substrate 1 may be placed on a stage having a chucking device provided therein using a magnet, and thereafter, a metal member containing a magnetic material and having an opening having a shape and a dimension greater than those of a pattern of the organic EL layer may be aligned and placed on the TFT substrate 1 so that the anode electrode 2R for R is positioned in the opening, and the metal member may be attracted to the TFT substrate 1 by a static magnetic field of the magnet to thereby bring the film 4 into close contact with the surface of the TFT substrate 1.

Figure 1B:
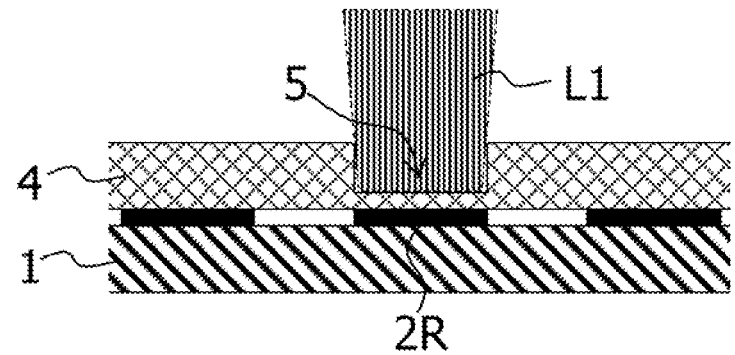
Figure 1C:
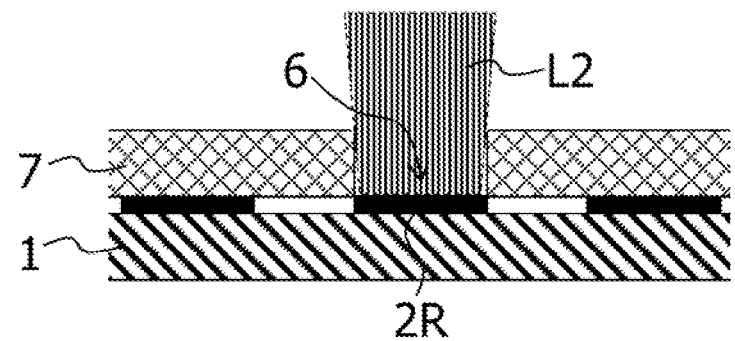

Next, in the second step, the position of the anode electrode 2R for R is detected through the film 4 by an image capturing device, that is not illustrated, to locate an irradiation position of laser light on the anode electrode 2R for R. Furthermore, by using a laser having a wavelength of 400 nm or shorter such as a KrF excimer laser of 248 nm, as illustrated in FIG. 1B, first, a portion of the film 4 corresponding to the anode electrode 2R on the TFT substrate 1 is irradiated with laser light L having an energy density of from 1 J/cm$^2$ to 20 J/cm$^2$ to form a hole 5 at high speed until a timing just before the anode electrode 2R being an underlayer is exposed, for example, until a layer above the electrode becomes about 2 μm thick, and thereafter, irradiation with laser light L1 is once stopped. Next, as illustrated in FIG. 1C, a bottom portion of the hole 5 is irradiated with laser light L2 having a lowered energy density of 0.1 J/cm$^2$ or lower, preferably 0.06 J/cm$^2$ or lower to slowly process the bottom portion of the hole 5 to make it penetrate through the film, to thereby form the deposition mask 7 (first embodiment) of the present invention having the opening pattern 6. Since carbon bond of the film 4 is immediately destroyed by light energy of UV laser lights L1 and L2 and removed, it is possible to perform a clean penetrating process producing no residue. Furthermore, since the film 4 is processed at high speed by irradiation with laser light L1 having a high energy density to a predetermined depth and thereafter processed slowly by laser light L2 having a lowered energy density, it is possible to efficiently process only film 4 while suppressing a damage to the anode electrode 2R.

The abovementioned second step may be performed in the following manner. That is, while the TFT substrate 1 is step-moved in a predetermined direction, the anode electrode 2R portion for R is irradiated with laser lights L1 and L2 via a microlens array having a plurality of microlenses arranged in a single row in a direction intersecting the moving direction of the TFT substrate 1, to form the opening pattern 6 in the film 4. As an alternative, while the TFT substrate 1 is step-moved in a two-dimensional direction in a plane parallel to a substrate surface, the film 4 may be irradiated with laser lights L1 and L2 to form the opening pattern 6 in the film 4. As an alternative, the film 4 may be irradiated with laser lights L1 and L2 via a microlens array having a plurality of microlenses provided so as to correspond to a plurality of anode electrodes 2R of the TFT substrate 1, to form opening patterns 6 in the film 4 by a single irradiation. As another alternative, laser light L1 or L2 having an elongated shape may be produced by a cylindrical lens, and a stripe-shaped opening pattern 6 may be formed in the film 4, to thereby make a R organic EL layer 3R in a striped pattern (thin film pattern).

Figure 2A:
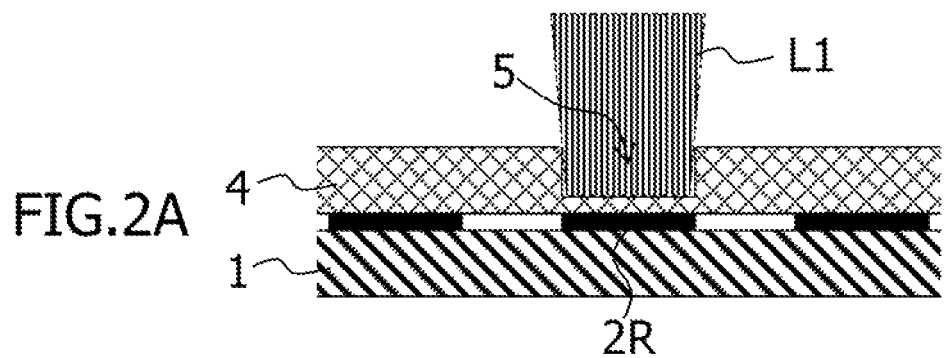
FIGS. 2A to 2C are cross-sectional views illustrating a modified example of the first embodiment of method for producing the deposition mask of the present invention, and in particular, illustrating a process for forming the opening pattern.
Figure 2B:
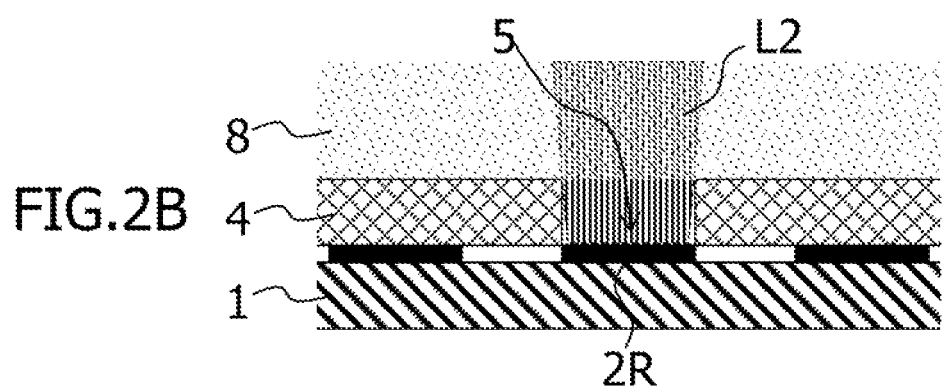
Figure 2C:
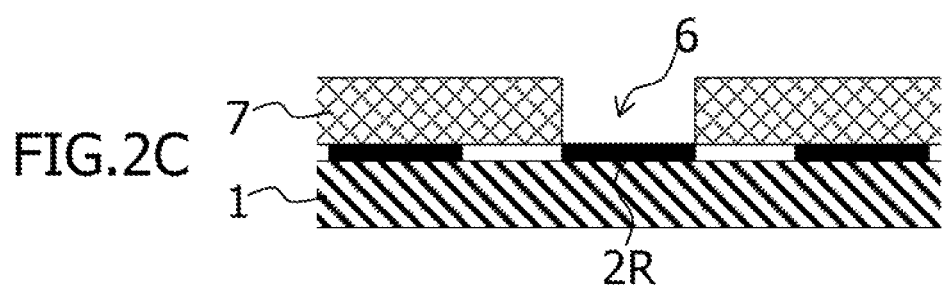

FIGS. 2A to 2C are cross-sectional views illustrating a modified example of the first embodiment of the method for producing the deposition mask of the present invention, and in particular, illustrating a process for forming the opening pattern.

According to the method, first, as illustrated in FIG. 2A, an anode electrode 2R portion for R on the TFT substrate 1 is irradiated with laser light L1 having an energy density of from 1 J/cm$^2$ to 20 J/cm$^2$ to dig the portion of the film 4 to a predetermined depth to form a hole 5, and thereafter, as illustrated in FIG. 2B, in an atmosphere of reactive gas 8 that reacts with carbon of the film 4 and evaporates carbon, a bottom portion of the hole 5 is irradiated with laser light L2 having a lowered energy density of 0.1 J/cm$^2$ or lower, preferably 0.06 J/cm$^2$ or lower to slowly process the bottom portion of the hole 5 to make it penetrate through the film, to form the opening pattern 6 as illustrated in FIG. 2C. In this case, as the reactive gas 8, for example, ozone ($O_3$) gas or mixed gas of methane tetrafluoride ($CF_4$) may be employed. In this method, even if a spread material due to laser irradiation adheres to a surface of the film 4 or in the opening pattern 6, the reactive gas 8 etches and removes the spread material to clean the surface of the anode electrode 2R in the opening pattern 6, to thereby enhance adhesion of an organic EL layer 3 to the anode electrode 2R to improve an yield rate at a time of forming the organic EL layer.

Figure 3A:
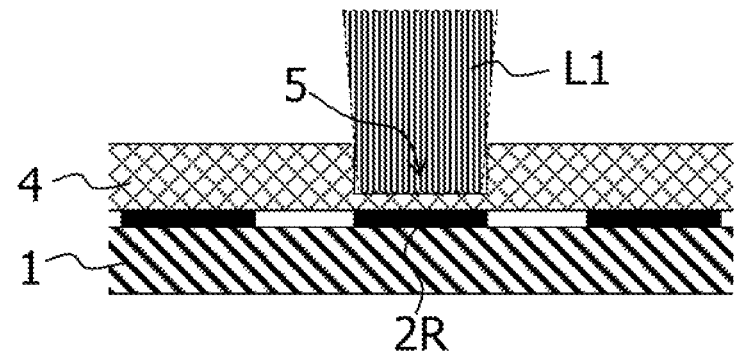
FIG. 3A to 3C are cross-sectional views illustrating still modified example of the first embodiment of method for producing the deposition mask of the present invention, and in particular, illustrating a process for forming the opening pattern.
Figure 3B:
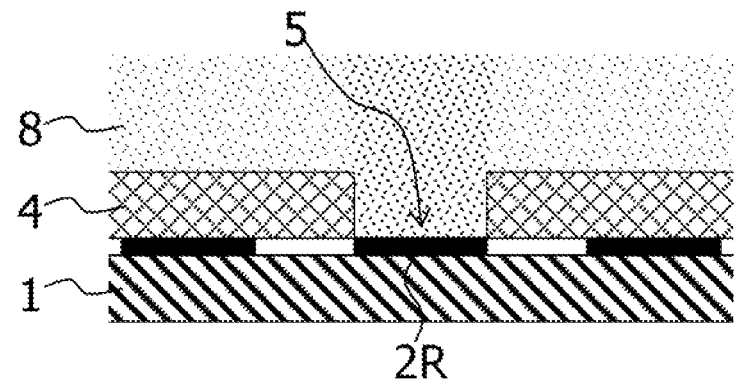
Figure 3C:
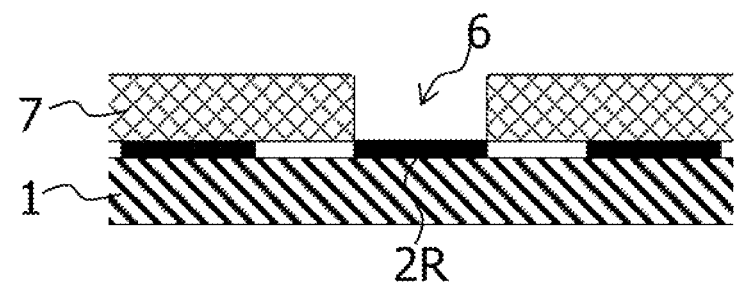

FIGS. 3A to 3C are cross-sectional views illustrating still modified example of the first embodiment of the method for producing the deposition mask of the present invention, and in particular, illustrating a process for forming the opening pattern.

According to this method, first, as illustrated in FIG. 3A, for example, the anode electrode 2R portion for R on the TFT substrate 1 is irradiated with, for example, laser light L1 having an energy density of form 1 J/cm$^2$ to 20 J/cm$^2$ to dig the portion of the film 4 to a predetermined depth to form a hole 5, and thereafter, irradiation with laser light L1 is stopped, and subsequently, as illustrated in FIG. 3B, etching of the film 4 is carried out by a reactive gas 8 such as ozone ($O_3$) gas or mixed gas of methane tetrafluoride ($CF_4$) and the ozone, that reacts with carbon of the film 4 and evaporates carbon, to make the hole 5 penetrate through the film 4, to thereby form the opening pattern 6 having a predetermined shape as illustrated in FIG. 3C.

In this case, it is possible to etch only the film 4 efficiently without damaging the anode electrodes 2R to 2B by making use of an etch selectivity of the reactive gas 8 between the film 4 and the anode electrodes 2R to 2B, to form the opening pattern 6. Furthermore, by the etching with the reactive gas 8, it is possible to clean surfaces of the anode electrodes 2R to 2B in the opening pattern 6 to thereby enhance adhesion of the organic EL layer to the anode electrodes 2R to 2B to improve an yield rate at a time of forming the organic EL layer. Furthermore, since the hole 5 is processed at high speed by irradiation of laser light L1 having a high energy density and thereafter a bottom portion of the hole 5 is processed slowly by etching to make it penetrate through the film, it is possible to efficiently process only the film 4 while suppressing damage to the anode electrodes 2R to 2B without sacrificing a process time.

Here, the film 4 may be etched by radical ions produced by ionizing oxygen ($O_2$) gas or mixed gas of carbon tetrafluoride ($CF_4$) instead of the reactive gas 8.

The produced deposition mask includes only the resin film 4 that transmits visible light and has the opening pattern 6 penetrating through the resin film and having the same shape and dimension as those of a thin film pattern so as to correspond to a preliminarily determined forming region of the thin film pattern on the substrate.

Figure 1D:
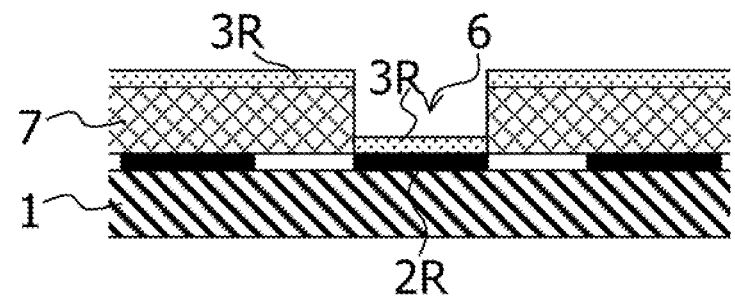

In the third step, as illustrated in FIG. 1D, for example, by using a vapor deposition apparatus, the R organic EL layer 3R is formed by vapor deposition on the anode electrode 2R for R on the TFT substrate 1 through the opening pattern 6 of the deposition mask 7. At this time, by performing the vapor deposition in a state in which the anode electrodes 2G and 2B for G and B are energized to apply a predetermined voltage to the anode electrodes 2G and 2B, the film-shaped deposition mask 7 is attracted and fixed to the anode electrodes 2G and 2B for G and B by electrostatic attraction, and thus, there is no possibility that the deposition mask 7 moves to cause a position error between the opening pattern 6 of the deposition mask 7 and the anode electrode 2R for R on the TFT substrate 1. Furthermore, since the deposition mask 7 closely contacts with the surface of the TFT substrate 1, there is no possibility that a gap is formed between a lower surface of the deposition mask 7 and the upper surface of the TFT substrate 1. Therefore, it is possible to avoid a problem that vapor deposition molecules enter and adhere to the gap to deteriorate forming accuracy of the thin film pattern.

In the third step, before forming the R organic EL layer 3R, impurities on the anode electrode 2R for R is preferably removed. The impurities include residues of, for example, the film 4 abraded in the second step. When the R organic EL layer 3R is vapor-deposited in a state in which such impurities adhere to the surface of the anode electrode 2R for R, the electric resistance of the anode electrode 2R for R rises, and thus, a problem in drive of R organic EL layer 3R may occur. Furthermore, such impurities include one which corrodes the organic EL layer, which may shorten the service life of the organic EL layer.

In order to remove such impurities, etching or laser is used. In a case of performing the etching, it is preferred to perform dry etching using $O_2$ (oxygen), mixed gas of $O_2$ and Ar (argon), or mixed gas of $O_2$, Ar and $CF_4$ (carbon tetrafluoride), and the like, to thereby remove the impurities. Furthermore, in a case of using laser, it is possible to use a green laser having an energy density of about 0.5 J/cm$^2$ and a wavelength of 532 nm, a UV laser of 355 nm, a DUV lase of 266 nm, and the like. In this case, it is preferred to use $O_2$ (oxygen), mixed gas of $O_2$ and Ar (argon), or mixed gas of $O_2$, Ar and $CF_4$ (carbon tetrafluoride), and the like, as assist gas.

Furthermore, an electrode material is preferably deposited on the anode electrode 2R from which the impurities have been removed. Here, the electrode material means a material for forming the anode electrode and includes, for example, Al (aluminum), Mg (magnesium).

Such an electrode material is deposited by a method such as sputtering, vacuum vapor deposition, or ion plating, on a surface of the anode electrode 2R for R through the opening pattern 6 formed in the film 4.

Figure 1E:
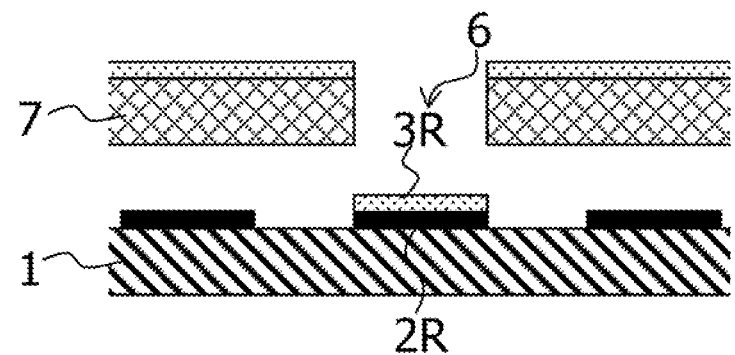

In the fourth step, as illustrated in FIG. 1E, an edge portion of the deposition mask 7 is lifted upwardly to mechanically detach the deposition mask 7 from the surface of the TFT substrate 1. In this step, an R organic EL layer 3R remains on the anode electrode 2R for R, and thus, the step of forming an R organic EL layer is completed. In this case, the thickness of the deposition mask 7 is from about 10 μm to 30 μm, while the thickness of the R organic EL layer is about 100 nm. The thickness of the R organic layer 3R adhering to a side wall of the opening pattern 6 of the deposition mask 7 is extremely small, and thus, the deposition mask 7 is easily separated from the R organic EL layer 3R on the anode electrode 2R for R. Accordingly, there is no possibility that the R organic layer 3R on the anode electrode 2R for R is detached at the time of detaching the deposition mask 7. Here, in the case in which the deposition mask 7 is electrostatically attracted on to the surface of the TFT substrate 1 by applying a voltage to the anode electrodes 2G and 2B for G and B, at the time of detaching the deposition mask, it is preferred to turn off the applied voltages to the anode electrodes 2G and 2B or to apply a voltage of opposite polarity to the electrodes. Therefore, it is possible to easily detach the deposition mask 7. Furthermore, in a case of making the film 4 adhere to the surface of the TFT substrate 1 by an adhesive, it is preferred to apply to the deposition mask 7 a force greater than the adhesion power of the adhesive to mechanically detach the deposition mask 7. Furthermore, if the adhesive is one curable by UV irradiation, it is preferred to perform UV irradiation to cure the adhesive to lower the adhesion between the deposition mask 7 and the surface of the TFT substrate 1 before detaching the deposition mask 7.

Thereafter, in the same manner as above, on the anode electrodes 2G and 2B for G and B, organic EL layers 3G and 3B for those colors are formed. Thereafter, a transparent electrically conductive film of ITO (indium tin oxide) is formed on the TFT substrate 1 and a transparent protective substrate is bonded thereon to form an organic EL display device.

Here, in the first embodiment of the method for forming a thin film pattern, explanation has been made with respect to a case in which the film 4 is formed in a sheet shape, but the present invention is not limited thereto, and the film 4 may be a liquid film so long as laser abrasion to the material is possible. In this case, the film 4 is formed by spin-coating or dip-coating a surface of the TFT substrate 1 with a liquid material and drying the material.

Furthermore, in the first embodiment of the method for forming a thin film pattern, at a time of forming the organic EL layer 3R in the third step, a further transparent electrode layer may be formed on the organic EL layer 3R. In this case, when the film 4 is a liquid film, the transparent electrode layer functions as a barrier layer and it is possible to prevent the organic EL layer 3R from being dissolved by the film 4 in the liquid form.

Next, a second embodiment of the method for forming a thin film pattern of the present invention will be explained. Here, in the same manner as the above, explanation will be made with respect to a method for producing an organic EL display device by the second embodiment of the method for forming a thin film pattern in which the thin film pattern is an organic EL layer. In this method for producing an organic EL display device, the organic EL display device is produced by forming organic EL layer having a corresponding color on anode electrodes formed on the TFT substrate 1, and the method includes a process for forming a red (R) organic EL layer, a process for forming a green (G) organic EL layer, a process for forming a blue (B) organic EL layer, and a process for forming cathode electrodes.

FIGS. 4A to 4G are cross-sectional views illustrating the process for forming an R organic EL layer. In this process for forming an R organic EL layer, an organic material is heated in vacuum to form an R organic EL layer 3R by vapor deposition on an anode electrode 2R for R on the TFT substrate 1. The process includes a first step (refer to FIG. 4A) of retaining a film 4 made of a resin, that transmits visible light, on a metal member having an opening 9 having a shape and a size greater than those of a pattern of the R organic EL layer 3R, to form a masking member 11; a second step (refer to FIG. 4B) of placing the TFT substrate 1 on a magnetic chuck stage 13 having a static magnetic field generation device 12 provided therein as a chucking device; a third step (refer to FIG. 4C) of aligning and placing the masking member 11 onto the TFT substrate 1 so that the anode electrode 2R for R on the TFT substrate 1 is aligned in the opening 9 of the metal member 10; a fourth step (refer to FIG. 4D) of attracting the metal member 10 onto the TFT substrate 1 by the static magnetic field generated by the static magnetic field generation device 12 so as to bring the film 4 into close contact with the surface of the TFT substrate 1; a fifth step (refer to FIG. 4E) of irradiating a portion of the film 4 corresponding to the anode electrode 2R for R on the TFT substrate 1 with laser light L to form in the film 4 the opening pattern 6 having the same shape and dimension as those of a pattern of the R organic EL layer 3R, to form a deposition mask according to a second embodiment of the present invention (hereinafter referred to as "deposition mask 14"); a sixth step (refer to FIG. 4F) of forming the R organic EL layer 3R on the anode electrode 2R for R on the TFT substrate 1 by vapor deposition through the opening pattern 6 of the deposition mask 14; and a seventh step (refer to FIG. 4G) of lifting the deposition mask 14 in the arrow +Z direction in FIG. 4G to detach the film 4 from the surface of the TFT substrate 1.

Figure 5A:
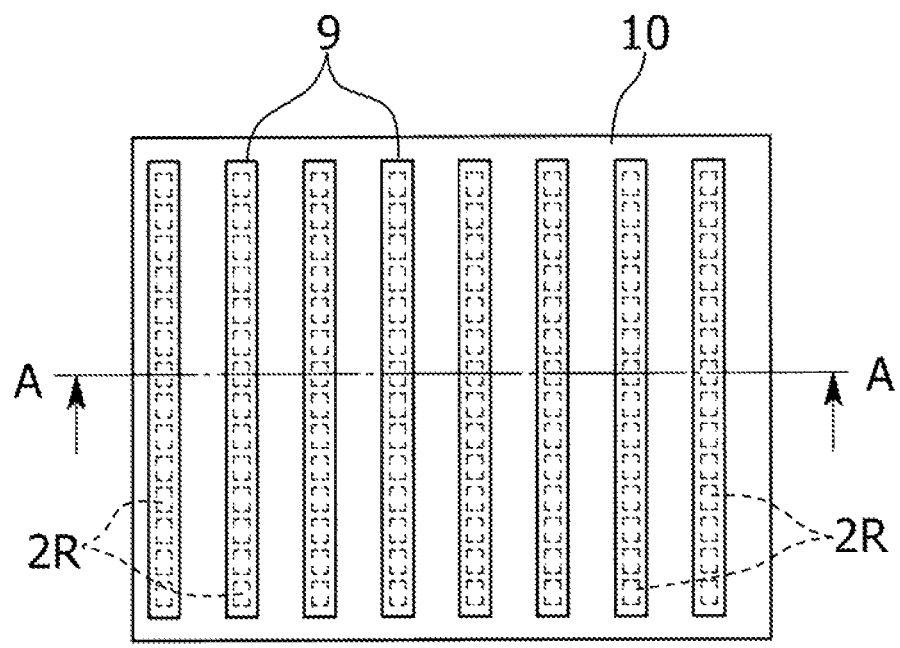
FIGS. 5A to 5C are explanation views illustrating formation of a mask member to be used in the process for forming an R organic EL layer.
Figure 5B:
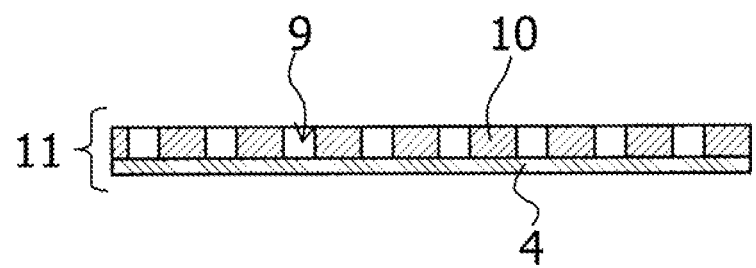
Figure 5C:
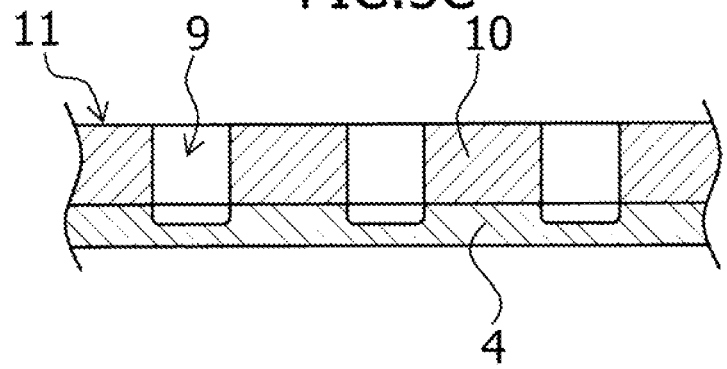
Figure 6A:
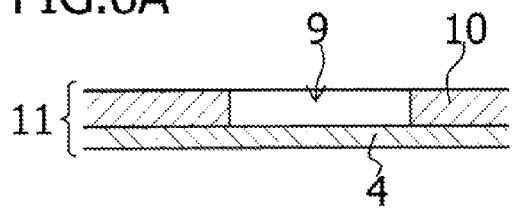
FIGS. 6A to 6G are views illustrating the second embodiment of the method for producing a deposition mask of the present invention, and the second embodiment of the method for forming a thin film pattern of the present invention, which are cross-sectional explanation views illustrating a process for forming a green (G) organic EL layer of the organic EL display device.
Figure 6B:
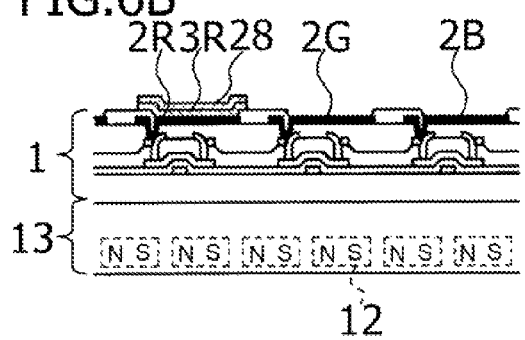
Figure 6C:
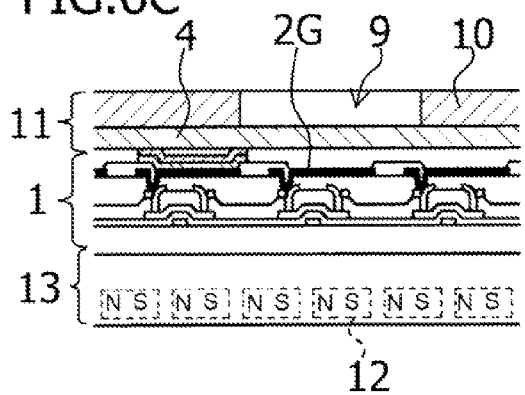
Figure 6D:
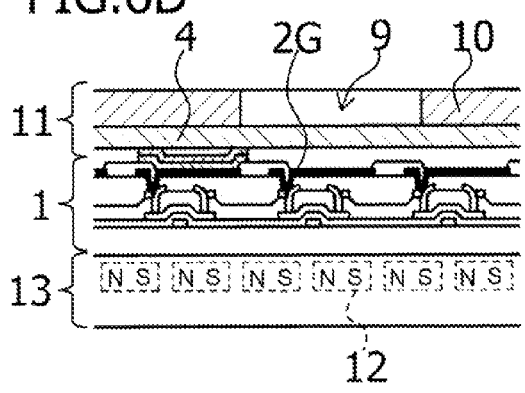
Figure 6E:
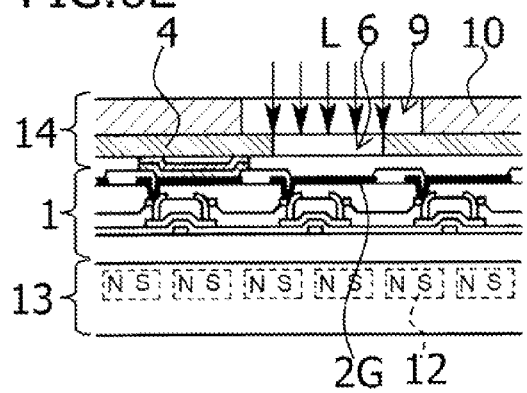
Figure 6F:
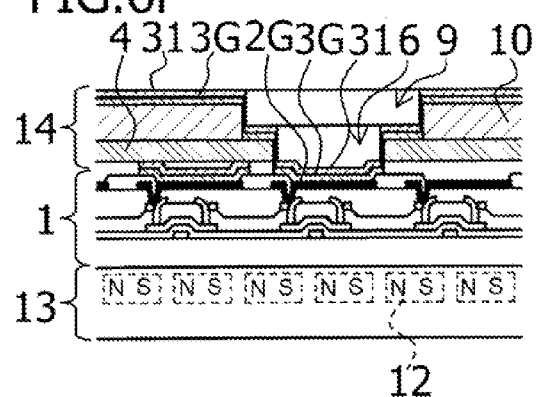
Figure 6G:
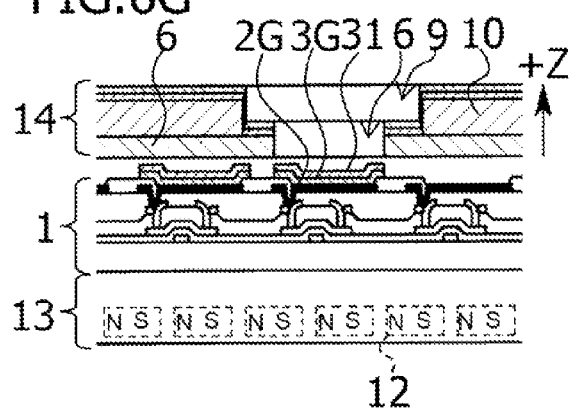
Figure 7A:
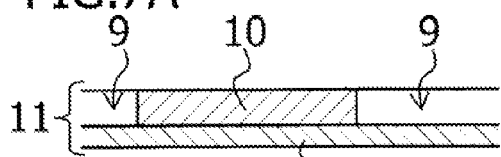
FIGS. 7A to 7G are views illustrating the second embodiment of the method for producing a deposition mask of the present invention, and the second embodiment of the method for forming a thin film pattern of the present invention, which are cross-sectional explanation views illustrating a process for forming a blue (B) organic EL layer of the organic EL display device.
Figure 7E:
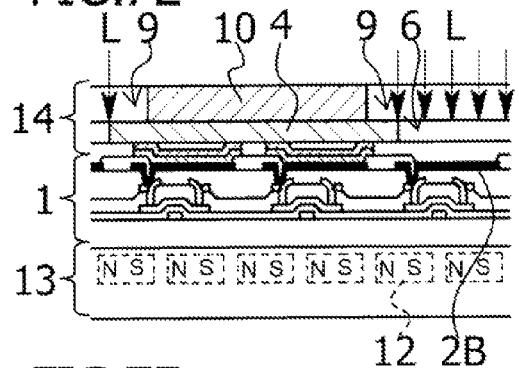
Figure 7B:
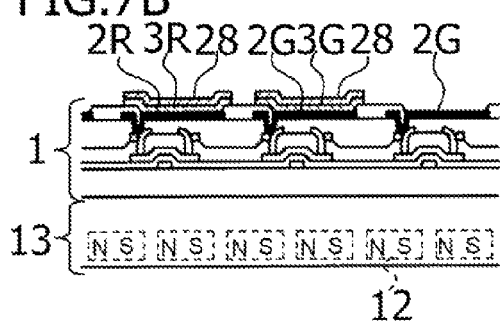
Figure 7F:
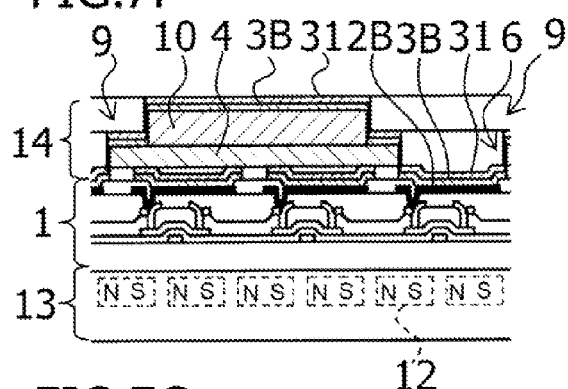
Figure 7C:
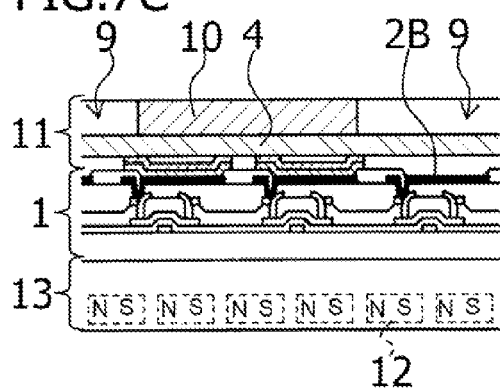
Figure 7G:
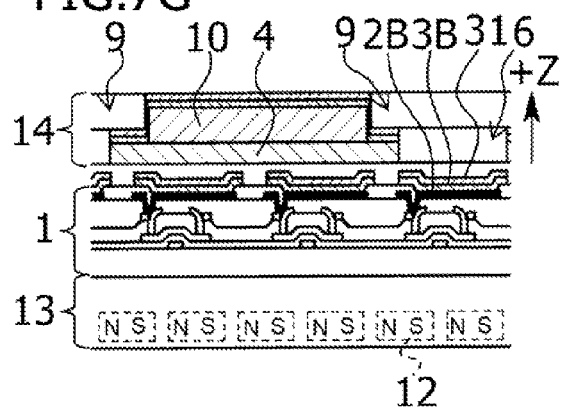
Figure 7D:
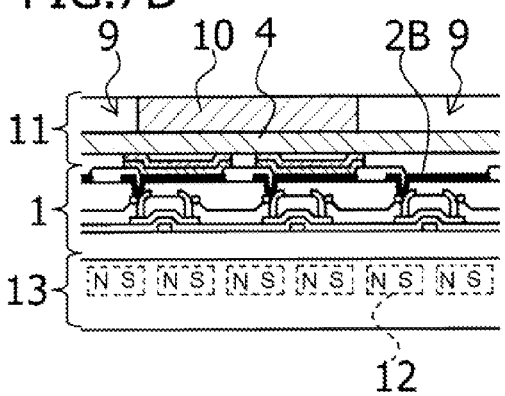
Figure 8A:
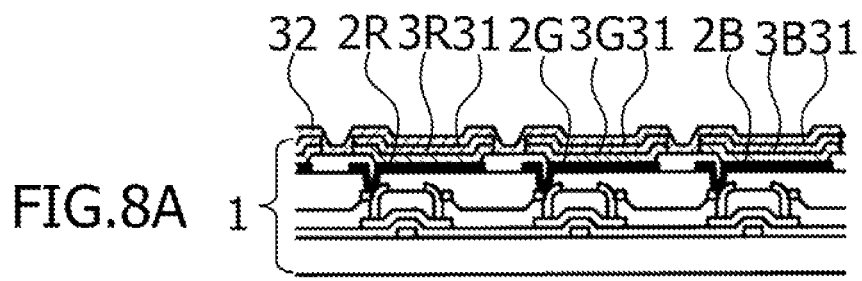
FIGS. 8A to 8D are cross-sectional explanation views illustrating a process for forming a cathode electrode layer of the organic EL display device.
Figure 8B:
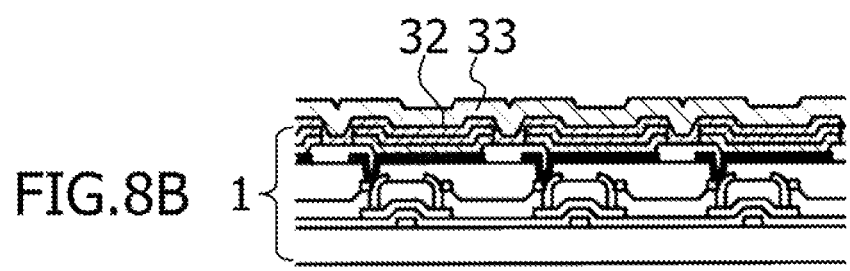
Figure 8C:
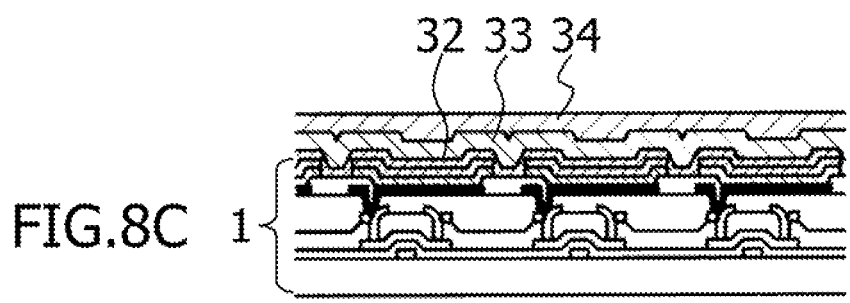
Figure 8D:
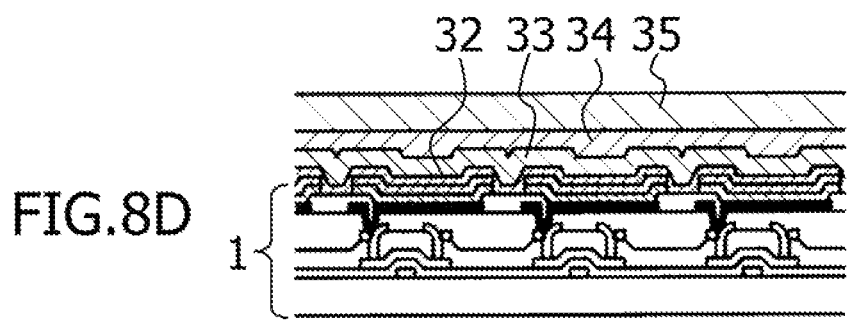

In more detail, first, in the first step, in a metal member 10 having a thickness of about from 15 μm to 50 μm made of a magnetic material such as nickel, a nickel alloy, an invar or an invar alloy, a plurality of elongated openings 9 are formed in parallel by etching or by punching so that the pitch of the openings 9 is the same as the arrangement pitch of a plurality of rows of the anode electrodes 2R for R on the TFT substrate 1 and that a dimension of each opening 9 is sufficient for completely including each of anode electrodes for R arranged in each row as illustrated in FIG. 5A. Thereafter, as illustrated in FIG. 5B being an A-A cross-sectional view of FIG. 5A, a film 4 of, for example, polyethylene terephthalate (PET) or polyimide, to which laser abrasion is possible, having a thickness of, for example, from 10 μm to 30 μm is bonded to a surface of the metal member 10 via e.g. an adhesive. Subsequently, as illustrated in FIG. 5C with partial enlargement, the film 4 is e.g. dry-etched from the metal member 10 side to reduce the thickness of a portion of the film 4 corresponding to such an opening 9 to be about a few microns to form a masking member 11. Accordingly, it is possible to form a fine opening pattern with high accuracy. Here, the etching of the film 4 may be performed from a side opposite to the metal member 10, or it may be performed from both sides. Furthermore, the etching of the film 4 is not necessarily a dry etching but it may be a wet etching. Furthermore, the metal member 10 may be formed by plating on a region of one surface of the film 4 outside a region corresponding to the opening 9.

Next, in the second step, as illustrated in FIG. 4B, on the magnetic chuck stage 13 having, for example, a permanent magnet as the static magnetic field generation device 12 provided in the magnetic chuck stage 13, the TFT substrate 1 is placed so that its surface on which anode electrodes 2R, 2G and 2B are formed is on the upper side. In this case, the magnetic chuck stage 13 is formed to have a smooth chucking surface, for example. Here, the static magnetic field generation device 12 is configured to be moved up and down by an elevating device, not illustrated, and in the second step, the static magnetic field generation device 12 is at a lowered position at a bottom portion of the magnetic chuck stage 13.

Subsequently, in the third step, as illustrated in FIG. 4C, the masking member 11 is placed on the TFT substrate 1 so that a film 4 of the masking member 11 faces to the TFT substrate 1, and thereafter, while the anode electrode 2R for R of the TFT substrate 1 and the opening 9 of the metal member 10 are observed through a microscope, for example, the masking member 11 is moved and rotated in two-dimensional directions in a plane in parallel to an upper surface of the magnetic chuck stage 13 to align them so that a plurality of the anode electrodes 2R for R are in the opening 9 of the metal member 10. At this time, since the static magnetic field generation device 12 is at a lowered position at a bottom portion of the magnetic chuck stage 13, the strength of the magnetic field influenced on the metal member 10 is low. Accordingly, the masking member 11 can be moved freely on the surface of the TFT substrate 1. Here, a recessed portion is formed on the upper surface of the magnetic chuck stage 13 so as to allow receiving and positioning the TFT substrate 1 in the recessed portion, positioning pins are provided outside the recessed portion, and positioning holes is formed in the metal member 10 so as to correspond to the positioning pins. It is possible to align the TFT substrate 1 and the masking member 11 only by fitting the positioning holes to the positioning pins.

Subsequently, in the fourth step, as illustrated in FIG. 4D, the static magnetic field generation device 12 is moved up to an upper portion of the magnetic chuck stage 13 to make the static magnetic field influence on the metal member 10 to attract the metal member 10 toward the TFT substrate 1 side to thereby bring the film 4 into close contact with the upper surface of the TFT substrate 1.

Next, in the fifth step, as illustrated in FIG. 4E, laser light L is irradiated toward the anode electrodes 2R for R on the TFT substrate 1 to form, in the film 4 on the anode electrodes 2R, the opening pattern 6 having a shape and a dimension approximately equal to those of the anode electrodes 2R for R to form the deposition mask 14 (second embodiment). The laser used in this step is an excimer laser having a wavelength of 400 nm or shorter, and for example, a laser of KrF 248 nm. By light energy of such laser light L of ultraviolet rays, carbon bonds in polyethylene terephthalate (PET) or polyimide are instantaneously destroyed and removed, and accordingly, it is possible to perform clean penetrating process while suppressing generation of residues. In this case, since no thermal process by irradiation of the laser light L is used, it is possible to form a penetrating pattern having a shape and a dimension approximately the same as those of the cross-section of light flux of the laser light L, and by using a reduction imaging device, it is possible to form even the deposition mask 14 having the opening pattern 6 of a few microns. Accordingly, it is possible to form a finer thin film pattern than conventional patterns.

Figure 9:
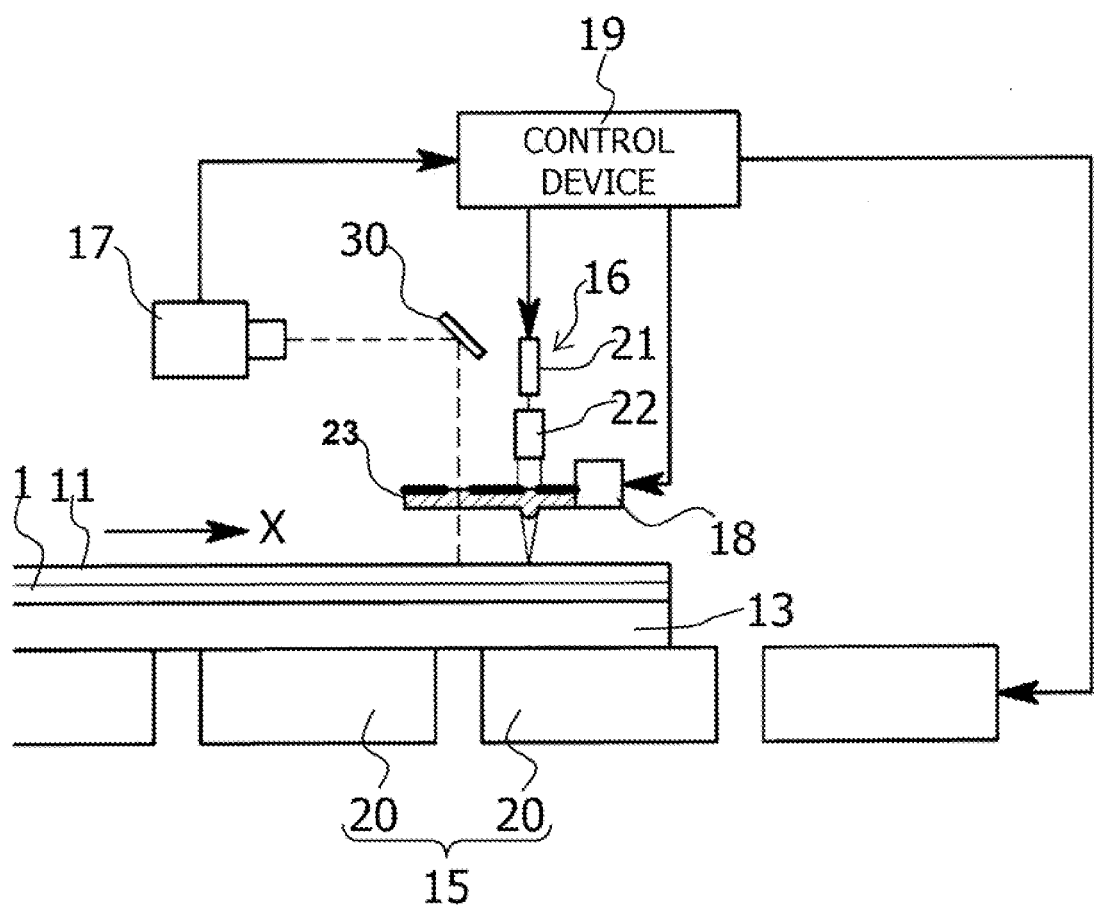
FIG. 9 is a front view illustrating a construction example of a laser processing apparatus for forming a deposition mask to be used in the process for forming the organic EL layer.

FIG. 9 is a front view illustrating a construction example of a laser processing apparatus to be employed in the fifth step.

This laser processing apparatus is configured to scan the TFT substrate 1 in the direction indicated by an arrow X in FIG. 9 at a constant speed and meanwhile to irradiate the masking member 11 on the TFT substrate 1 with laser light L to form the opening pattern 6 having a shape and a dimension approximately equal to those of the patterns of organic EL layers 3R to 3B, on anode electrodes 2R to 2B, to thereby form the deposition mask 14, and the laser processing apparatus includes a scanning device 15, a laser optical unit 16, an image-capturing device 17, an alignment device 18 and a control device 19.

The scanning device 15 has a stage 20 having a plurality of air-ejecting holes and air-drawing holes formed on an upper surface thereof, and the TFT substrate 1 and a magnet chuck stage 13, that are integrated together, are placed on the upper surface of the stage 20. A scanning mechanism, not illustrated in the drawings, is configured to hold edge portions of the magnetic chuck stage 13 parallel to the arrow X direction and to scan the TFT substrate 1 and the magnetic chuck stage 13, in a state in which they are lifted off the stage 20 by a predetermined amount by balancing an ejection force and a suction force of the air.

Above the scanning device, a laser optical unit 16 is provided. This laser optical unit 16 is configured to irradiate the selected anode electrodes 2R to 2B on the TFT substrate 1 with laser light L of ultraviolet rays. The laser optical unit 16 includes an excimer laser 21 for radiating laser light L of KrF 248 nm, for example; a coupling optical unit 22 for expanding a light flux diameter of laser light L, unifying the intensity distribution to produce parallel light, and irradiating a photomask 23 to be described later with the parallel light; and the photomask 23 disposed so as to face to an upper surface of the stage 20 and having a plurality of openings 24 (refer to FIGS. 10A and 10B) formed in a direction intersecting an arrow X direction.

Figure 10A:
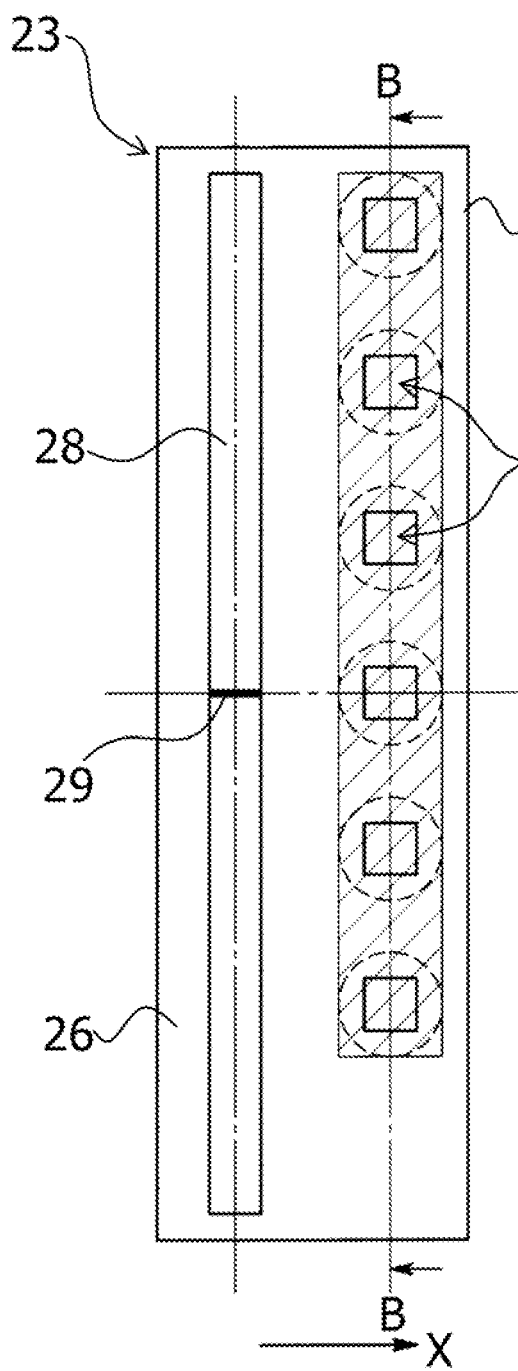
Figure 10B:
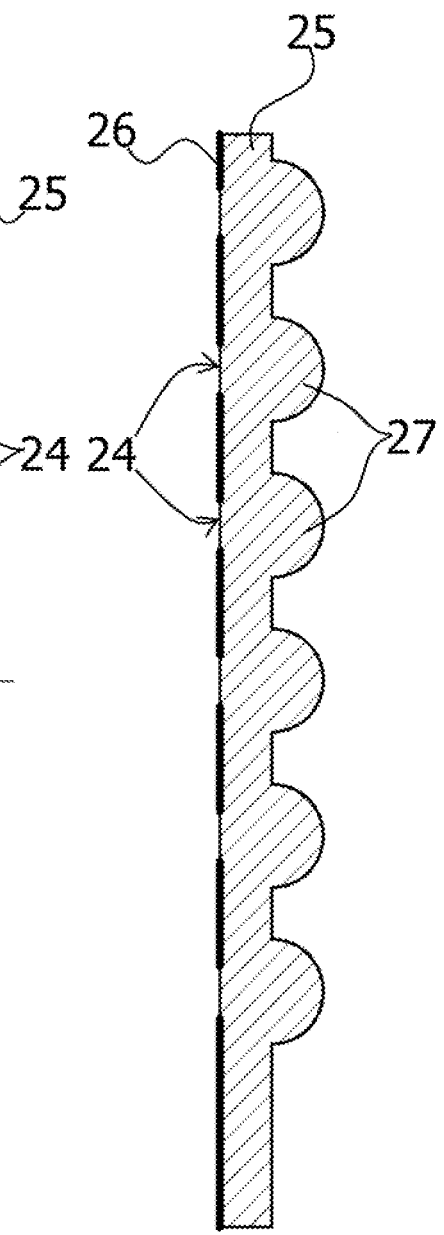

Here, the photomask 23 will be described in detail. The photomask 23 is, for example, as illustrated in FIGS. 10A and 10B, a transparent substrate 25 having one surface provided with a light-shielding film 26 of e.g. chromium (Cr), the film has openings 24 formed in a row in a direction intersecting the arrow X direction of the TFT substrate 1 at an arrangement pitch 3P that is three times the arrangement pitch P of the anode electrodes 2R to 2B, and the other surface of the transparent substrate 25 is provided with a plurality of microlenses 27 formed so that their central axes agree with centers of respective openings 24, so that the microlenses 27 perform reduction projection of respective openings 24 on to the TFT substrate 1. In this case, the size of each opening 24 is M times the pattern size of the organic EL layers 3R to 3B when the reduction rate of the microlens 27 is M. Here, in FIG. 10A, a hatched region is a region to be irradiated with laser light L.

Furthermore, at a position a predetermined distance from the center of the plurality of openings 24 in a direction opposite to the arrow X direction, there is formed an elongated observation window 28 having a longitudinal central axis in direction intersecting the arrow X direction. This observation window 28 allows image-capturing of a surface of the TFT substrate 1 passing under the photomask 23 by an image-capturing device 17, to be described later, from a position above the photomask 23. In the observation window 28, at least one alignment mark 29 (only one alignment mark in this example) having a fine line extending in the arrow X direction is provided so that its longitudinal central axis agrees with the center of any one of the openings 24.

Above the scanning device 15, the image-capturing device 17 is provided. This image-capturing device 17 is provided for capturing an image of the surface of the TFT substrate 1 through the observation window 28 of the photomask 23, and the image-capturing device 17 is a line camera having a plurality of light-receiving elements arranged in a row in a direction intersecting the arrow X direction. The plurality of light-receiving elements is arranged so that their central axis in the arrangement direction agrees with the longitudinal central axis of the observation window 28 of the photomask 23. Furthermore, an illumination device, not illustrated, is provided so that the image-capturing region of the image-capturing device 17 can be illuminated from the upper side of the TFT substrate 1. Here, in FIG. 9, a symbol 30 indicates a reflective mirror for folding an optical path of the image capturing system.

The alignment device 18 is provided so that the photomask 23 is movable in a direction intersecting the arrow X direction in a plane parallel to the upper surface of the stage 20. This alignment device 18 is provided for aligning the photomask 23 to the TFT substrate 1 that is scanning, and is configured to move the photomask 23 in the direction intersecting the arrow X direction by a moving mechanism including an electromagnetic actuator, a motor, and the like.

A control device 19 is provided, which is electrically connected to the scanning device 15, the excimer laser 21, the image-capturing device 17 and the alignment device 18. This control device 19 controls the scanning device 15 to scan the TFT substrate 1 in the arrow X direction at a constant speed, controls the excimer laser 21 to emit light at regular intervals, processes an image imported from the image-capturing device 17 to detect a reference position that has been predetermined on the TFT substrate 1, computes a horizontal distance between the reference position and the alignment mark 29 of the photomask 23, and controls the alignment device 18 to move the photomask 23 so that the horizontal distance becomes the predetermined distance.

By using the laser processing apparatus having such a configuration, the step 5 is performed in the following manner.

First, on the upper surface of the stage 20 of the scanning device 15, the TFT substrate 1 integrated with the magnetic chuck stage 13 is positioned and placed so that the longitudinal axis of the opening 9 of the metal member 10 is parallel to the arrow X direction. Next, the scanning device 15 lifts the magnetic chuck stage 13 and the TFT substrate 1 together by a predetermined amount off the stage 20, and in this state, starts scan in the arrow X direction at a constant speed as it is controlled by the control device 19.

When the TFT substrate 1 is scanned to a position under the photomask 23, and when e.g. an anode electrode 2R to 2B formed on the TFT substrate 1 in a direction intersecting the arrow X direction, or a line pattern provided at a predetermined position, is detected by the image-capturing device 17 through the observation window 28 of the photomask 23, the control device 19 computes a movement distance of the TFT substrate 1 from the position of the TFT substrate 1 at which the anode electrode 2R to 2B etc. is detected. Then, when the moving distance becomes a target moving distance predetermined and stored in advance and the anode electrode 2R for R in the TFT substrate 1 reaches a position right under the opening 24 of the photomask 23, the excimer laser 21 performs pulse emission as it is controlled by the control device 19.

While the TFT substrate 1 is moving, among e.g. a plurality of gate lines parallel to the arrow X direction formed on the TFT substrate 1 in advance, an edge portion of a preliminarily selected gate line, that is used as a reference of alignment, is detected by the image capturing device 17, and the control device 19 computes a horizontal distance from the edge portion to the alignment mark 29 of the photomask 23, that is detected simultaneously, and controls the alignment device 18 to move the photomask 23 in a direction intersecting the arrow X direction. Accordingly, it is possible to follow and align the photomask 23 to the TFT substrate 1 moving as it is swinging in the direction intersecting the arrow X direction.

As described above, when the anode electrode 2R for R on the TFT substrate 1 reaches a position right under the opening 24 of the photomask 23, the excimer laser 21 emits light and the irradiation region of the photomask 23 is irradiated with laser light L. Furthermore, the laser light L passed through the opening 24 of the photomask 23 is focused on an anode electrode 2R for R on the TFT substrate 1 by the microlens 27. Furthermore, the film 4 on the anode electrode 2R is abraded and removed by the laser light L, to thereby form the opening pattern 6. Thereafter, every time a subsequent anode electrode 2R for R reaches the position right under the opening 24 of the photomask 23, the excimer laser 21 emits light, the film 4 on the anode electrode 2R is removed by the laser light L, to thereby form the deposition mask 14 provided with an opening pattern on the anode electrode 2R. Here, the construction may be such that the excimer laser 21 continuously emits light and a shutter provided on the output optical axis side of the laser light L is configured to open when the anode electrode 2R for R reaches a position right under the opening 24 of the photomask 23.

Here, in the above, explanation has been made with respect to a case in which a plurality of openings is provided in a single row in the photomask 23, but a plurality of such rows of the openings 24 may be provided in the arrow X direction at a pitch of an integer times the pixel pitch in the direction. In this case, portions of the film 4 on the anode electrodes 2R for R are removed by a plurality of laser irradiations.

Furthermore, in the above, explanation has been made with respect to a case in which the microlenses 27 are provided so as to correspond to the plurality of openings 24, but cylindrical lenses each having a longitudinal axis spanning a plurality of openings 24 may be employed. In this case, the plurality of openings 24 is preferably continued to form a single stripe-shaped opening. In this construction, it is possible produce laser light L having an elongated light flux cross-section to form a stripe-shaped opening pattern 6 in the film 4. Here, in this case, the TFT substrate 1 is placed on the stage 20 so that the longitudinal axis of the opening 9 of the masking member 11 intersects the arrow X, and scanned. Then, every time a plurality of anode electrodes 2R for R reach the position right under the stripe-shaped opening 24 of the photomask 23, irradiation with the elongated laser light L takes place, so that the stripe-shaped opening pattern 6 can be formed to cover the plurality of anode electrodes 2R for R. As a result, it is possible to form a stripe-shaped R organic EL layer 3R (thin film pattern) on a plurality of anode electrodes 2R for R so as to span these electrodes.

Furthermore, explanation has been made with respect to a case in which the laser processing apparatus performs irradiation with laser light L while moving the TFT substrate 1 at a constant speed to form the opening pattern 6 in the film 4, but the present invention is not limited thereto, and the laser processing apparatus may be one configured to perform irradiation with laser light L while moving the TFT substrate 1 in a step movement in the arrow X direction or while moving the TFT substrate 1 in two-dimensional directions in a plane parallel to the substrate surface to form the opening pattern 6 in the film 4, or may be one configured to irradiate the TFT substrate 1 with laser light L through a photomask 23 provided with a plurality of microlenses so as to correspond to a plurality of anode electrodes of the TFT substrate 1, to form opening patterns 6 in the film 4 by one-shot irradiation.

Furthermore, in the formation of the opening pattern 6, in the same manner as described above, processing up to a predetermined depth is preferably performed rapidly by irradiation with laser light L having a relatively high energy density of form 1 J/cm$^2$ to 20 J/cm$^2$, and processing of the rest portion is performed slowly by irradiation with laser light L having a lowered energy density of 0.1 J/cm$^2$ or lower, preferably 0.06 J/cm$^2$ or lower. Accordingly, it is possible to shorten a time to form the opening pattern 6 while suppressing damage to the anode electrodes due to the laser light L.

In the sixth step, as illustrated in FIG. 4F, by using e.g. a vacuum vapor deposition apparatus, an R organic EL layer 3R is formed on an anode electrode 2R for R on the TFT substrate 1 by vapor deposition through the opening pattern 6 of the deposition mask 14. Furthermore, on the organic EL layer 3R for R, a transparent electrode layer 31 made of an ITO film is deposited by using a known deposition technique such as vapor deposition or sputtering.

In the seventh step, as illustrated in FIG. 4G, in a state in which the static magnetic field generation device 12 of the magnetic chuck stage 13 is lowered, an edge portion of the deposition mask 14 is lifted up in the direction indicated by an arrow +Z to mechanically detach the film 4 of the deposition mask 14 from the surface of the TFT substrate 1. Thus, the R organic EL layer 3R remains on the anode electrode 2R for R, and the process for forming an R organic layer is completed.

FIGS. 6A to 6G are cross-sectional explanation views illustrating a process for forming a G organic EL layer. This process for forming the G organic EL layer includes a step (refer to FIG. 6A) of retaining the film 4, that is made of a resin and transmits visible light, by the metal member 10 containing a magnetic material and having the opening 9 having a shape and dimension greater than those of a pattern of the G organic EL layer 3G; a step (refer to FIG. 6B) of placing the TFT substrate 1 on the magnetic chuck stage 13 provided with the static magnetic field generation device 12; a step (refer to FIG. 6C) of aligning and placing the metal member 10 on the TFT substrate 1 so that an anode electrode 2G for G on the TFT substrate 1 is positioned in the opening 9 of the metal member 10; a step (refer to FIG. 6D) of attracting the metal member 10 on to the TFT substrate 1 by a static magnetic field of the static magnetic field generation device 12 so that the film 4 is brought into close contact with an upper surface of the TFT substrate 1; a step (refer to FIG. 6E) of irradiating with laser light L a portion of the film 4 corresponding to the anode electrode 2G for G on the TFT substrate 1, to form in the portion of the film 4 the opening pattern 6 having the same shape and dimension as those of a pattern of a G organic EL layer 3G, to thereby form the deposition mask 14; a step (refer to FIG. 6F) of forming a G organic EL layer 3G on the anode electrode 2G for G on the TFT substrate 1 by deposition through the opening pattern 6 of the deposition mask 14; and a step (refer to FIG. 6G) of lifting up the deposition mask 14 in the direction indicated by an arrow +Z in FIG. 6G to mechanically detach the deposition mask 14. This process is performed in the same manner as the process for forming the R organic EL layer.

FIGS. 7A to 7G are cross-sectional explanation views illustrating a process for forming a B organic EL layer. This process for forming a B organic EL layer includes a step (refer to FIG. 7A) of retaining the film 4, that is made of a resin and transmits visible light, by the metal member 10 containing a magnetic material and having the opening 9 having a shape and dimension greater than those of a pattern of the B organic EL layer 3B; a step (refer to FIG. 7B) of placing the TFT substrate 1 on the magnetic chuck stage 13 provided with the static magnetic field generation device 12; a step (refer to FIG. 7C) of aligning and placing the metal member 10 on the TFT substrate 1 so that an anode electrode 2B for B on the TFT substrate 1 is positioned in the opening 9 of the metal member 10; a step (refer to FIG. 7D) of attracting the metal member 10 on to the TFT substrate 1 by a static magnetic field of the static magnetic field generation device 12 so that the film 4 is brought into close contact with an upper surface of the TFT substrate 1; a step (refer to FIG. 7E) of irradiating with laser light L a portion of the film 4 corresponding to the anode electrode 2B for B on the TFT substrate 1, to form in the portion of the film 4 the opening pattern 6 having the same shape and dimension as those of a pattern of a B organic EL layer 3B, to thereby form the deposition mask 14; a step (refer to FIG. 7F) of forming a B organic EL layer 3B on the anode electrode 2B for B on the TFT substrate 1 by vapor deposition through the opening pattern 6 of the deposition mask 14; and a step (refer to FIG. 7G) of lifting up the deposition mask 14 in the direction indicated by an arrow +Z in FIG. 7G to mechanically detach the deposition mask 14. This process is performed in the same manner as the process for forming the R organic EL layer or the G organic layer.

FIGS. 8A to 8D are cross-sectional explanation views illustrating a process for forming a cathode electrode. This process for forming a cathode electrode is a process for electrically connecting the organic EL layers 3R, 3G and 3B formed on the anode electrodes 2R, 2B and 2G on the TFT substrate 1, and as illustrated in FIGS. 8A to 8D, first, by using a known deposition technique, a cathode electrode 32 (transparent electrode) made of an ITO (indium tin oxide) film is formed to cover the upper surface of the TFT substrate (refer to FIG. 8A). Subsequently, a protection layer 33 having an insulation property is formed by deposition to cover the cathode electrode 32 (refer to FIG. 8B), and further on the cathode electrode 32, e.g. a UV curable resin is e.g. spin-coated or spray-applied to form a bonding layer 34 (refer to FIG. 8C). Then, after the a transparent opposing substrate 35 is brought into close contact on the bonding layer 34, ultraviolet rays are radiated form the opposing substrate 35 side to cure the bonding layer 34 to join the opposing substrate 35 to the TFT substrate 1 (refer to FIG. 8D). Thus, an organic EL display device is completed.

FIGS. 11A to 11G are cross-sectional explanation views illustrating a modified example of the method for producing a deposition mask to be used in the process for forming an organic EL layer. Here, as an example, a method for producing a deposition mask for R organic EL layer will be described.

Figure 11A:
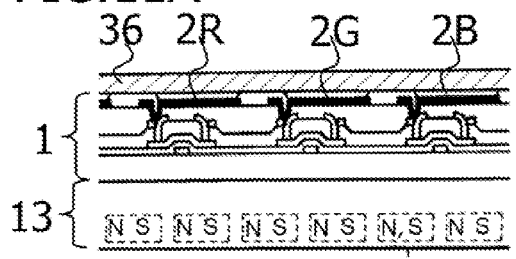
FIGS. 11A to 11G are cross-sectional explanation views illustrating a modified example of the second embodiment of the method for producing the deposition mask of the present invention.

First, as illustrated in FIG. 11A, a transparent member 36 made of e.g. a fluororesin or a cover glass, that transmits visible light and hardly absorbs laser light L, is placed so as to cover the upper surface of the TFT substrate 1 placed on the magnetic chuck stage 13.

Figure 11B:
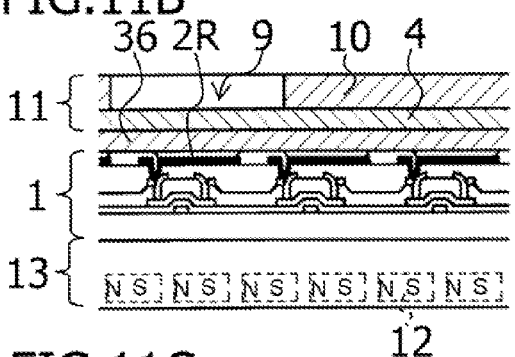
Figure 11C:
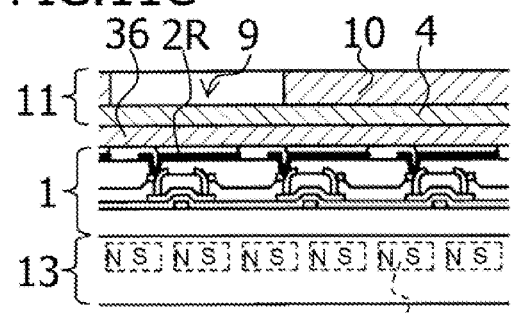

Next, as illustrated in FIG. 11B, the metal member 10 aligned to the TFT substrate 1 so that an anode electrode 2R is positioned in the opening 9 of the metal member 10, and thereafter, the film 4 of the masking member 11 is brought into close contact on the transparent member 36. Then, in this state, as illustrated in FIG. 11C, the metal member 10 is attracted by a static magnetic field of the chuck stage 13 to sandwich the film 4 and the transparent member 36 between the metal member 10 and the TFT substrate 1.

Figure 11D:
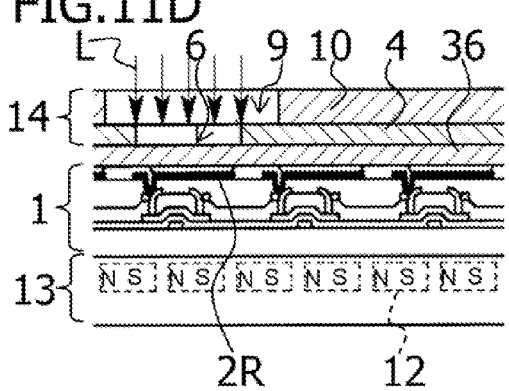

Subsequently, as illustrated in FIG. 11D, a portion of the film 4 corresponding to the anode electrode 2R for R on the TFT substrate 1 is irradiated with laser light L, to form the opening pattern 6 having the same shape and dimension as those of a pattern of an R organic EL layer 3R in the portion of the film 4, to form the deposition mask 14. At this time, the transparent member 36 is not processed by laser since it does not absorb laser light L.

Figure 11E:
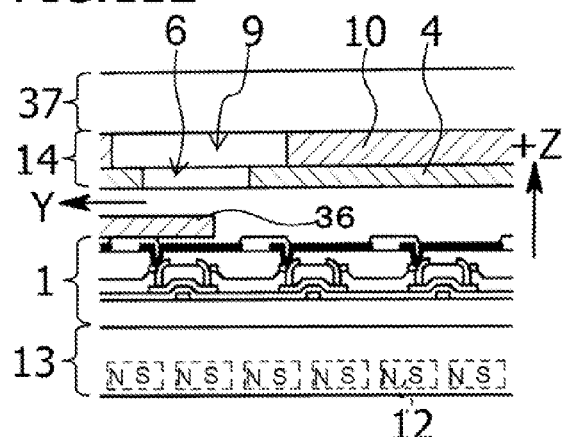

Subsequently, as illustrated in FIG. 11E, on the deposition mask 14, e.g. an electrostatic chuck stage 37 configured to be capable of applying a predetermined voltage is placed, the film 4 of the deposition mask 14 is attracted by the electrostatic chuck stage 37, and the static magnetic field of the magnetic chuck stage 13 is turned off. Thereafter, in a state in which the deposition mask 14 is attracted to the electrostatic chuck stage 37, the electrostatic chuck stage 37 is vertically lifted in the arrow +Z direction to thereby pull off the transparent member 36 in the direction of an arrow Y shown in FIG. 11E.

Figure 11F:
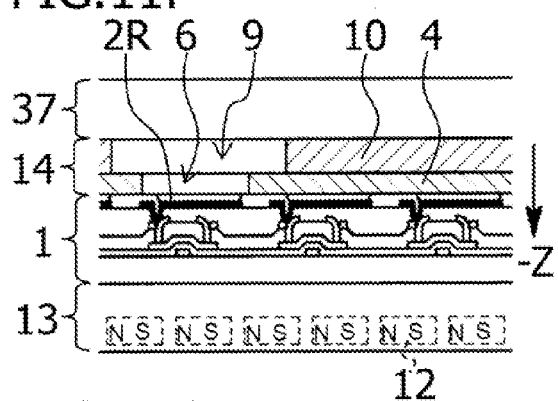
Figure 11G:
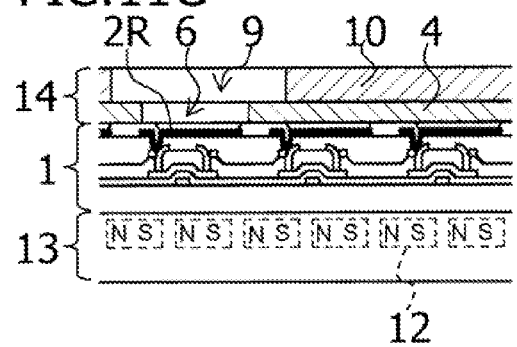

Thereafter, as illustrated in FIG. 11F, the electrostatic chuck 37 is moved down vertically in the arrow Z direction to place the deposition mask 14 on the TFT substrate 1 again. Then, the electrostatic chuck 37 is turned off and the magnetic chuck stage 13 is turned on, and as illustrated in FIG. 11G, the metal member 10 of the deposition mask 14 is attracted by a magnetic force to bring the film 4 into close contact with the upper surface of the TFT substrate 1, and thereafter, the electrostatic chuck 37 is removed. Thus, the method for producing the deposition mask 14 is completed.

Thereafter, the R organic EL layer 3R is formed in the same manner as FIGS. 4F and 4G by using the above deposition mask. Furthermore, the G organic EL layer 3G and the B organic EL layer 3B can be formed by using masks formed in the same manner.

As described above, when laser light L is radiated in a state in which the transparent member 36 that transmits visible light is interposed between the film 4 and the TFT substrate 1, to abrade the film 4 to form the opening pattern 6, even if a residue of the film 4 is generated by the abrasion, the residue is completely blocked by the transparent member 36 and does not adhere to the anode electrodes 2R to 2B. Accordingly, there is no possibility that a contact resistance between the anode electrodes 2R to 2B and the organic EL layers 3R to 3B rises or the residue damages the organic EL layers 3R to 3B to deteriorate light-emission characteristics of the organic EL layers 3R to 3B.

Here, in the above, explanations have been made with respect to a case in which the transparent member 36 is a member that hardly absorbs laser light L, but the present invention is not limited thereto, and the transparent member 36 may be a member such as polyimide that easily absorbs laser light L so long as it has a sufficient thickness compared to the thickness of the film 4. In this case, it is sufficient that irradiation with laser light L is stopped after laser processing to the film 4 is completed and before the laser processing to the transparent member 36 is completed.

Furthermore, in the second embodiment of the process for forming a thin film pattern, explanation has been made with respect to a case in which a transparent electrode layer 31 is further formed on an organic EL layer 3R to 3B at a time of forming the organic EL layer 3R to 3B. However, the present invention is not limited thereto, and it is not necessary to form the transparent electrode layer at the time of forming the organic EL layer 3R to 3B.

Furthermore, in the second embodiment of the process for forming a thin film pattern, explanation has been made with respect to a case in which the static magnetic field generation means 12 is a permanent magnet, but the present invention is not limited thereto, and the static magnetic field generation device 12 may be an electromagnet.

Furthermore, in the second embodiment of the process for forming a thin film pattern, explanation has been made with respect to a case in which the metal member 10 is made of a magnetic material, but the present invention is not limited thereto, and the metal member 10 may be a non-magnetic material. In this case, in order to sandwich the film 4 between the TFT substrate 1 and the metal member 10, instead of the magnetic chuck stage 13, it is preferred to use an electrostatic chuck stage configured to be capable of applying a predetermined voltage, place the TFT substrate 1 on the electrostatic chuck stage, and apply a voltage to the stage to attract the metal member 10 onto the TFT substrate 1 by electromagnetic force to sandwich the film 4.

Furthermore, in the second embodiment of the process for forming a thin film pattern, explanation has been made with respect to a case in which the film 4 is retained by the metal member 10 via an adhesive, but the present invention is not limited thereto, and the film 4 may be thermo-compression bonded to the metal member 10. In this case, when the film 4 is a thermoplastic resin, the opening 9 of the metal member 10 may be filled with the film 4. As an alternative, the film 4 may be used as it is sandwiched between the TFT substrate 1 and the metal member 10 without bonding the film 4 to the metal member 10.

In the above, explanation has been made with respect to a case in which the deposition mask of is produced in the process for forming a thin film pattern, but the deposition mask may be produced in a process other than the process for forming a thin film pattern.

Figure 14:
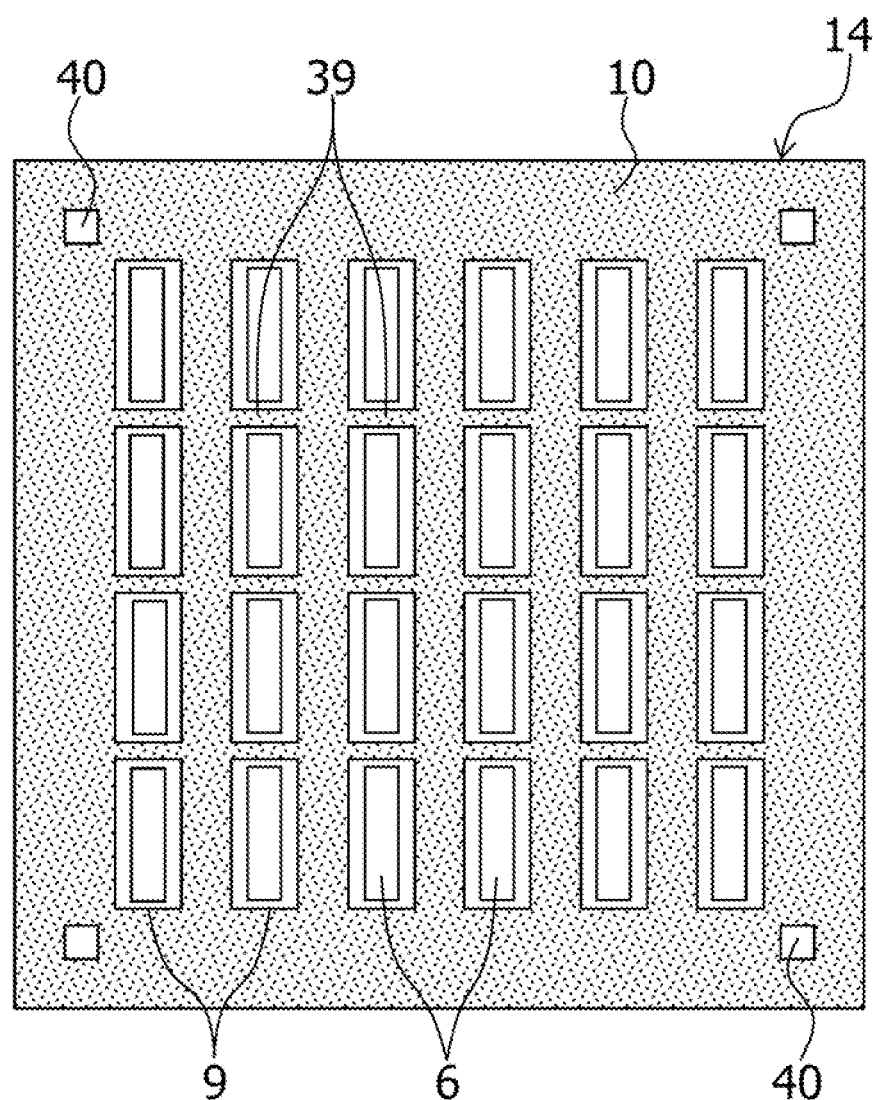
FIG. 14 is a front view illustrating a modified example of the deposition mask.

FIGS. 12A to 12E are process views illustrating a third embodiment of the method for producing the deposition mask of the present invention. This method for producing a deposition mask includes a first step of forming the metal member 10; a second step of retaining the resin film 4 by bringing it into close contact with the metal member 10; a third step of bringing the film 4 into close contact with the substrate 38; a fourth step of forming a plurality of opening patterns 6 in the film 4; and a fifth step of detaching the metal member 10 and the film 4 together from the substrate 38. In this method, a deposition mask illustrated in FIGS. 13A and 13B or FIG. 14 is produced.

Here, the deposition mask includes the film 4 that is made of a resin such as polyimide or polyethylene terephthalate (PET) transmitting visible light and that has the opening pattern 6 penetrating through the film 4 and having the same shape and dimension as those of a thin film pattern so as to correspond to a preliminarily determined forming region of the thin film pattern on the substrate; and the metal member 10 that has the opening 9 corresponding to the opening pattern 6 and having a shape and size greater than those of the opening pattern 6 so as to correspond to the opening pattern 6, and that closely contacts with one surface of the film 4. The deposition mask 14 illustrated in FIGS. 13A and 13B has a plurality of opening patterns 6 arranged in parallel each having an elongated shape, the deposition mask 14 illustrated in FIG. 14 has a plurality of rows each including a plurality of opening patterns 6 separated from each other by a plurality of bridges 39, and these deposition masks are appropriately selected according to the shape of a thin film pattern to be formed. In FIGS. 13A, 13B and FIG. 14, a symbol 40 indicates a mask-side alignment mark to be aligned to a substrate-side alignment mark provided on a substrate in advance.

Figure 12A:
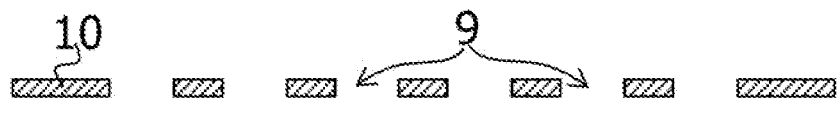
FIGS. 12A to 12E are process views illustrating a third embodiment of the method for producing the deposition mask of the present invention.

The above first step is, as illustrated in FIG. 12A, a step of forming through a thin plate-shaped magnetic material a plurality of openings 9 corresponding to a forming region of a thin film pattern and having a shape and size greater than those of the thin film pattern to form a metal member 10.

In more detail, in the first step, the metal member 10 is produced by employing a thin plate of a magnetic material such as nickel, a nickel alloy, invar or an invar alloy, having a thickness of, for example, form about 1 μm to a few μm, preferably, from about 30 μm to 50 μm, and forming the opening 9 by wet etching, dry etching such as ion milling using a resist mask, or by laser processing. In this case, since the opening 9 needs only to be greater in the shape than the opening pattern 6 formed in the film 4 in a fourth step to be described later, the forming accuracy of the opening 9 is not required to be such a high accuracy as that of the opening pattern 6. Here, the shape of the opening 9 is preferably such that it gradually narrows toward the film 4 side (its cross-sectional shape is a reversed trapezoid). With such a shape, a deposition material is not blocked at an edge portion of the opening 9 at a time of deposition, and it is possible to form the thin film pattern with a uniform film thickness.

Figure 12B:
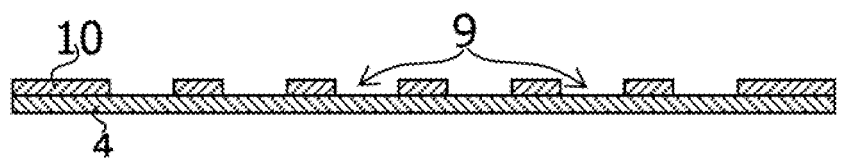

The abovementioned second step is, as illustrated in FIG. 12B, a step of forming a masking member while the film 4, that is made of a resin transmitting visible light, is brought into close contact with one surface of the metal member 10, and in this example, the second step is performed while the film 4 is thermocompression-bonded to the metal member 10.

Figure 15A:
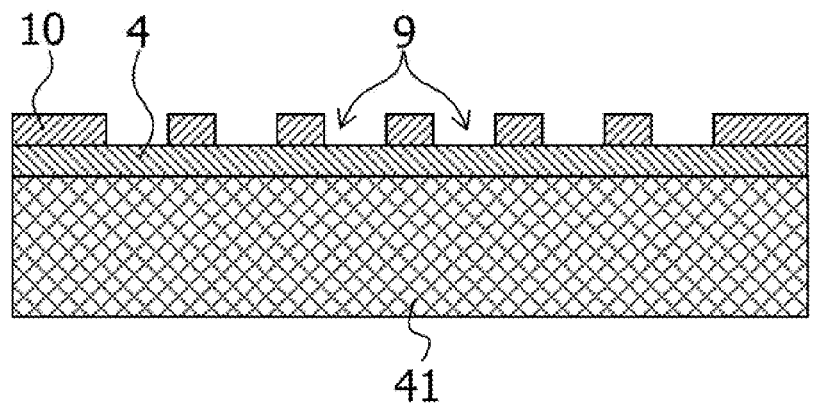
FIGS. 15A to 15C are explanation views illustrating example of formation of the mask member.
Figure 15B:
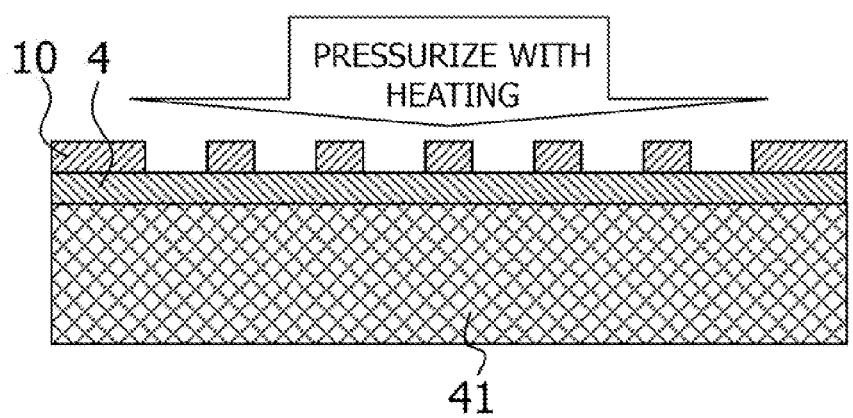
Figure 15C:
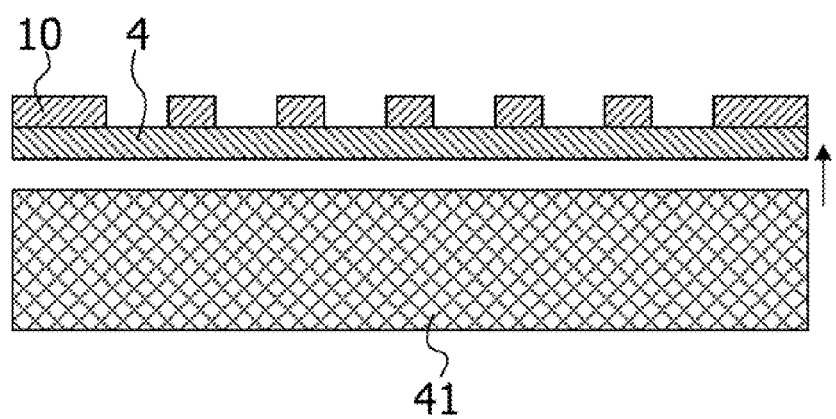

The second step includes, as illustrated in more detail in FIG. 15A, a step of placing the metal member 10 on an upper surface of a film 4 that is brought into close contact on a substrate 41 of e.g. a plate-shaped glass and that transmits visible light, or a film 4 having a surface applied with fusion bonding treatment; a step, as illustrated in FIG. 15B, of thermocompression-bonding the metal member 10 on an upper surface of the film 4 under a predetermined temperature and pressure to integrate them; and a step, as illustrated in FIG. 15C, of detaching the film 4 from the surface of the substrate 41. In this case, since torsion or warp of the metal member 10 is restricted by the film 4, the shape and the position of the opening 9 of the metal member 10 is maintained.

This second step is preferably performed in a state in which four corners of the metal member 10 are grabbed and pulled outwardly to apply a predetermined tension to the metal member 10. As an alternative, the second step may be performed in a state in which the metal member 10 made of a magnetic material is attracted to a flat surface of a magnetic chuck by a magnetic force, or may be performed while these process are appropriately combined. Here, the above magnetic chuck may be one having a permanent magnet, but is preferably one having an electromagnet which can on and off control of magnetic field generation. Furthermore, the step of detaching the film 4 from the surface of the substrate 41 illustrated in FIG. 15C is preferably performed in a state in which another magnetic chuck is placed on the metal member 10 and the metal member 10 is attracted and retained by a flat chucking surface of the magnetic chuck by a magnetic force. Accordingly, it is possible to maintain high accuracy of the shape and the position of the opening 9 of the metal member 10.

A film material used in this step is preferably a film made of a resin that can be abraded by irradiation with laser light L of ultraviolet rays, such as polyimide or polyethylene terephthalate. Particularly, polyimide is more preferable since it has a linear expansion coefficient of from about $10 \times 10^{-6}$ to about $40 \times 10^{-6}/°$ C. that is equal to the linear expansion coefficient of a metal such as nickel (from about $6 \times 10^{-6}$ to about $20 \times 10^{-6}/°$ C.) within a tolerable range, in a case of using it in combination of the metal member 10 made of a metal material, it is possible to suppress generation of warp at a time of deposition due to the difference between these members in thermal expansion coefficient. Furthermore, since a metal such as invar has an extremely small thermal expansion coefficient (about $2 \times 10^{-6}/°$ C. or lower), it is possible to restrict thermal expansion of the deposition mask due to radiation heat at a time of deposition, to thereby maintain position accuracy of the opening pattern 6.

Figure 12C:
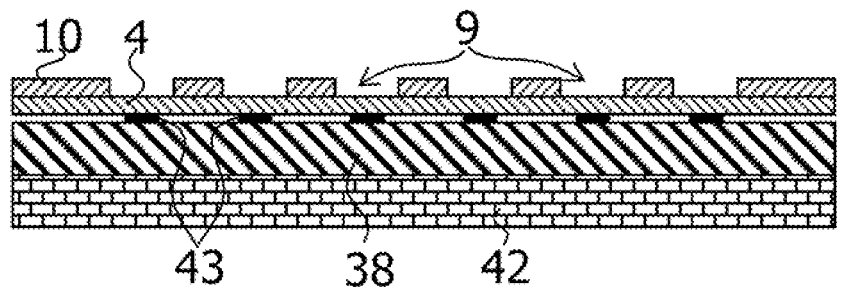

In the above third step, as illustrated in FIG. 12C, while a mask-side alignment mark 40 (refer to FIGS. 13A, 13B and 14) formed in the metal member 10 in advance and a substrate-side alignment mark, not illustrated, formed on the substrate 38 in advance, are observed through a microscope, the metal member 10 is aligned to the substrate 38 so that these marks have a predetermined positional relationship so that a thin film pattern forming region on the substrate 38 placed on a first magnetic chuck 42 is positioned in the opening 9 of the metal member 10, and thereafter, the metal member 10 is placed on the substrate 38, and the metal member 10 is attracted by a magnetic force of the first magnetic chuck 42 to thereby bring the film 4 into close contact with the upper surface of the substrate 38.

In this case, the substrate 38 may be a substrate on which a thin film pattern is to be formed by deposition, or a reference substrate having a reference pattern 43 provided so as to correspond to the thin film pattern forming region and used as an irradiation target of laser light L in a fourth step to be described later. When the substrate 38 is a substrate on which deposition is to be made, subsequent to formation of the opening pattern 6 in a fourth step to be described later, deposition may performed through the opening pattern 6 to form a thin film pattern on the substrate 38. Accordingly, it is possible to form a fine thin film pattern with high position accuracy.

Figure 12D:
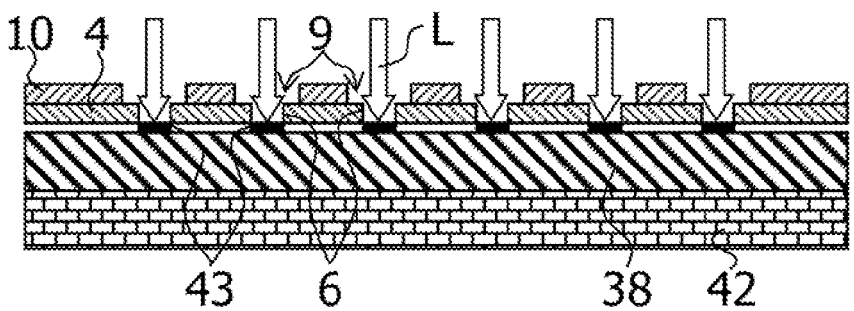

In the fourth step, as illustrate in FIG. 12D, a portion of the film 4 corresponding to a thin film pattern forming region (reference pattern 43) in the opening 9 of the metal member 10, is irradiated with laser light L having an energy density of from 0.1 J/cm$^2$ to 20 J/cm$^2$ and a wavelength of 400 nm or shorter, for example, by using an excimer laser of KrF 248 nm, to form the opening pattern 6 penetrating through the film 4 and having the same shape and dimension as those of the thin film pattern.

Figure 12E:
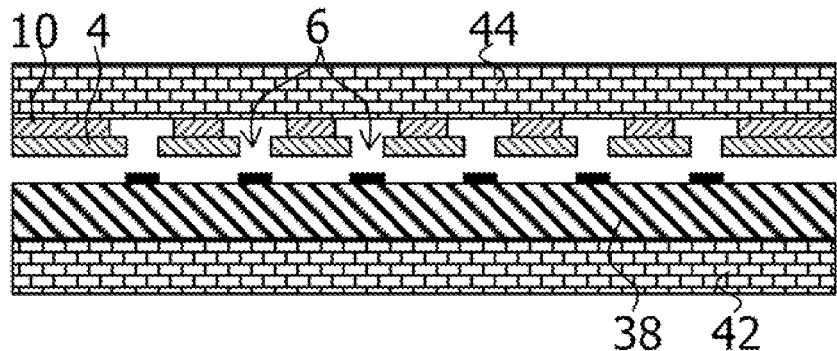

In the fifth step, as illustrate in FIG. 12E, a second magnetic chuck 44 having a flat chucking surface is placed on the metal member 10, the electromagnet of the second magnetic chuck 44 is turned on and the electromagnet of the first magnetic chuck 42 is turned off to attract the metal member 10 to the second magnetic chuck 44 by a magnetic force to thereby detach the metal member 10 and the film 4 together from the substrate 38, and transfer them to the second chuck 44 side. Thus, the process for producing the deposition mask of the present invention is completed, and the deposition mask illustrated in FIGS. 13A, 13B and 14 is completed. Thereafter, by handling the deposition mask 14 in a state that the metal member 10 is attracted to the second magnetic chuck 44, the shape and the position of the opening pattern 6 of the deposition mask 14 is maintained, and it is possible to perform subsequent formation of a fine thin film pattern easily.

As another example of forming the masking member, the property of a surface of the film 4 may be modified, and thereafter, the metal member 10 may be thermocompression-bonded to the film 4 to integrate the metal member 10 and the film 4 together. As the surface modification treatment, there is a method of etching a surface of the film 4 to form hydrophilic groups such as carboxyl groups (—COOH) or carbonyl groups (—CO—) on the surface. By this method, it becomes possible to bond the film 4 and the metal member 10 by chemical bond at the interface between these members. As an alternative, for example, a silane coupling agent and the like may be applied to the interface between the film 4 and the metal member 10, thereby forming silanol groups (SiOH) to improve wettability, and making hydrogen bonds, that are formed at the interface between the film 4 and the metal member 10, undergo further dehydration condensation. Accordingly, it becomes possible to achieve more stable bonding by chemical bond. As still another alternative, it is also possible to perform a plasma treatment of a surface of the film 4 in atmospheric pressure plasma or in reduced-pressure plasma, or to perform wet etching of the surface of the film 4 with an alkaline solution to thereby modify the property of the surface of the film 4.

Figure 16A:
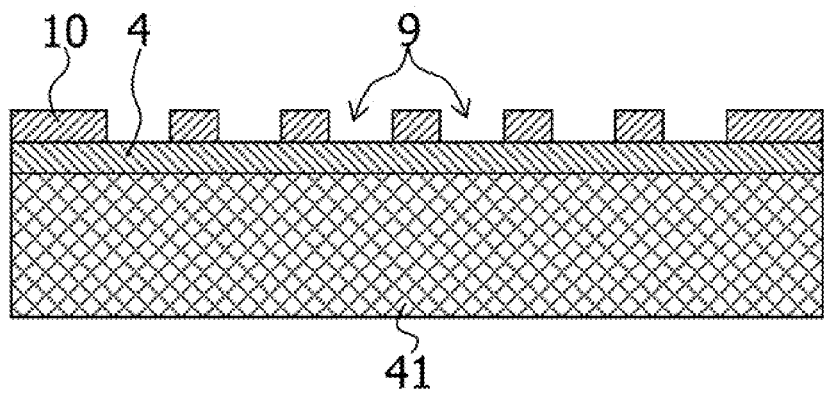
FIGS. 16A to 16C are explanation views illustrating another example of formation of a mask member.
Figure 16B:
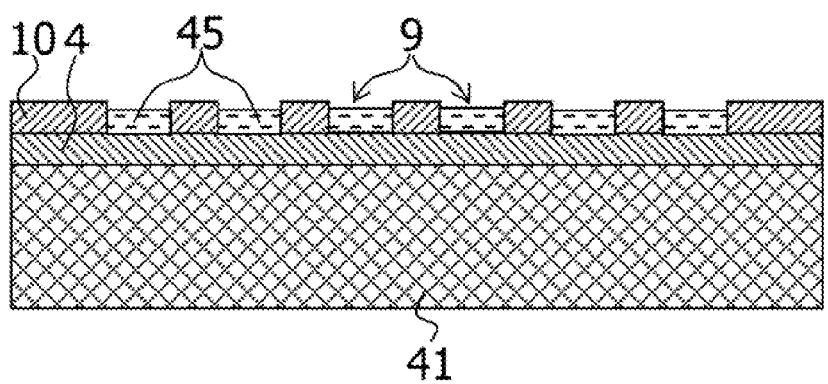
Figure 16C:
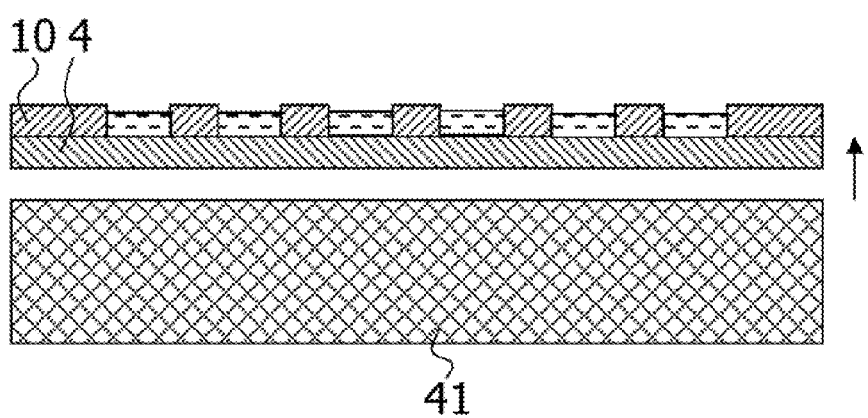

FIGS. 16A to 16C are explanation views illustrating still another formation example of the masking member.

This formation example includes: a step illustrated in FIG. 16A of placing the metal member 10 on an upper surface of the film 4 closely in contact on the substrate 41 of a flat plate-shaped glass and the like; a step illustrated in FIG. 16B of applying a curable resin 45, that transmits visible light, in an opening 9 of the metal member 10, and curing the curable resin 45 to integrate the metal member 10 with the film 4; a step illustrated in FIG. 16C of attracting the metal member 10 to a flat chucking surface of a magnetic chuck, not illustrated, to detach the film 4 from the surface of the substrate 41. The curable resin 45 used in this step is preferably, for example, a UV-curable or photo-curable resin containing no solvent or extremely small amount of solvent.

Figure 17A:
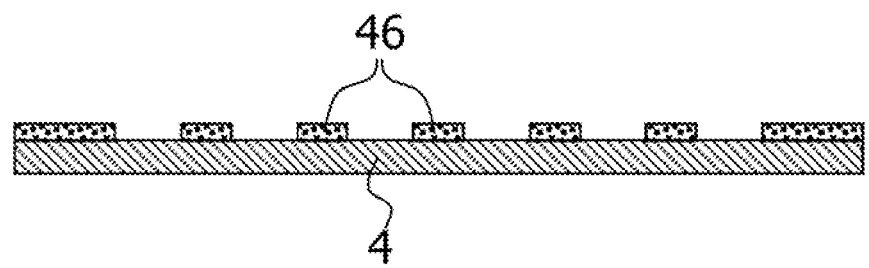
FIGS. 17A to 17C are explanation views illustrating still another example of formation of a mask member.
Figure 17B:
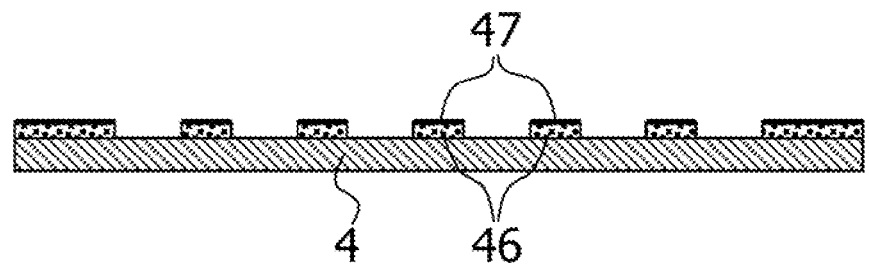
Figure 17C:
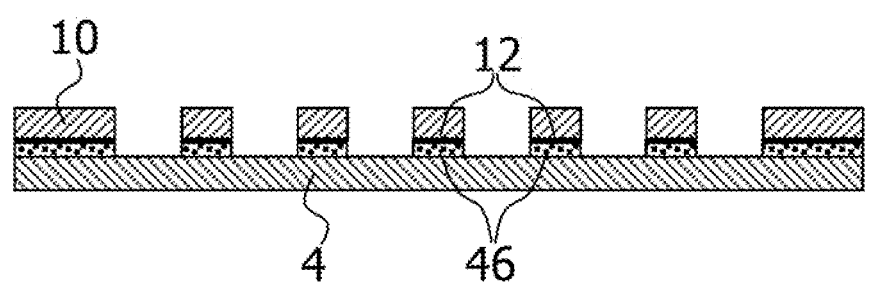

FIGS. 17A to 17C are explanation views illustrating still another formation example of the masking member.

This formation example includes: a step illustrated in FIG. 17A of forming a metal film 46 of, for example, copper on one surface of the film 4, that is electrostatically attracted to a non-illustrated electrostatic chuck having a flat surface, by deposition by using a known deposition technique such as sputtering or plating; a step illustrated in FIG. 17B of applying a non-flux solder 47 on the metal film 46; and a step illustrated in FIG. 17C of soldering the metal film 46 to the metal member 10 by the non-flux solder 47 to bond the film 4 to the metal member 10. In the case of bonding by the non-flux solder 47, there is no possibility that impurity gas is generated at a time of deposition. Accordingly, for example, at a time of forming an organic EL light emission layer by deposition, it is possible to solve a problem that the organic EL light emission layer is damaged by the impurity gas.

Figure 18A:
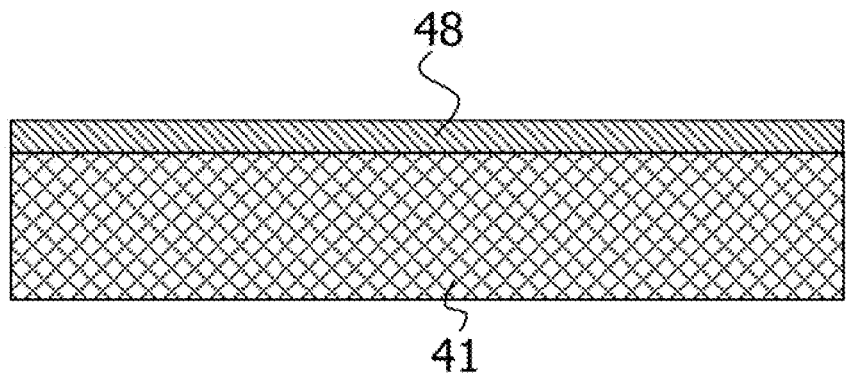
FIGS. 18A to 18C are explanation views illustrating still another example of formation of a mask member.
Figure 18B:
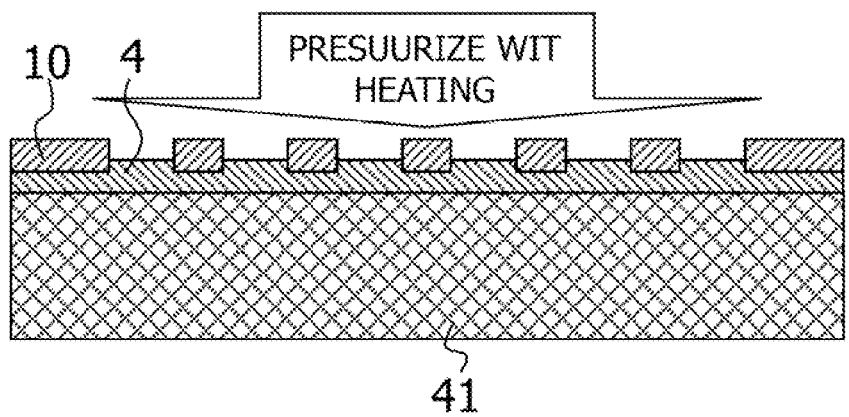
Figure 18C:
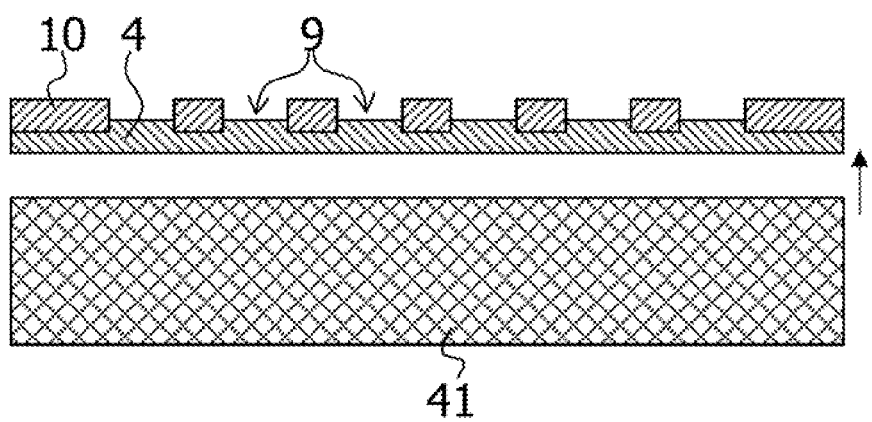

FIGS. 18A to 18C are explanation views illustrating still another formation example of the masking member.

This formation example includes: a step illustrated in FIG. 18A of spin-coating or dip-coating the substrate 41 of, for example, glass having a flat surface with a resin solution 48 such as polyimide to have a thickness of, for example, about 30 μm, and thereafter, heating the resin solution 48 into a half-dry state; a step illustrated in FIG. 18B of compression-bonding the metal member 10 on to the resin in half-dry state, and thereafter, drying the resin to form the film 4 retained by the metal member 10; and a step illustrated in FIG. 18C of attracting the metal member 10 to, for example, a flat chucking surface of a magnetic chuck, not illustrated, to detach the film 4 from the surface of the substrate 41.

Here, the above half-dry state of the resin solution 48 can be achieved by appropriately adjusting heating temperature and heating time, and the heating conditions are determined in advance by experiment. Furthermore, in the same manner, conditions for completely drying the resin are also determined in advance.

FIGS. 19A to 19D are explanation views illustrating still another formation example of the masking member.

Figure 19A:
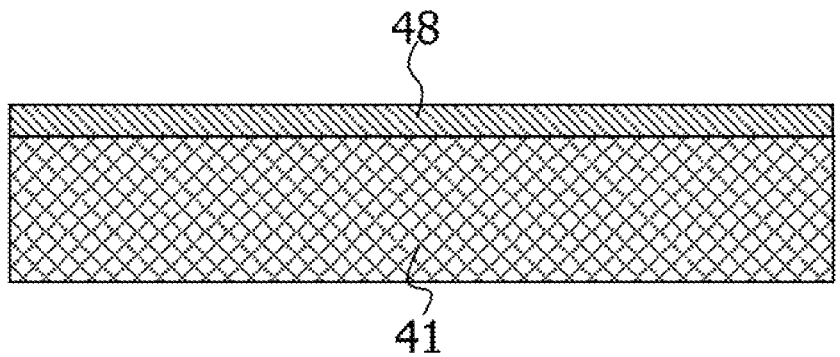
FIGS. 19A to 19D are explanation views illustrating still another example of formation of a mask member.
Figure 19B:
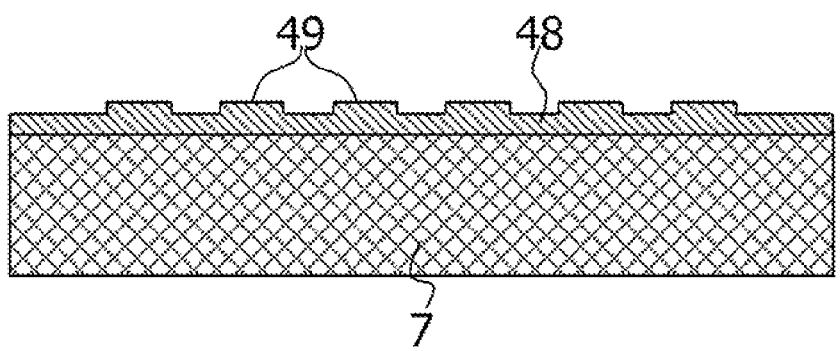
Figure 19C:
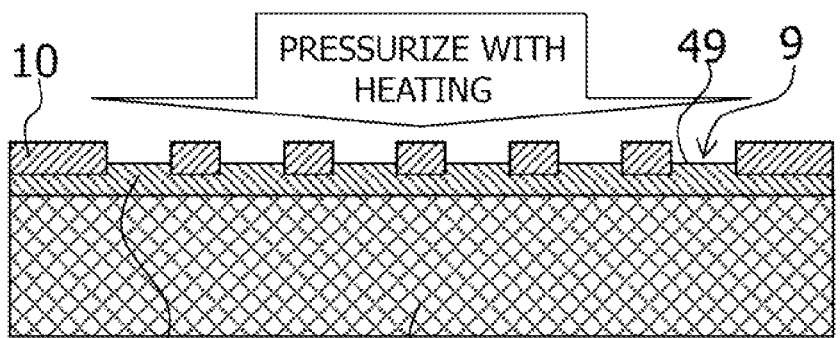
Figure 19D:
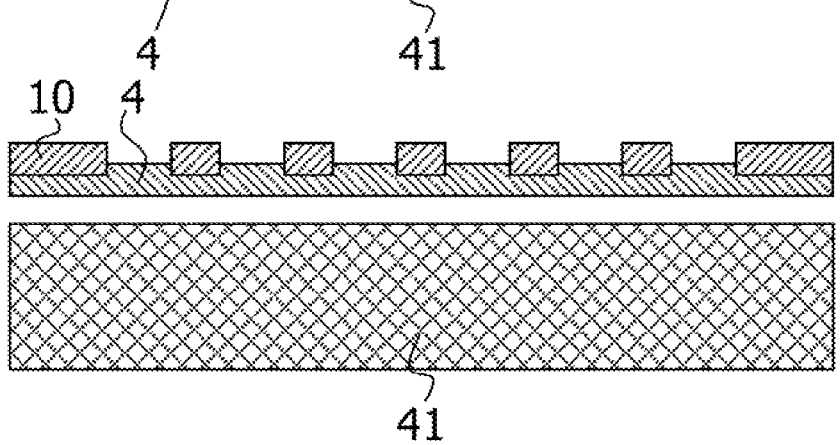

This formation example includes: a step illustrated in FIG. 19A of spin-coating or dip-coating the substrate 41 of, for example, glass with a resin solution 48 such as a photoresist or a photosensitive polyimide to have a thickness of about 30 μm; a step illustrated in FIG. 19B of exposing the photosensitive resin by using a photomask, and thereafter, performing development to form a projecting pattern 49 at a position corresponding to the opening 9 of the metal member 10; a step illustrated in FIG. 19C of compression-bonding the metal member 10 on to the photosensitive resin in a state in which the opening 9 of the metal member 10 is aligned to the projecting pattern 49, and thereafter, performing drying by heating at a predetermined temperature to form the film 4 retained by the metal member 10; and a step illustrated in FIG. 19D of attracting the metal member 10 to, for example, a flat chucking surface of a magnetic chuck, not illustrated, to detach the film 4 from the surface of the substrate 41.

In this case, by forming the projecting pattern 49 to have a trapezoidal vertical cross-sectional shape having a narrow top portion and a wide bottom portion, it is possible to easily fit the opening 9 of the metal member 10 to the projecting pattern 49 by using a side face of the projecting pattern 49 as a guide. Furthermore, since the opening 9 of the metal member 10 is positioned and restricted by the projecting pattern 49, it is possible to improve the position accuracy of the opening 9 of the metal member 10 from the case of FIGS. 17A to 17C.

Figure 20A:
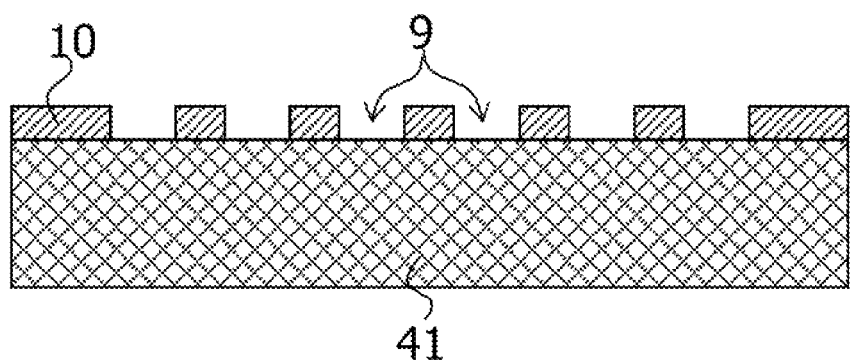
FIGS. 20A to 20C are explanation views illustrating still another example of formation of a mask member.
Figure 20B:
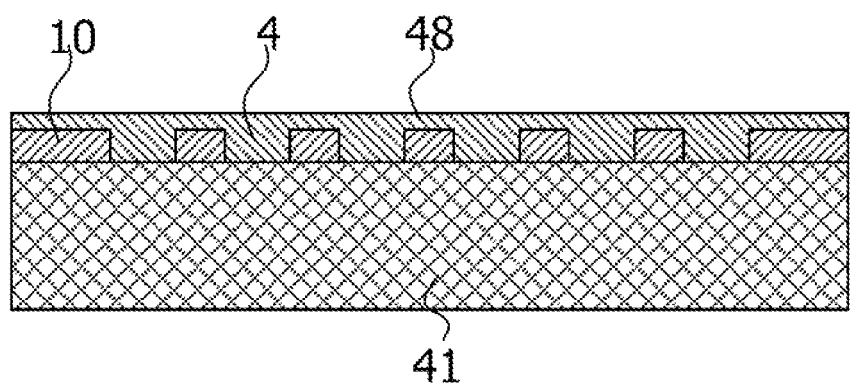
Figure 20C:
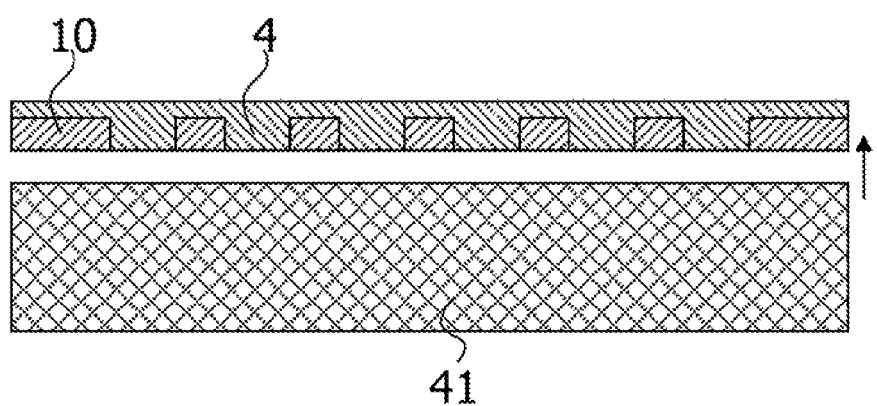

FIGS. 20A to 20C are explanation views illustrating still another formation example of the masking member.

This formation example includes: a step illustrated in FIG. 20A of placing the metal member 10 on an upper surface of a flat plate-shaped substrate 41; a step illustrated in FIG. 20B of coating an upper surface of the metal member 10 with a resin solution 48 such as polyimide with a thickness greater than the thickness of the metal member 10, and thereafter, performing heating at a predetermined temperature to dry the resin solution to form the film 4 retained by the metal member 10; and a step illustrated in FIG. 20C of attracting the metal member 10 to, for example, a flat chucking surface of a magnetic chuck, not illustrated, to detach the film 4 from the surface of the substrate 41.

In this case, the steps illustrated in FIGS. 20A and 20B are preferably performed in state in which the metal member 10 is placed on a flat chucking surface of another magnetic chuck so that the metal member 10 is attracted and retained by a magnetic force of the magnetic chuck. Accordingly, it is possible to maintain the shape and the position of the opening 9 with high accuracy.

FIGS. 21A to 21D are explanation views illustrating still another formation example of the masking member.

Figure 21A:
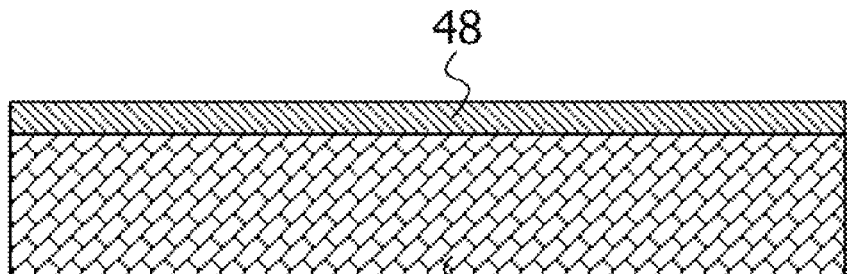
FIGS. 21A to 21D are explanation views illustrating still another example of formation of a mask member.
Figure 21B:
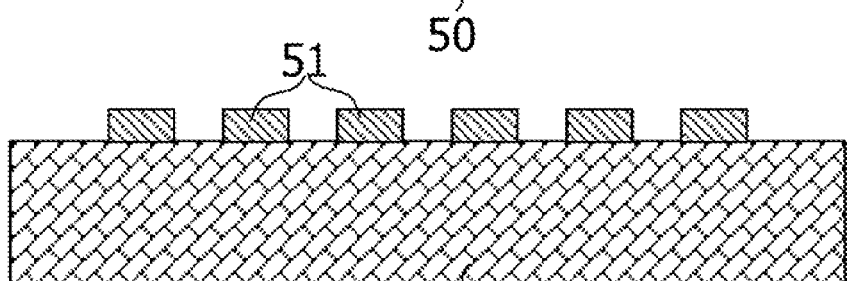
Figure 21C:
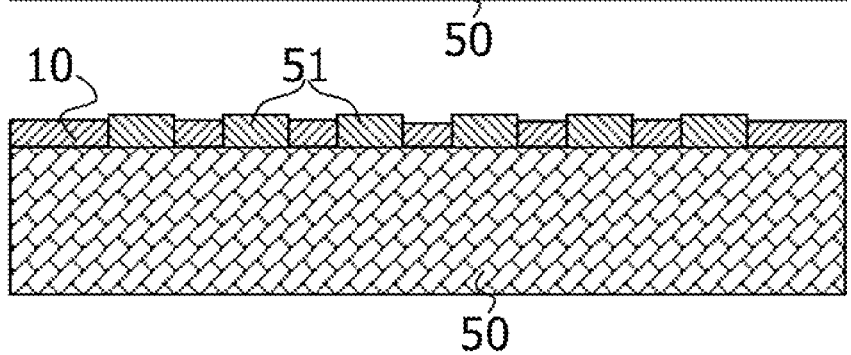
Figure 21D:
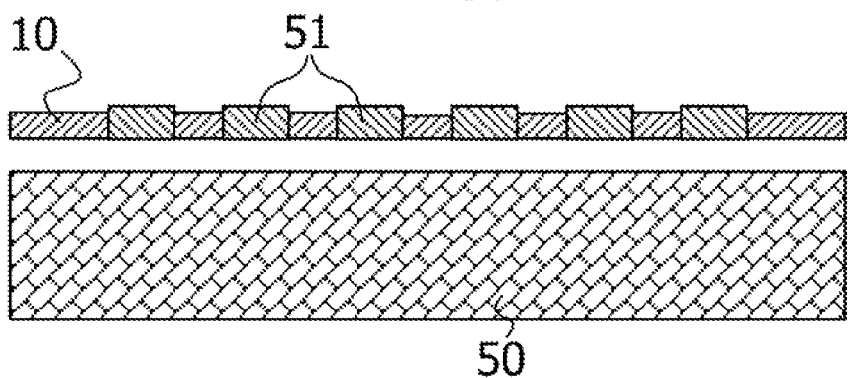

This formation example includes: a step illustrated in FIG. 21A of spin-coating or dip-coating an upper surface of a flat plate-shaped metal substrate 50 made of, for example, a stainless-steel with a resin solution 48 such as a photoresist or a photosensitive polyimide to have a thickness of about 30 μm; a step illustrated in FIG. 21B of exposing the photosensitive resin by using a photomask, and thereafter, performing development to form an island pattern 51 (corresponding to film 4) so as to correspond to the openings 9 of the metal member 10; a step illustrated in FIG. 21C of plating a surrounding region of the island pattern 51 to form a magnetic film of, for example, nickel or a nickel alloy having a thickness of about 30 μm to thereby form the metal member 10; and a step illustrated in FIG. 21D of attracting the metal member 10 to, for example, a flat chucking surface of a magnetic chuck, not illustrated, to detach the metal member 10 and the island pattern 51 (film 4) together from the surface of the metal substrate 50.

In this case, since the metal member 10 is produced by forming the magnetic film in the surrounding region of the island pattern 51 (film 4) made of a resin and formed by using a photolithography technique, it is possible to form the opening 9 of the metal member 10 with high accuracy.

FIGS. 22A to 24C are explanation views illustrating still another method for producing the deposition mask (second embodiment) of the present invention. Explanation will be made with reference to the views.

Figure 22A:
FIGS. 22A to 22H are explanation views illustrating still another example of formation of a mask member.
Figure 22B:
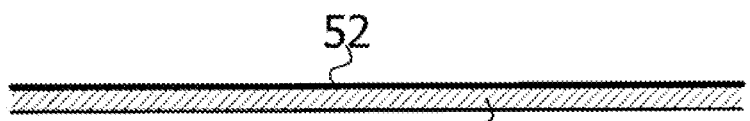

First, as illustrated in FIG. 22A, in a state in which the film 4 of, for example, polyimide having a thickness of about from 10 μm to 30 μm that transmits visible light and that is, for example, attracted and retained on a non-illustrated stage having a flat surface, a surface 4a of the film 4 is coated with an underlayer 52 that is a metal film of a magnetic material such as nickel having a thickness of about 50 nm by a known deposition technique such as sputtering as illustrated in FIG. 22B. In this case, the underlayer 52 is not limited to a metal film of a magnetic material, but it may be a metal film of a non-magnetic material having high electric conductivity.

Figure 22C:

Next, as illustrated in FIG. 22C, a resist 53 (photo sensitive material) having a thickness of about 30 μm is applied on the underlayer 52 by, for example, spin-coating.

Figure 22D:
Figure 22E:

Next, as illustrated in FIG. 22D, exposure is performed by using a photomask 54, and development is performed as illustrated in FIG. 22E to form an island pattern 51 of the resist 53 having a shape greater than that of a thin film pattern in a portion corresponding to a thin film pattern forming region of a substrate (such as a TFT substrate). In this case, when the resist 53 is of a negative type, the photomask 54 to be used has an opening formed in a portion corresponding to the thin film pattern forming region on the substrate, and when the resist 53 is of a positive type, the photomask 54 blocks light in a portion corresponding to the thin film pattern forming region on the substrate.

Figure 22F:

Subsequently, as illustrated in FIG. 22F, a region of the film 4 surrounding the island pattern 51 is plated to form the metal member 10 made of a magnetic material such as nickel or invar and having a thickness of about 30 μm.

Figure 22G:
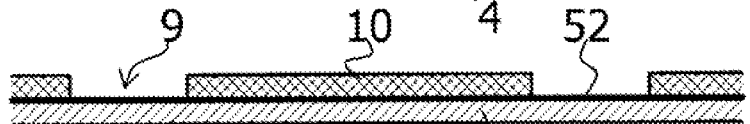
Figure 22H:
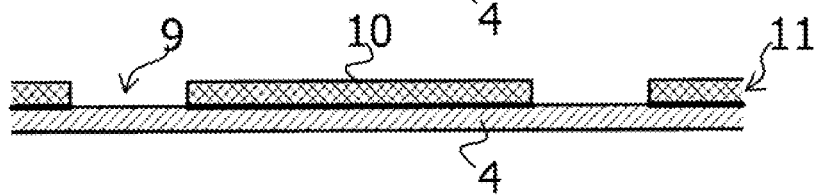

Furthermore, as illustrated in FIG. 22G, the island pattern 51 is detached to form the opening 9 corresponding to the island pattern 51 in the metal member 10, and thereafter, as illustrated in FIG. 22H, the underlayer 52 in the opening 9 is etched to be removed, to form the masking member 11. Here, at a predetermined position in the metal member 10, the mask-side alignment mark 40 for aligning the mask to the substrate is formed.

The masking member 11 thus formed is retained by a second magnetic chuck 44 having a flat chucking surface 44a, which attracts the metal member 10 side of the masking member 11.

Next, as illustrated in FIG. 23B, the masking member 11 is positioned above a substrate 1 (such as a TFT substrate) placed on the first magnetic chuck 42 having a flat chucking surface 42a, and while a substrate-side alignment mark, not illustrated, formed on the substrate 1 in advance and a mask-side alignment mark 40 formed on the masking member 11 in advance are observed through a microscope, the substrate 1 is aligned to the masking member 11 so that both marks have a predetermined positional relationship so that, as illustrated in FIG. 23C, a thin film pattern forming region 55 (such as a region on an anode electrode) is positioned in the opening 9, and thereafter, the film 4 is brought into close contact on the substrate 1. Thereafter, as illustrated in FIG. 23D, an electromagnet 56 of the first magnetic chuck 42 is turned on and an electromagnet 56 of the second magnetic chuck 44 is turned off to attract the metal member 10 by a magnetic force of the first magnetic chuck 42 to transfer the masking member 11 from the second magnetic chuck 44 on to the substrate 1.

Figure 24A:
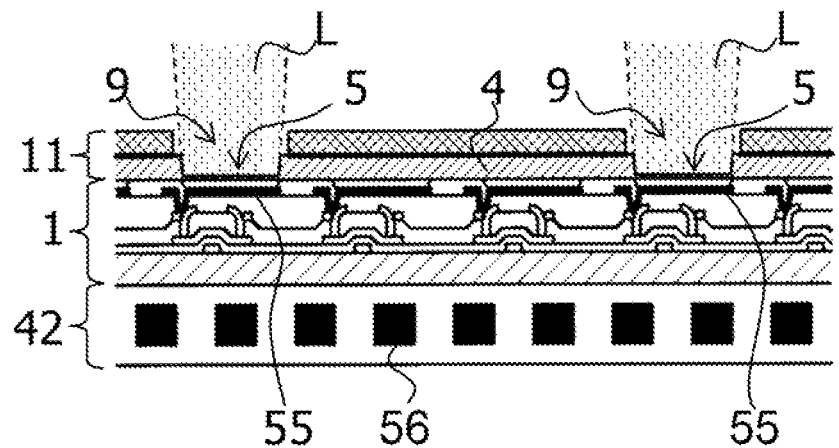
FIGS. 24A to 24C are a view illustrating modified example of the third embodiment of the method for producing the deposition mask of the present invention, which are cross-sectional views illustrating a second half process of the method.
Figure 24B:
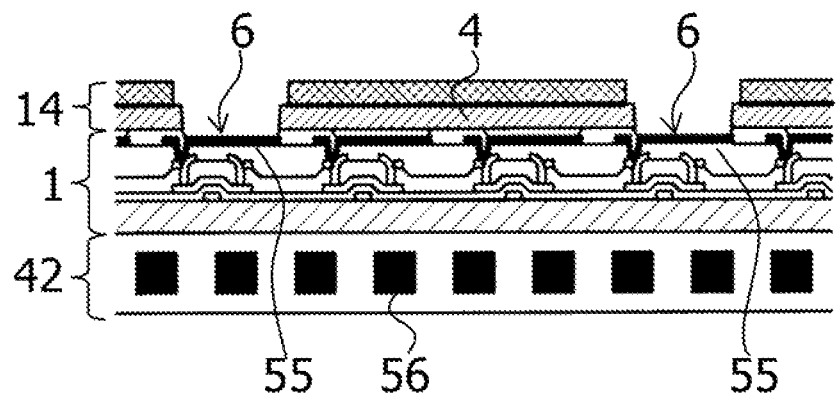

Subsequently, by using a laser having a wavelength of 400 nm or shorter such as a KrF excimer laser of 248 nm, as illustrated in FIG. 24A, a portion of the film 4 corresponding to the thin film pattern forming region in the opening 9 of the masking member 11 is irradiated with laser light L having an energy density of from 0.1 J/cm$^2$ to 20 J/cm$^2$ to form a concave portion 5 having a predetermined depth with a thin layer remaining on the bottom. Subsequently, as illustrated in FIG. 24B, a plasma treatment is performed in a known plasma treatment apparatus, to remove the thin layer on the bottom of the convex portion 5 to form the opening pattern 6 penetrating through the film. Thus, the deposition mask 14 is produced.

Figure 24C:
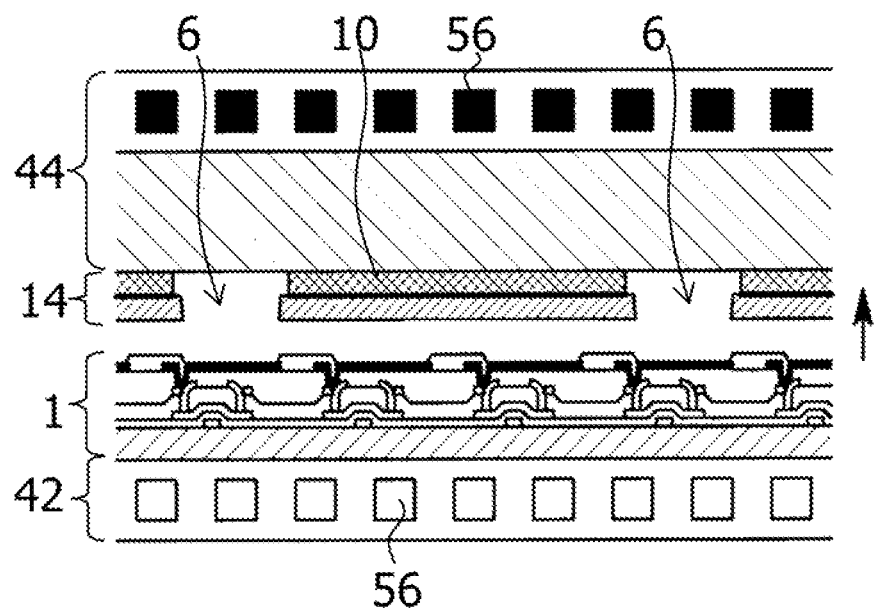

Next, on the deposition mask 14, the second magnetic chuck 44 is placed. Then, as illustrated in FIG. 24C, the electromagnet 56 of the second magnetic chuck 44 is turned on and the electromagnet 56 of the first magnetic chuck 42 is turned off to attract the metal member 10 by the second magnetic chuck 44 to thereby transfer the deposition mask 14 to the second magnetic chuck 44. Thereafter, the deposition mask 14 is reserved in a state in which it is retained by the second magnetic chuck 44.

Here, in a case of continuously forming a thin film pattern (such as an organic EL layer) on the substrate 1 by vapor deposition, in FIG. 24B, when the deposition mask 14 is formed, the substrate 1 and deposition mask 14, that are integrally retained by the first magnetic chuck 42, may be disposed in a vacuum chamber of a vacuum vapor deposition apparatus, and vacuum vapor deposition with a vapor deposition material may be performed through the opening pattern 6 of the deposition mask 14 to form the thin film pattern.

Next, a process for forming an opening pattern in the film 4 by laser processing will be described in more detail.

Here, as illustrated in FIGS. 25A and 25B, explanation will be made with respect to a case of forming an opening pattern 6 having an elongated shape as illustrated in FIGS. 13A and 13B in the masking member 11 that has been formed by bringing into close contact with one surface of the film 4 made of a resin transmitting visible light the metal member 10 that is a thin plate-shaped magnetic material having a plurality of penetrating openings 9 having a shape greater than that of the thin film pattern and provided so as to correspond to the forming region of the thin film pattern.

Figure 26:
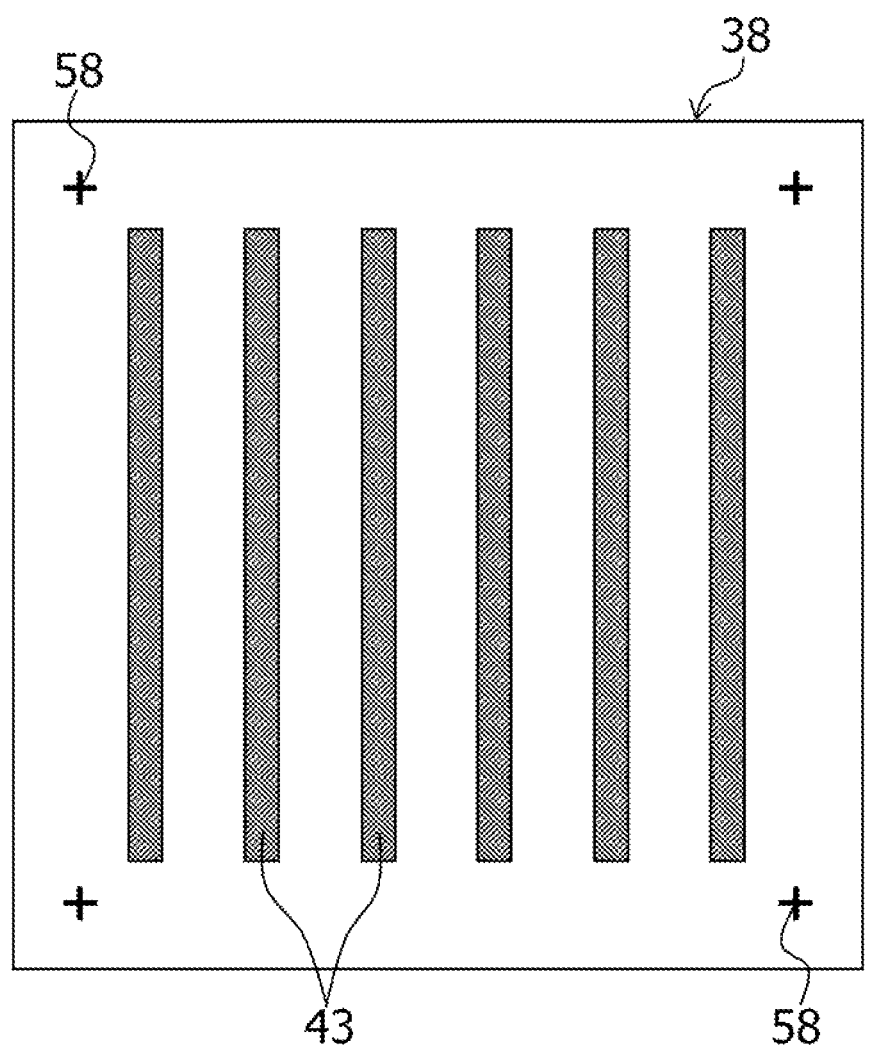
FIG. 26 is a plan view illustrating a construction example of a reference substrate to be used in the method of FIGS. 25A to 25E.

In this case, as illustrated in FIG. 25C, a reference substrate 38 (refer to FIG. 26) is employed, which is a transparent substrate 57 having one surface 57a provided with a plurality of reference patterns 43, to be described later, each having the same shape and dimension as those of a thin film pattern and to be used as an irradiation target of laser light L, that are formed in parallel at the same arrangement pitch as an arrangement pitch of the thin film pattern; the reference substrate 38 is placed on a stage of a laser processing apparatus so that the reference pattern 43 is on the underside, and in this state, the metal member 10 is aligned to the reference substrate 38 so that such a reference pattern 43 is positioned in the opening 9 of the metal member 10; and thereafter, the film 4 is brought into close contact with the other surface 57b of the reference substrate 38. Here, on the reference substrate 38, at a position outside the forming region of the plurality of reference patterns 43 and corresponding to the mask-side alignment mark 40, for example, a cross-shaped substrate-side alignment mark 58 of a thin film of chromium (Cr) and the like is formed simultaneously to the reference pattern 43.

Alignment of the metal member 10 to the reference substrate 38 is performed while the mask-side alignment mark 40, that has been formed on the masking member 11 in advance, and the substrate-side alignment mark 58, that has been formed on the reference substrate 38 in advance, are observed through a microscope, so that the center of the substrate-side alignment mark 58 agrees with the center of the mask-side alignment mark 40.

Furthermore, close contact of the film 4 with the reference substrate 38 is performed by attracting the metal member 10 by a magnetic force of a magnet chuck provided on a rear side of the stage, and at the same time, the metal member 10, the film 4 and the reference substrate 38 are integrally fixed to the stage.

Next, as illustrated in FIG. 25D, by using a laser having a wavelength of 400 nm or shorter such as a KrF excimer laser of 248 nm, a portion of the film 4 corresponding to the reference pattern 43 in the opening 9 of the metal member 10, is irradiated with laser light L having an energy density of from 0.1 J/cm$^2$ to 20 J/cm$^2$ to form an opening pattern 6 which penetrates through the film 4, having the same shape as that of the thin film pattern.

This laser processing is performed in such a manner that while the masking member 11 and the reference substrate 38 are scanned in an arrangement direction (arrow direction in FIG. 25D) of the reference patterns 43 of the reference substrate 38, an image of the reference pattern 43 is captured by transillumination by the image capturing device 17 provided to allow image-capturing of a position on the upstream side of the irradiation position of laser light L in a scanning direction of the masking member 11 and the reference substrate 38, the reference pattern 43 is detected based on the captured image, and irradiation timing of laser light L is controlled based the detection time. Thus, the deposition mask illustrated in FIGS. 13A and 13B is completed.

The abovementioned image-capturing device 17 is a line camera having a plurality of light-receiving elements arranged in line in a direction intersecting the scanning direction of the masking member 11 and the reference substrate 38, and the reference pattern 43 can be detected from brightness change in the scanning direction (for example, brightness change from bright to dark in a case of transillumination) based on the captured image by the image-capturing device 17.

Figure 27A:
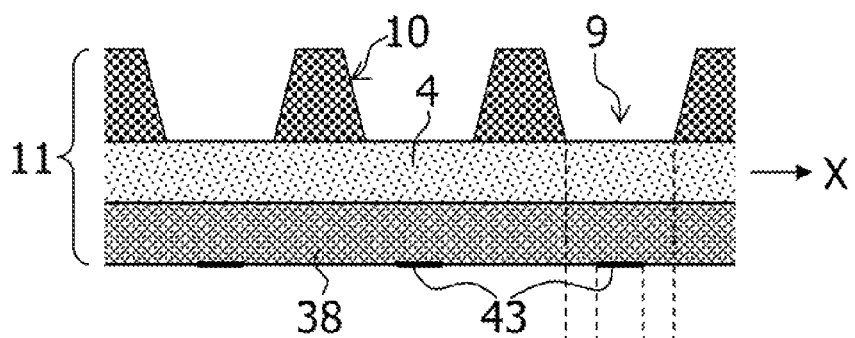
FIGS. 27A and 27B are explanation views illustrating a method for detecting whether or not a position error amount between an opening of a metal member and a reference pattern of the reference substrate is within a tolerance.
Figure 27B:
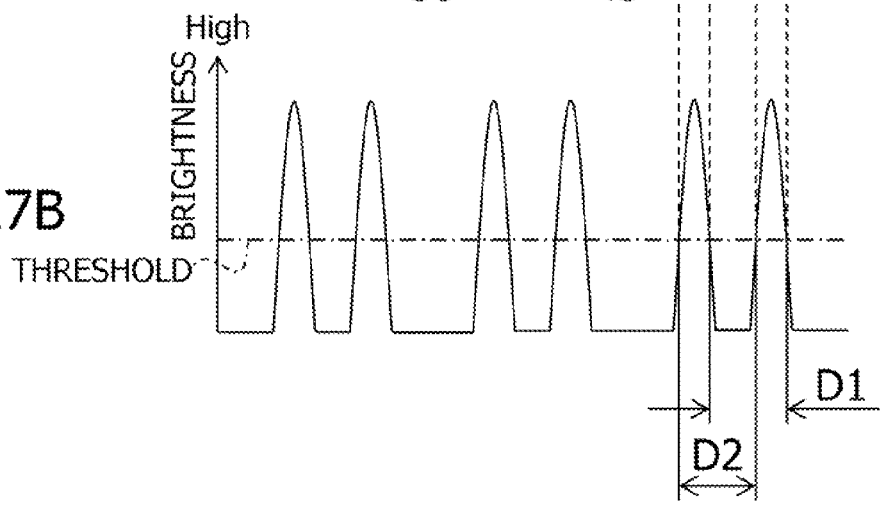

Furthermore, the laser processing is performed while confirming that a position error amount between the center of the opening 9 of the metal member 10 and the center of the reference pattern 43 of the reference substrate 38 is within a tolerable range based on the captured image by the image-capturing device 17. In more detail, based on the captured image by the image-capturing device 17, a brightness change as illustrated in FIGS. 27A and 27B exceeding a threshold value in the scanning direction of the masking member 11 and the reference substrate 38, is detected, positions changing from dark to bright are detected to compute a distance D1 between adjacent such brightness change positions, positions changing from bright to dark are further detected to compute a distance D2 between adjacent such brightness change positions, |D1−D2| is computed, and it is determined whether or not the computed value is within a predetermined tolerable range. In this case, if the computed value is outside the tolerable range, it is determined that there is an alignment error between the metal member 10 and the reference substrate 38, or there is a poor forming accuracy of the opening 9 of the metal member 10, and then, no irradiation with laser light is performed, and the step of laser processing is terminated immediately.

When the laser processing is completed, as illustrated in FIG. 25E, a magnetic chuck (retaining device), not illustrated, having a flat chucking surface, is placed on an upper surface of the metal member 10, an electromagnet of the electromagnetic chuck is turned on to attract the metal member 10 by a magnetic force of the magnetic chuck to detach the deposition mask from the reference substrate 38 and transfer the deposition mask on to the magnetic chuck side. Thus, the entire process for producing a deposition mask of the present invention is completed. Thereafter, by handling the deposition mask in a state in which the metal member 10 is attracted to the magnetic chuck, it is possible to maintain the shape and the position of the opening pattern 6 of the deposition mask and to perform subsequent formation of a fine thin film pattern easily.

As an alternative, one surface of a sheet coated with an adhesive that can be easily detached, may be brought into close contact with an upper surface of the metal member 10 so that the metal member 10 is pasted to the sheet, and the deposition mask may be detached from the reference substrate 38. Therefore, handling property of the deposition mask is further improved.

Here, in the above, explanation has been made with respect to a case in which the opening pattern 6 is formed in the film 4 by performing irradiation with laser light L while scanning the masking member 11 and the reference substrate 38. However, the present invention is not limited thereto, and the opening pattern 6 may be formed while moving the laser light L side in a step movement in an arrangement direction of the reference patterns 43 of the reference substrate 38.

The opening pattern 6 can be formed in the film 4 by using a laser processing apparatus illustrated in FIG. 9. In this case, the masking member 11 and the reference substrate 38 are scanned together.

FIGS. 29A to 29D are cross-sectional views illustrating a forth embodiment of a method for producing a deposition mask of the present invention.

Figure 28:
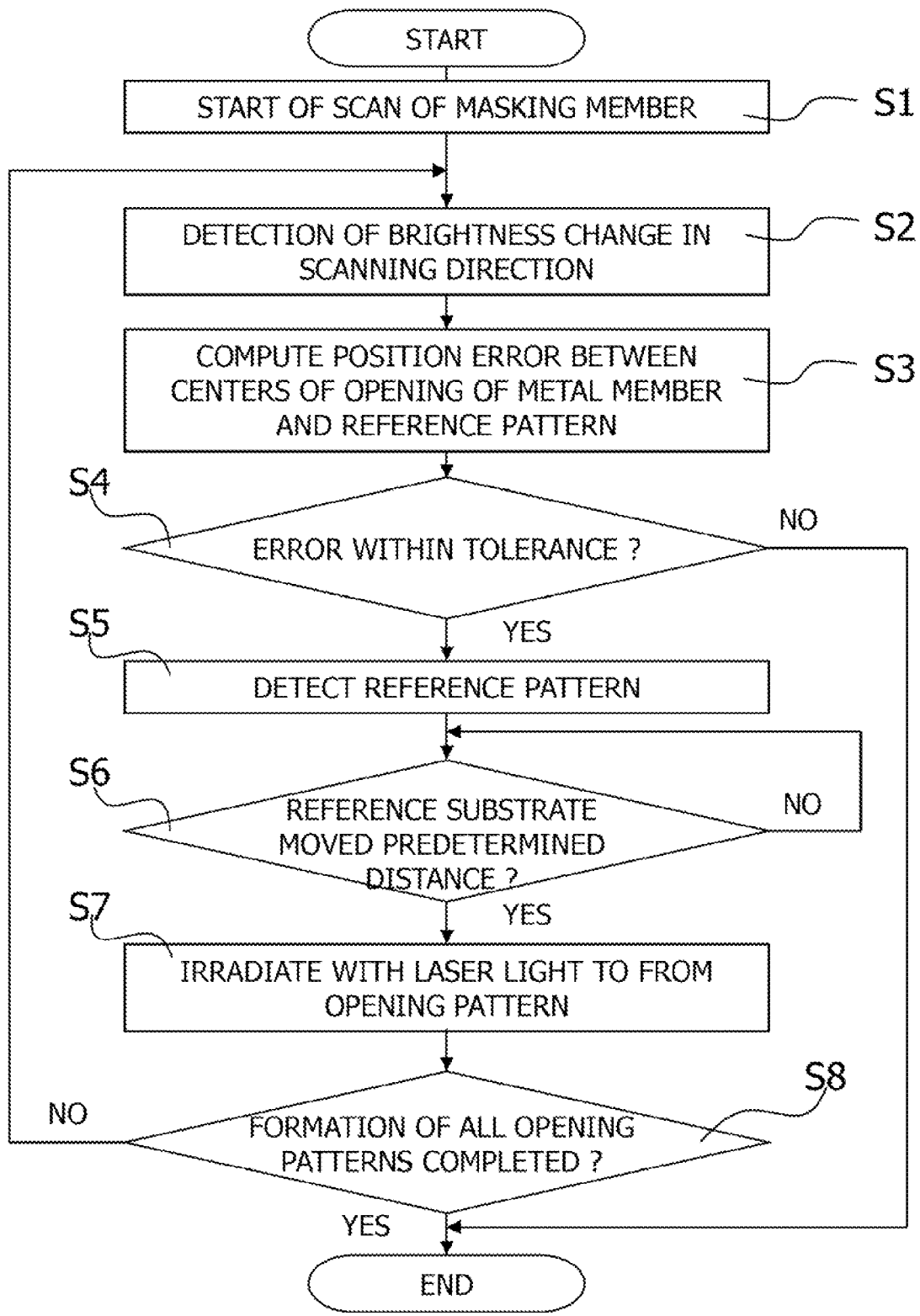
FIG. 28 is a flowchart illustrating the abovementioned laser processing.

Now, formation of the opening pattern 6 by using the above laser processing apparatus will be described with reference to the flowchart of FIG. 28.

First, in step S1, the reference substrate 38 and the masking member 11, that is aligned and brought into contact with a surface of the reference substrate 38 opposite from a surface on which the reference pattern 43 is formed, are integrally placed on a stage so that the reference pattern 43 side faces down, edge portions of the masking member 11 and the reference substrate 38 are retained by a scanning mechanism, not illustrated, and their scan in the direction of an arrow X in FIG. 9 is started with a predetermined speed.

In step S2, images of the masking member 11 and the reference substrate 38 are captured by the image-capturing device 17, and the captured images are processed by an image-processing unit of the control device 19 to detect brightness change from dark to bright and brightness change from bright to dark in the arrow X direction (refer to FIGS. 27A and 27B).

In step S3, a computing unit of the control device 19 counts the number of drive pulses of the stepping motor in the scanning mechanism in a duration time from detection of a brightness change from dark to bright to a next brightness change from dark to bright, and the number of drive pulses of the stepping motor in a duration time from detection of a brightness change from bright to dark to a next brightness change from bright to dark; and based on these counted numbers, a distance D1 between adjacent brightness change portions from dark to bright and a distance D2 between adjacent brightness change portions from bright to dark, are computed. Then, |D1−D2| is computed to compute a position error amount between the center of the opening 9 of the metal member 10 and the center of the reference pattern 43 is computed.

In step S4, the computing unit compares the position error amount with a tolerance retrieved from a memory, and determines whether or not the position error amount is within the tolerable range. Here, if the position error amount is within the tolerable range ("YES"), the process proceeds to step S5. On the other hand, if the position error amount is not within the tolerable range ("NO"), it is determined that there is an alignment error between the metal member 10 and the reference substrate 38, or there is a poor forming accuracy of the opening 9 of the metal member 10, and the laser processing is terminated. Then, the scanning mechanism is moved at high speed to transfer the masking member 11 and the reference substrate 38.

In step S5, based on a detection of an odd numbered brightness change from bright to dark, the image processing unit detects a front side edge portion of the reference pattern 43 in the scanning direction.

In step S6, when the reference pattern 43 is detected in step S5, the computing unit counts the number of drive pulses of a stepping motor of the scanning mechanism based on the detection time of the reference pattern 43. Then, the counted pulse number is compared with its target value retrieved from a memory, and it is determined whether or not the counted pulse number has agreed with the target value, that is, whether or not the masking member 11 and the reference substrate 38 have integrally moved a predetermined distance. Here, if the counted pulse number is compared with the target value thereof ("YES"), the process proceeds to step S7. Here, the time at which the counted pulse number becomes the target value is a time at which the reference pattern 43 of the reference substrate 38 reaches an irradiation position with laser light L by the laser optical unit 16.

In step S7, the control device 19 outputs an oscillation command to the excimer laser 21, and the excimer laser 21 performs pulse oscillation. Accordingly, a portion of the film 4 on the reference pattern 43 of the reference substrate 38 is irradiated with laser light L, the portion of the film 4 is abraded to form the penetrating opening pattern 6 having the same shape and dimension as those of the reference pattern 43 (or thin film pattern). Here, the formation of the opening pattern 6 may be performed by irradiating with a plurality of shots of laser light L emitted from the excimer laser 21 in a predetermined time period.

Subsequently, the process proceeds to step S8, and it is determined whether or not all of the opening patterns 6 corresponding to the reference pattern 43 are formed. Here, if all of the opening patterns 6 corresponding to the reference pattern 43 are not formed ("NO"), the process returns to step S2, and steps S2 to S8 are repeated until all of the opening patterns 6 are formed ("YES") in step S8.

Here, in step S7, formation of opening patterns 6 corresponding to second and subsequent reference patterns 43 from the downstream side of the reference substrate 38 in the scanning direction, may be performed in the following manner. That is, the computing unit may count the number of drive pulses of the abovementioned stepping motor, compute a moving distance of the scanning mechanism based on the counted number, and compare the moving distance with an arrangement pitch of the reference patterns 43 retrieved from a memory, and the excimer laser 21 may be oscillated each time when they agree with each other.

Furthermore, in the above, explanation has been made in such a manner that steps S3 to S6 are performed in series, but actually steps S3 to S4, and S5 to S6 are performed in parallel.

The abovementioned opening pattern 6 is not necessarily formed by laser processing but it may be formed by etching.

Hereinafter, explanation will be made with respect to a case in which the opening pattern 6 is formed by etching. Here, explanation will be made with respect to a case in which the opening pattern 6 is formed in a masking member formed according to, for example, the process illustrated in FIGS. 22A to 22H.

First, as illustrated in FIG. 29A, both surfaces of the masking member 11 are dip-coated, for example, with a positive photoresist 53 and the like.

Next, as illustrated in FIG. 29B, in a state in which the photomask 54 having an opening provided so as to correspond to the opening pattern 6 to be formed, is placed so as to face in proximity with a second surface 4b of the film 4 opposite from a first surface 4a on which the metal member 10 closely in contact, the second photomask 54 is aligned and positioned to the masking member 11 using an alignment mark, not illustrated, provided on the photomask 54 and the mask-side alignment mark 40 provided on the metal member 10, and the photoresist 53 coating the second surface 4b of the film 4 is exposed to light and developed. Consequently, as illustrated in FIG. 29C, in a portion of the photoresist 53 corresponding to the opening 9, there is formed an opening 59 which is arranged in parallel at the same arrangement pitch as that of a thin film pattern to be vapor-deposited and which has the same shape and dimension as those of the thin film pattern, and thus, a resist mask 60 is formed.

Furthermore, the masking member 11 is immersed in a tank filled with, for example, an etching solution for polyimide, to etch the film 4 made of polyimide by using the resist mask 60. Furthermore, as illustrated in FIG. 29D, the opening pattern 6 is formed. In this case, by setting conditions such as coating conditions with the photoresist 53, exposure conditions, developing conditions and etching conditions appropriately based on the result of experiment, it is possible to form the opening pattern 6 into a tapered shape having a taper angle of about from 55 to 60 degrees. Furthermore, since the etching of the film 4 is performed from the second surface 4b side of the film 4, by an effect of side etching, the opening pattern 6 has an opening area narrowing from the second surface 4b toward the first surface 4a. Then, the area of the opening pattern 6 at the first surface 4a becomes equal to the area of the thin film pattern to be formed.

Finally, by washing away the photoresist 53 coating both surfaces of the masking member 11, with an organic solvent, the producing of the deposition mask illustrated in FIGS. 13A and 13B or FIG. 14 is completed. Here, instead of the photoresist 53, a dry film resist may be employed.

Here, the etching step illustrated in FIG. 29D is preferably performed in a state in which the metal member 10 is magnetically attracted to a magnetic chuck so that the metal member 10 side of the masking member faces to the chuck.

The produced deposition mask 14 is used in vapor deposition in the following manner. Referring to FIGS. 30A to 30C, and 31A to 31C, explanation will be made with respect to a case in which an organic EL layer is formed as the thin film pattern by vapor deposition. Here, as an example, explanation will be made with respect to a case in which an R organic EL layer is formed.

Figure 30A:
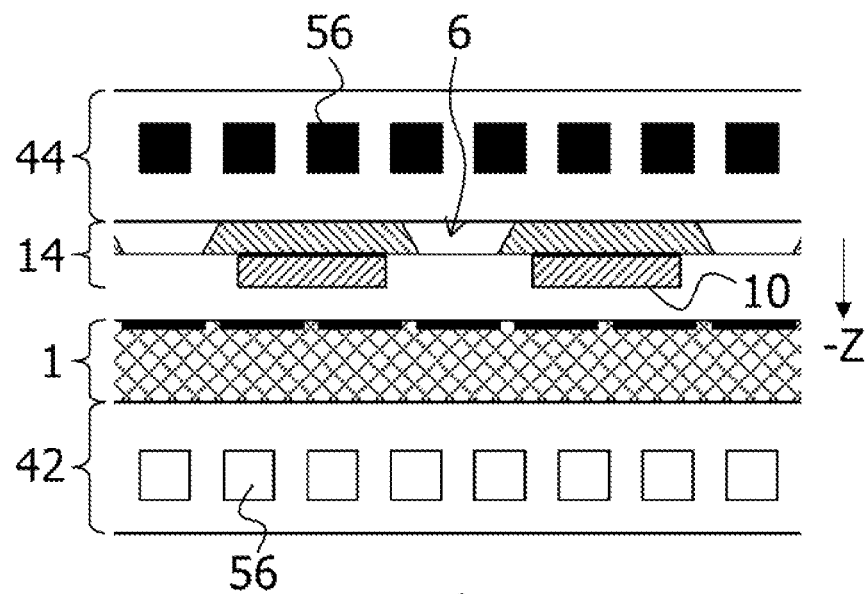
FIGS. 30A to 30C are a view illustrating a method for forming a thin film pattern by using the deposition mask produced the method illustrated in FIGS. 29A to 29D, in which are cross-sectional views illustrating a first half process of the method.

First, as illustrated in FIG. 30A, above a TFT substrate 1 placed on the first magnetic chuck 42, the deposition mask 14 attracted and retained by the second magnetic chuck 44 is positioned. In this case, the deposition mask 14 is positioned so that its metal member 10 is on the TFT substrate 1 side.

Then, while the mask-side alignment mark 40 of the deposition mask 14 and a substrate-side alignment mark, not illustrated, provided on the TFT substrate 1 in advance, are observed by a camera, not illustrated, the first and second magnetic chucks 42, 44 are relatively moved so that both of the marks come into a predetermined positional relationship, such as a relationship that the centers of these marks agree with each other, to thereby align the deposition mask 14 to the TFT substrate 1.

Figure 30B:
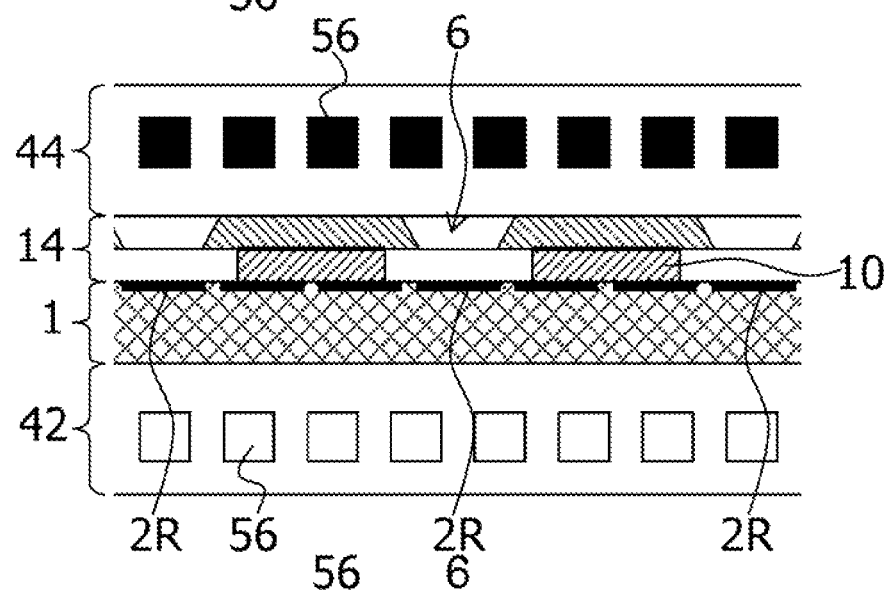

When the alignment between the deposition mask 14 and the TFT substrate 1 is completed, the second magnetic chuck 44 is moved down vertically in an arrow −Z direction illustrated in FIG. 30A relatively to the first magnetic chuck 42, to bring the metal member 10 of the deposition mask 14 into close contact with the TFT substrate 1 as illustrated in FIG. 30B. Thus, each opening pattern 6 of the deposition mask 14 is positioned on an anode electrode 2R for R on the TFT substrate 1.

Figure 30C:
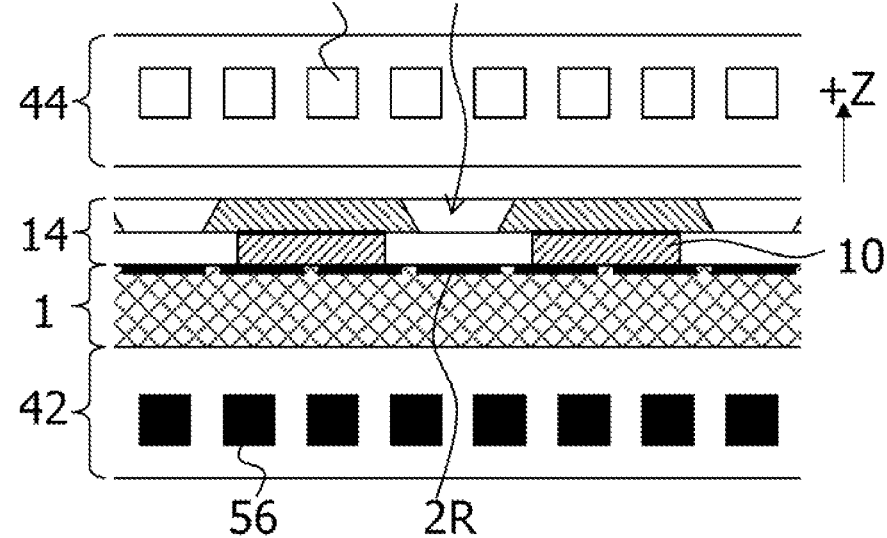

Subsequently, as illustrated in FIG. 30C, the first magnetic chuck 42 is turned on and the second magnetic chuck 44 is turned off to magnetically attract the metal member 10 of the deposition mask 14 to the first magnetic chuck 42, to transfer the deposition mask 14 on to the TFT substrate 1. Thereafter, the second magnetic chuck 44 is moved up in the arrow +Z direction illustrated in FIG. 30C to be removed.

Next, the deposition mask 14, the TFT substrate 1 and the second magnetic chuck 44, are integrally disposed at a predetermined position in the vacuum chamber of the vacuum vapor deposition apparatus in a state in which the deposition mask 14 is on the lower side and faces to a vapor deposition source. Then, as illustrated in FIG. 31A, vacuum vapor deposition is performed under predetermined vapor deposition conditions to form an R organic EL layer 3R on an anode electrode 2R for R on the TFT substrate 1.

In this case, since the opening pattern 6 of the deposition mask 14 is formed in a shape spreading from the first surface 4a toward the second surface 4b of the film 4, and there is no member causing a shadow of vapor deposition on a surface of the film 4 to which vapor deposition material molecules arrives, the R organic EL layer 3R deposited on the TFT substrate through the opening pattern 6 has a uniform film thickness.

Figure 32A:
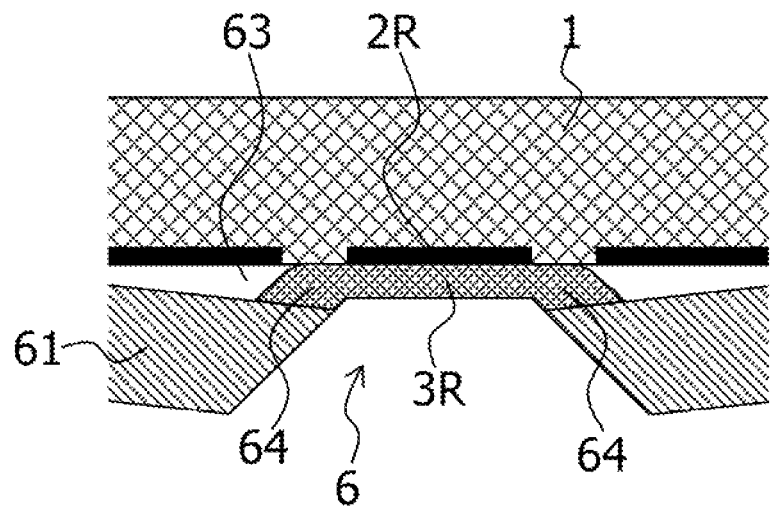
Figure 32B:
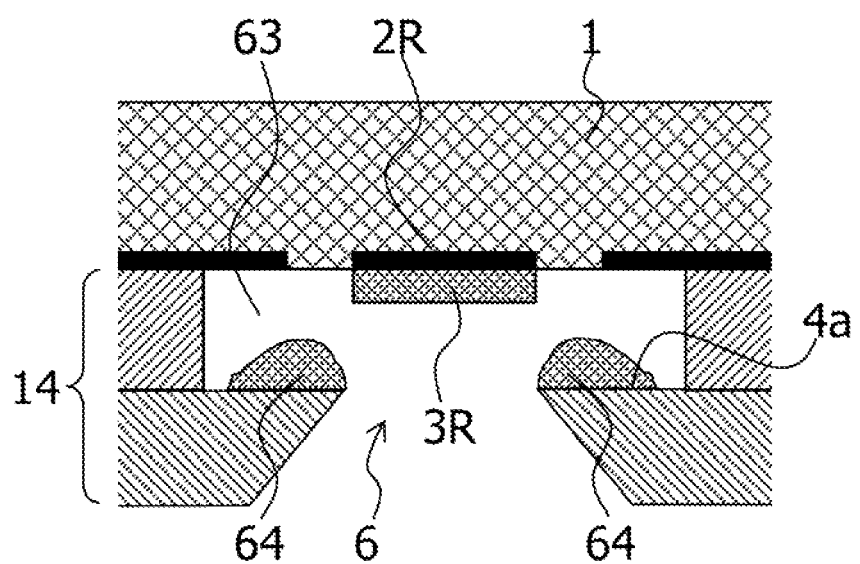

Furthermore, the deposition mask 14 of the present invention has the following advantages as compared with conventional metal masks. That is, as illustrated in FIG. 32A, in a case of a conventional metal mask 61, a vapor deposition material enters and adheres to a gap 63 between the metal mask 61 and the TFT substrate 1, to form deposition 64. Then, due to this deposition 64, an edge portion of the opening pattern 6 of the metal mask 61 is lifted and the metal mask is warped into a wave form, thus preventing formation of a fine thin film pattern (such as R organic pattern 3R) with high accuracy in some cases. However, in the case of the deposition mask 14 of the present invention, since a large gap 63 of e.g. about 30 μm, that equals to the thickness of the metal member 10, is present between the film 4 and the TFT substrate 1, and the metal member 10 is recessed outwardly from the edge portion of the opening pattern 6 at the first surface 4a, as illustrated in FIG. 32B, even if the vapor deposition material enters and adheres to the edge portion of the opening pattern 6 of the film 4 at the first surface 4a, there is no possibility that the edge portion of the opening pattern 6 is lifted by a deposition 64 of the vapor deposition material. Furthermore, since there is no possibility that the entered vapor deposition material enters and adheres to a gap between the metal member 10 and the TFT substrate 1, the deposition mask may not be warped into a wave form. Accordingly, according to the deposition mask 14 of the present invention, it is possible to form a fine thin film pattern (R organic EL layer 3R) with high accuracy.

In the above, explanation has been made with respect to the deposition mask 14 including the metal member 10 that has the opening 9 having a shape and dimension greater than those of the opening pattern 6, and is brought into close contact with one surface 4a of the film 4. However, the present invention is not limited thereto, and it may be one having a metal member 10 consisting of a plurality of thin pieces provided on one surface 4a or inside of the film 4 so as to be distributed outside the opening pattern 6. Hereinafter, explanation will be made with respect to a case in which the metal member 10 consists of thin pieces.

Figure 33A:
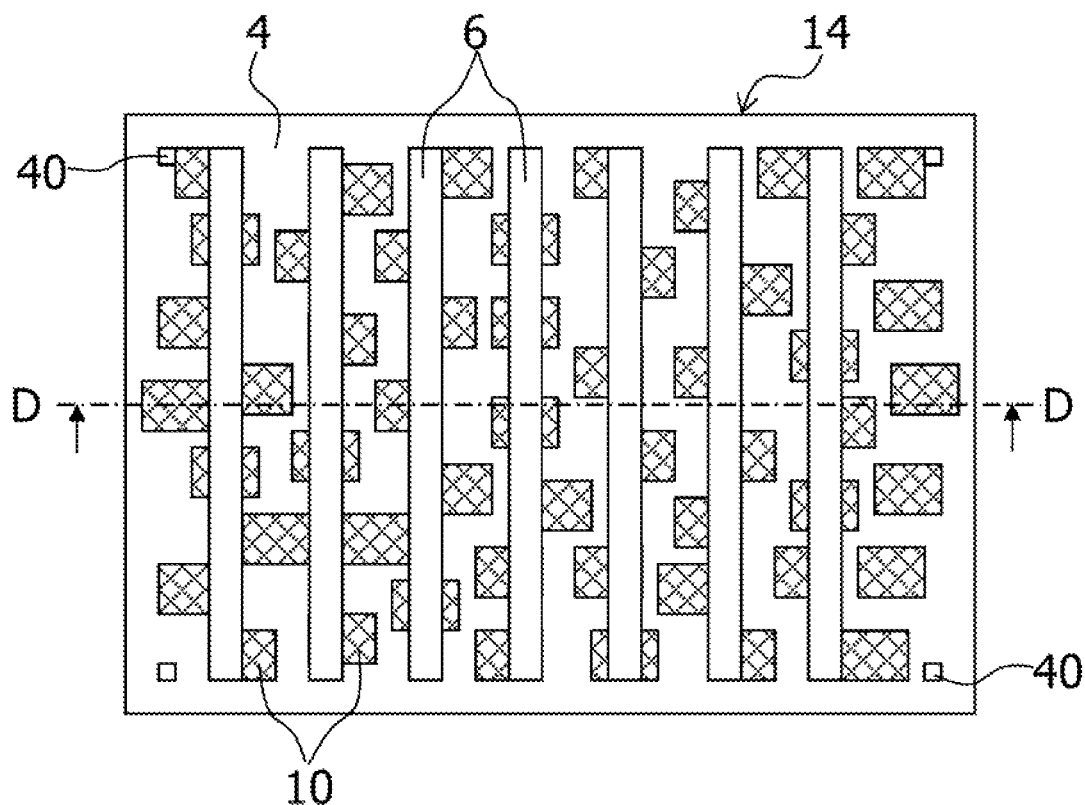
Figure 33B:
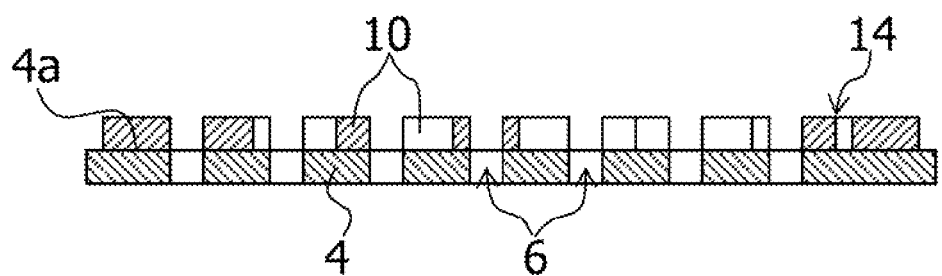

FIGS. 33A and 33B are views illustrating still another modified example of a deposition mask of the present invention, in which FIG. 33A is a plan view and FIG. 33B is a cross-sectional view of a D-D section in FIG. 33A. This third embodiment has a construction including a film 4 made of a resin such as polyimide or polyethylene terephthalate having a thickness of e.g. about from 10 μm to 30 μm, that has a plurality of opening patterns 6 formed in parallel at the same arrangement pitch as the arrangement pitch of a stripe-shaped thin film pattern to be formed, and that has the same shape and dimension as those of the thin film pattern; and a metal member 10 consisting of a plurality of thin pieces provided on one surface 4a or inside of the film 4 outside the plurality of opening patterns 6. Hereinafter, explanation will be made with respect to a case where the metal member 10 consists of a plurality of thin pieces each made of a magnetic material having a thickness of from 10 μm to 30 μm and the metal member 10 is provided so as to be brought into close contact with one surface 4a of the film 4.

Figure 34A:
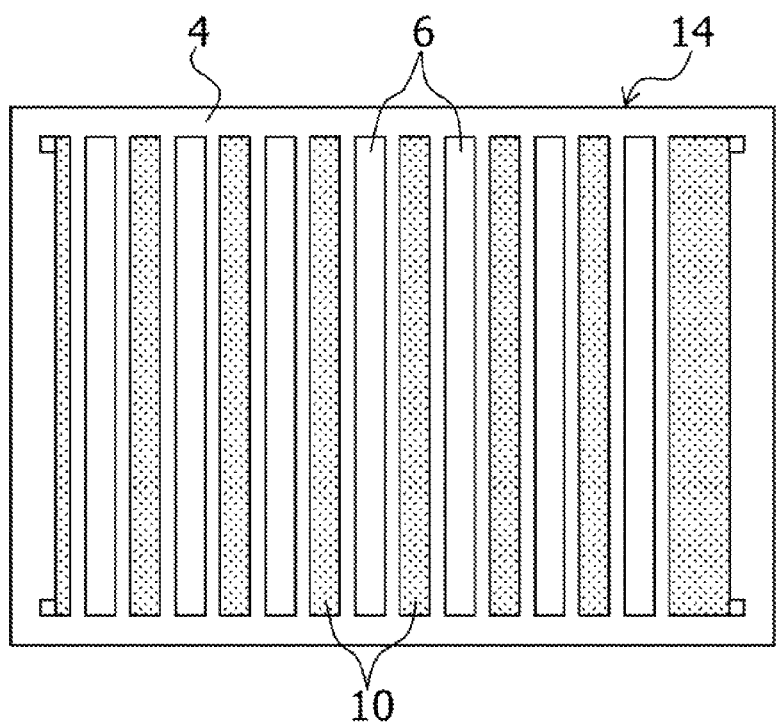
Figure 34B:
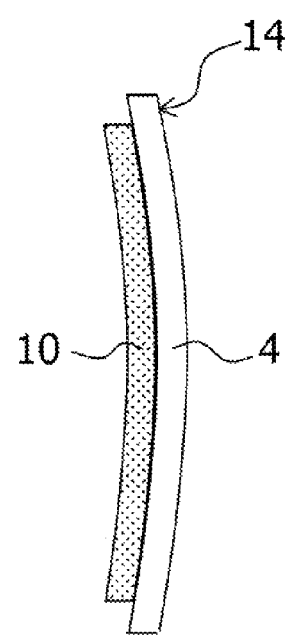

In this case, as illustrated in FIG. 34A, the metal member 10 may be one having a striped pattern of which the longitudinal axis agrees with a longitudinal axis of an outside portion that is parallel to the longitudinal axis of the opening pattern 6 of the film 4. However, if such a stripe-shaped metal member 10 is formed on the film 4 by plating, due to the difference between the film 4 and the metal member 10 in the thermal expansion coefficient, as illustrated in FIG. 34B, a warp occurs at the deposition mask in some cases, which may deteriorate its adhesion to the substrate.

To cope with this problem, in the third embodiment of the deposition mask of the present invention, as described above, the metal member 10 consisting of a plurality of thin pieces is provided on one surface 4a of the film 4 so as to be distributed outside the opening pattern 6. In this construction, the difference amount between the film 4 and the metal member 10 in the thermal expansion coefficient, is reduced and a warp of the deposition mask 14 is suppressed.

Next, a process for producing the deposition mask of FIGS. 33A to 33B will be described.

First, as illustrated in FIG. 35A, for example, in a state in which a film 4 of e.g. polyimide having a thickness of about 15 μm that transmits visible light and that is e.g. electrostatically attracted and retained on a stage, not illustrated, having a flat surface, one surface 4a is coated with an underlayer 52, that is a metal layer of a magnetic material such as nickel (Ni) having a thickness of about 50 nm, by a known deposition technique such as sputtering as illustrated in FIG. 35B. In this case, the underlayer 52 is not limited to a magnetic material and it may be a non-magnetic material having high electric conductivity.

Next, as illustrated in FIG. 35C, on the underlayer 52, a resist 53 (photosensitive material) having a thickness of about 15 μm is applied by e.g. spin-coating.

Next, as illustrated in FIG. 35D, the resist 53 is exposed to light by using a photomask 54, and developed as illustrated in FIG. 35E to form a plurality of openings 59 that are randomly arranged and penetrate through the film of the resist 53 to reach the underlayer 52. In this case, when the resist 53 is of a positive type, the photomask 54 is one blocking light in portions corresponding to the plurality of openings 59, and when the resist 53 is of a negative type, the photomask 54 is one having openings in portions corresponding to the plurality of openings 59.

Subsequently, as illustrated in FIG. 35F, a thin film of a metal member 10 of e.g. nickel (Ni) is plated to have a thickness of about 15 μm in the openings 59.

Figure 36A:
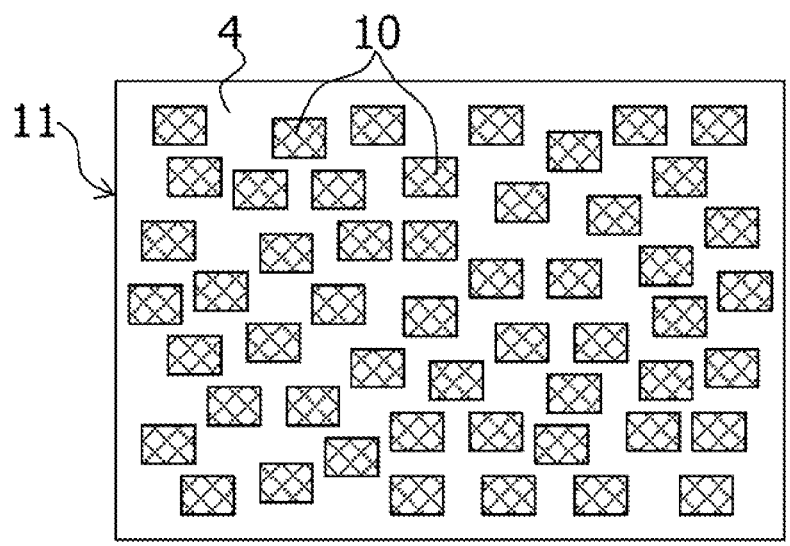
FIGS. 36A to 36C are views illustrating the method for producing the deposition mask of 33A to 33B, which are plan views illustrating a process for forming an opening pattern.

Furthermore, as illustrated in FIG. 35G, the resist 53 is removed, and thereafter, as illustrated in FIG. 35H, the underlayer 52 around the metal member 10 is removed by etching. Thus, as illustrated in FIG. 36A, a masking member 11 is formed, in which a metal member 10 consisting of a plurality of randomly distributed film pieces is formed on one surface of the film 4.

Figure 36B:
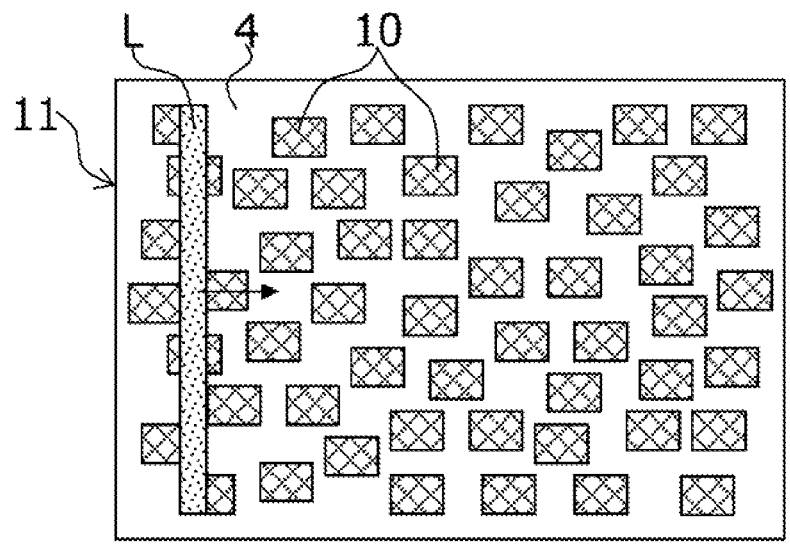
Figure 36C:
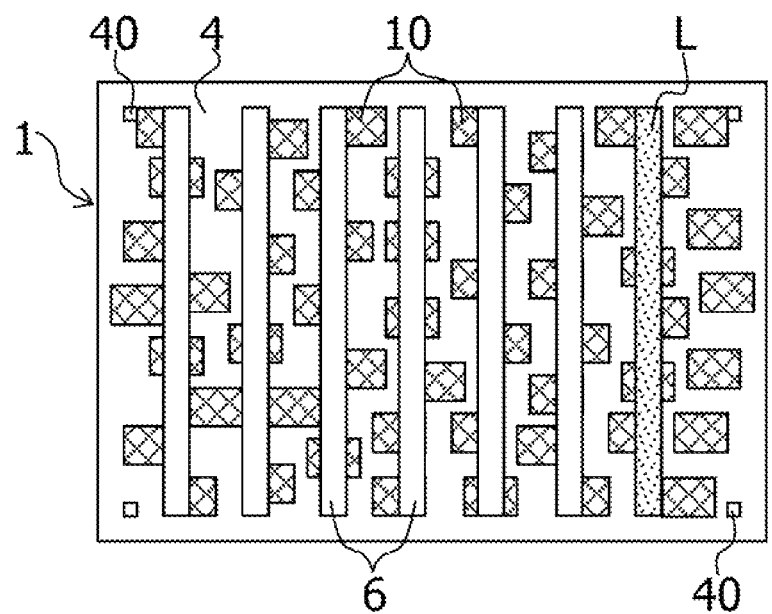

Thereafter, in a state in which the film 4 of the masking member 11 is brought into close contact on the reference substrate 38, for example, a portion of the film 4 corresponding to the reference pattern 43 of the reference substrate 38 is irradiated with laser light L as illustrated in FIG. 36B to form the opening pattern 6 in the film 4. Further, as illustrated in FIG. 36C, while laser light L is moved in a step movement in the arrow direction in FIG. 36C relatively to the masking member 11 by a distance equal to the arrangement pitch of the reference patterns 43 in the direction, processing of the film 4 is conducted to form a plurality of opening patterns 6. Thus, the producing of the deposition mask illustrated in FIGS. 33A and 33B is completed. In this case, it is preferred to use the laser processing apparatus illustrated in FIG. 9 to form the opening pattern 6 by laser processing.

In FIGS. 33A to 33B, since the masking member 11 is formed, in which the metal member 10 consisting of a plurality of randomly distributed film pieces is formed on one surface of the film 4, it is possible to use the masking member 14 commonly to various deposition masks different in arrangement pitch or shape of the opening pattern 6.

Accordingly, it is possible to reduce production cost of the deposition mask 14.

Figure 37:
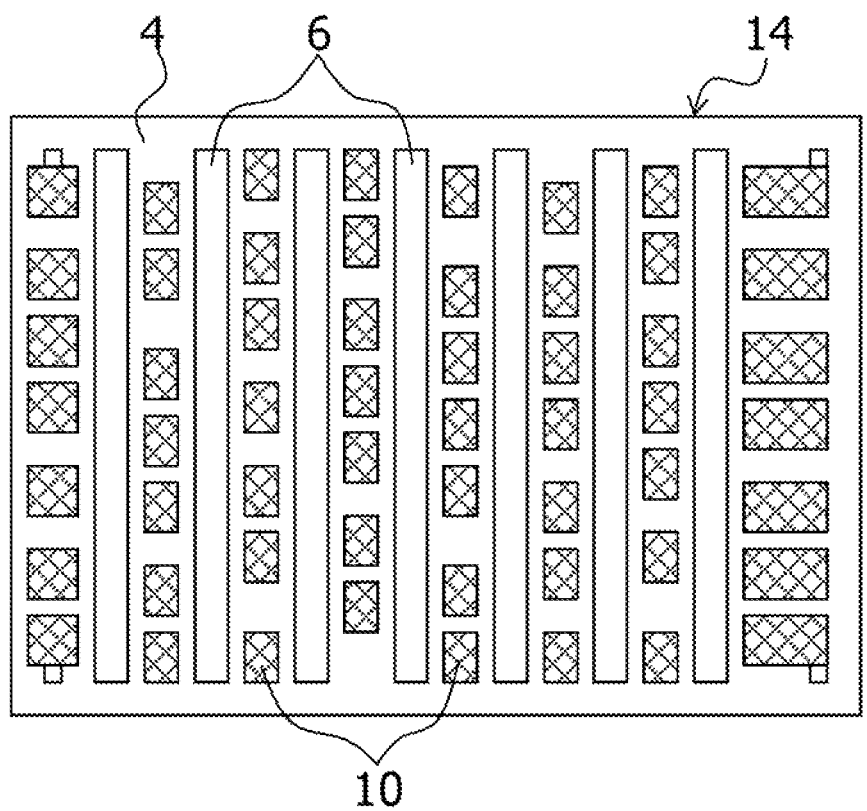
FIG. 37 is a plan view illustrating still another modified example of the deposition mask.

Here, in FIGS. 33A to 33B, explanation has been made with respect to a case in which the metal member 10 consisting of a plurality of randomly distributed film pieces is formed on one surface of the film 4. However, the present invention is not limited thereto, and as illustrated in FIG. 37, the plurality of metal members 10 may be arranged in parallel to the longitudinal axis of the stripe-shaped opening pattern 6 of the film 4 in an outside portion parallel to the longitudinal axis. In this case, the plurality of metal members 10 may be arranged at a predetermined arrangement pitch. In such a construction, it is possible to increase attraction force to the first magnetic chuck 42 to further improve close contact between the film 4 and the substrate 1. Here, in this case, the masking member 11 to be formed is dedicated for a specific deposition mask.

Next, explanation will be made with respect to a process for producing an organic EL display device by forming an R (red) organic EL layer, a G (green) organic EL layer and a B (blue) organic EL layer as a plurality of types of thin film patterns having a predetermined shape on the TFT substrate 1 by using the deposition mask 14 produced by the present invention.

Figure 38A:
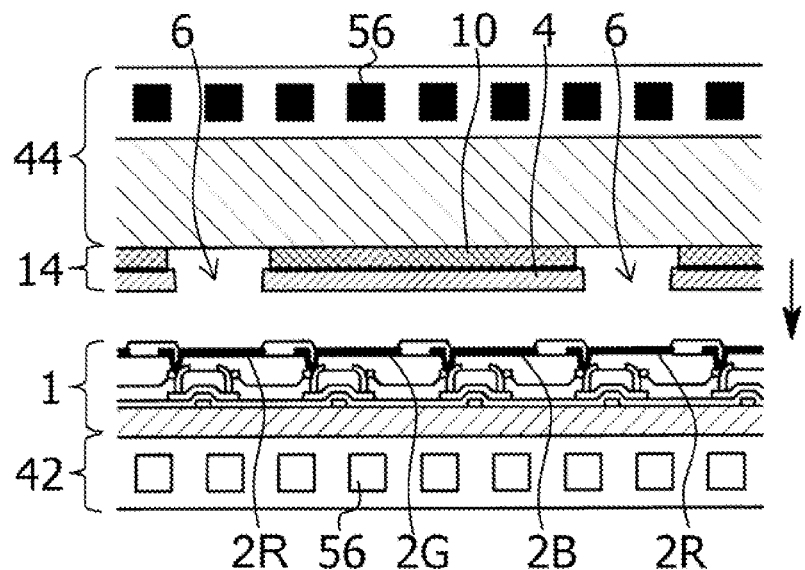
FIGS. 38A to 38C are views illustrating a method for forming a plurality of sorts of thin film patterns using the deposition mask produced by the present invention, which are cross-sectional views illustrating a first half process for forming a red organic EL layer in the method.
Figure 38B:
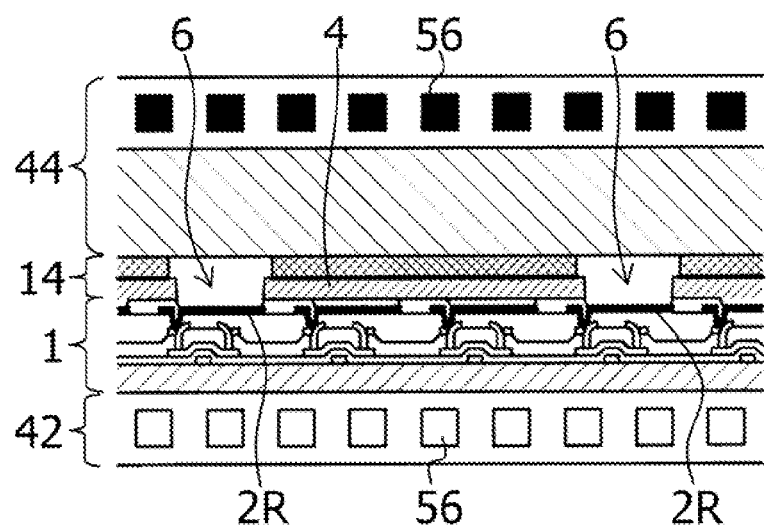

First, a case of forming an R organic EL layer 3R on the TFT substrate 1 will be described with reference to FIGS. 38A to 38C, and 39A to 39C. In this case, first, as illustrated in FIG. 38A, the deposition mask 14 attracted and retained by the second magnetic chuck 44 is positioned above the TFT substrate 1 placed on the first magnetic chuck 42, and as illustrated in FIG. 38B, while the mask-side alignment mark 40 and a substrate-side alignment mark for R are observed through a microscope, the deposition mask 14 is aligned to the TFT substrate 1 so that these marks have a predetermined positional relationship, and thereafter, the film 4 is brought into close contact with the TFT substrate 1. Accordingly, the opening pattern 6 of the deposition mask 14 is positioned on an anode electrode 2R for R of the TFT substrate 1.

Figure 38C:
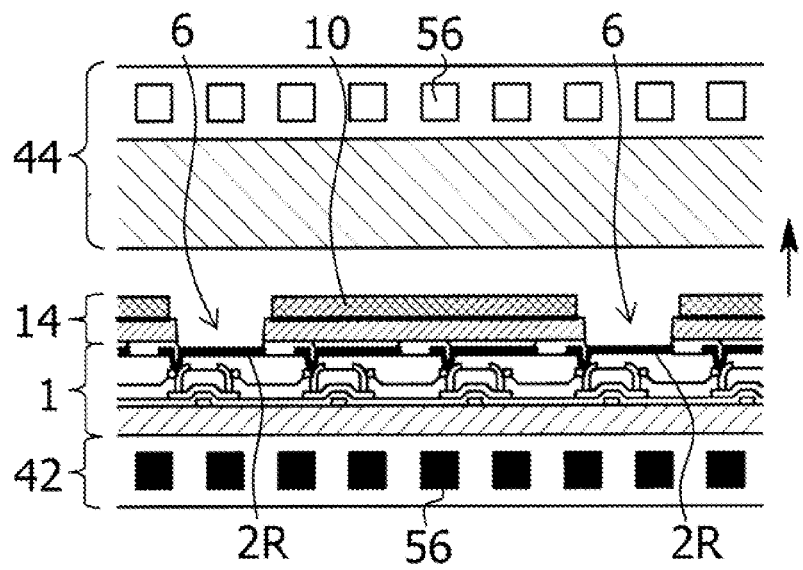

Thereafter, as illustrated in FIG. 38C, the electromagnet 56 of the first magnetic chuck 42 is turned on and the electromagnet 56 of the second magnetic chuck 44 is turned off so that the metal member 10 of the deposition mask 14 is attracted by the first magnetic chuck 42 to transfer the deposition mask 14 from the second magnetic chuck 44 on to the TFT substrate 1.

Figure 39A:
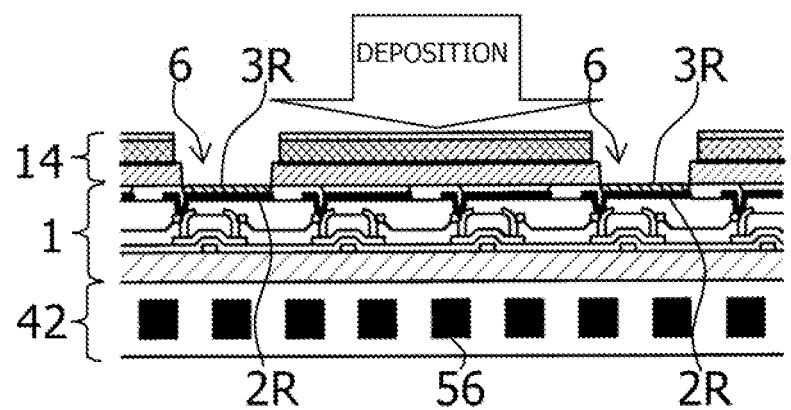
FIGS. 39A to 39C are cross-sectional views illustrating a second half process for forming the red organic EL layer.

Next, as illustrated in FIG. 39A, the substrate 1 and the deposition mask 14, that are integrally retained by the first magnetic chuck 42, are disposed in the vacuum chamber of the vacuum deposition apparatus, and vacuum deposition is performed through the opening pattern 6 of the deposition mask 14 to form an R organic EL layer 3R in a R organic El layer forming region on an anode electrode 2R for R on the TFT substrate 1.

Figure 39B:
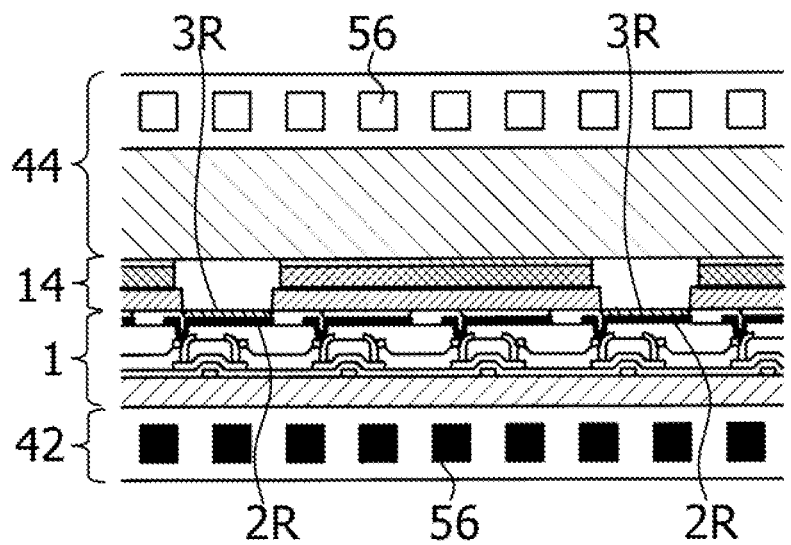
Figure 39C:
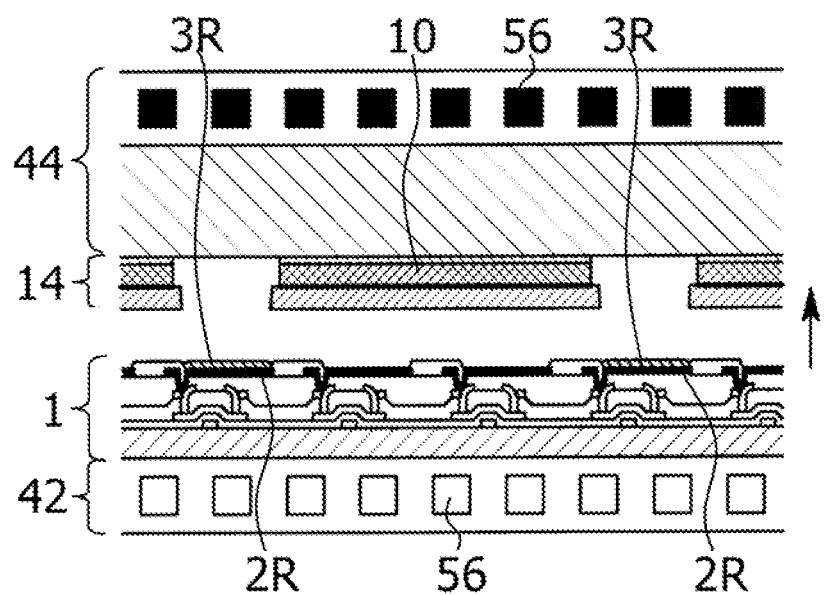

Subsequently, the first magnetic chuck 42 is taken out from the vacuum chamber, and as illustrated in FIG. 39B, the second magnetic chuck 44 is placed on the deposition mask 14, and as illustrated in FIG. 39C, the electromagnet 56 of the second magnetic chuck 44 is turned on and the electromagnet 56 of the first magnetic chuck 42 is turned off so as to attract the metal member 10 of the deposition mask 14 by the second magnetic chuck 44 to transfer the deposition mask 14 from the TFT substrate 1 side to the second magnetic chuck 44 side. Accordingly, an R organic EL layer 3R is formed on an anode electrode 2R for R on the TFT substrate 1.

Next, a case of forming a G organic EL layer on the TFT substrate 1 will be described with reference to FIGS. 40A to 40C, and 41A to 41C.

Figure 40A:
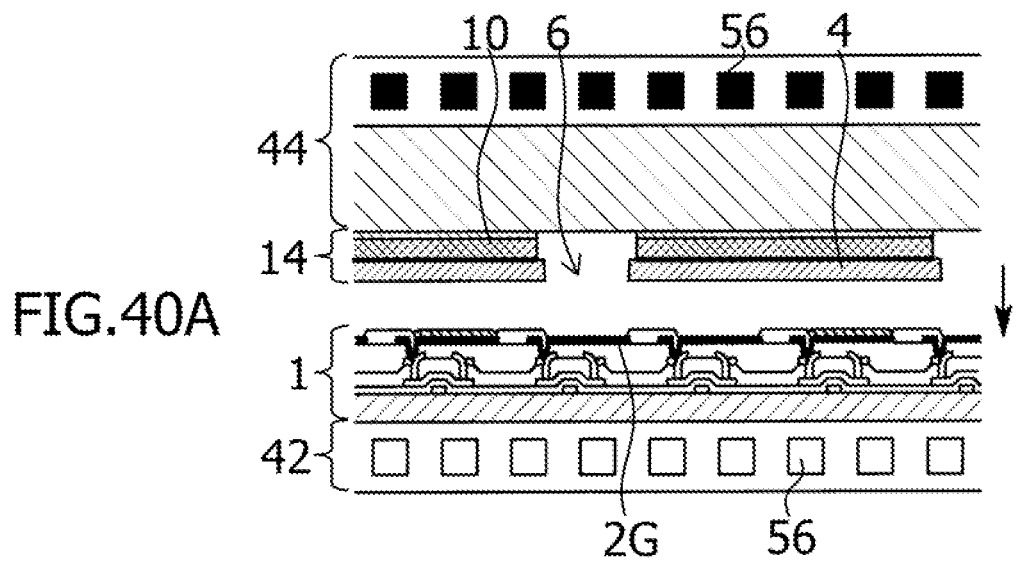
FIGS. 40A to 40C are cross-sectional views illustrating a first half process for forming a green organic EL layer of the plurality of sorts of thin film patterns.
Figure 40B:
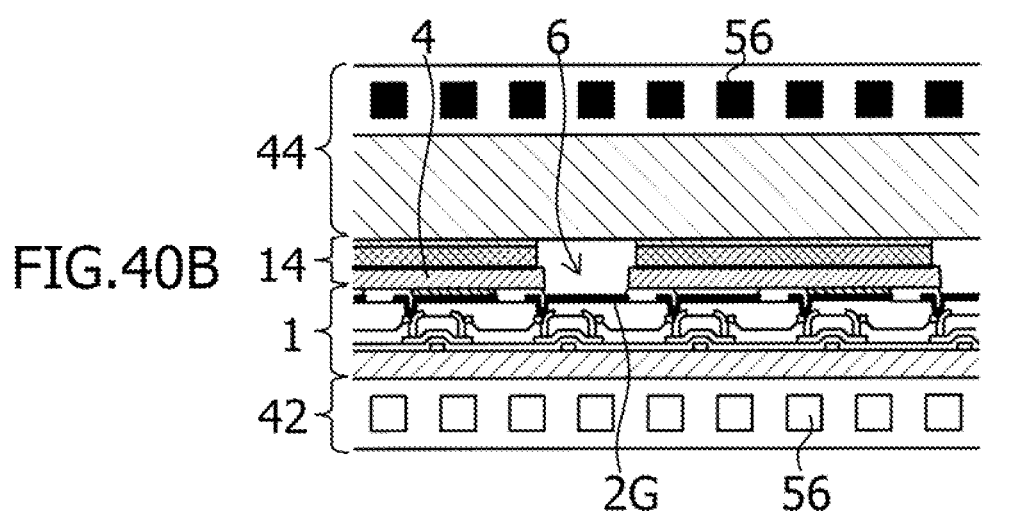

In this case, first, as illustrated in FIG. 40A, the deposition mask 14 attracted and retained by the second magnetic chuck 44 is positioned above the TFT substrate 1 placed on the first magnetic chuck 42, and as illustrated in FIG. 40B, while the mask-side alignment mark 40 and a substrate-side alignment mark for G are observed through a microscope, the deposition mask 14 is aligned to the TFT substrate 1 so that these marks have a predetermined positional relationship, and thereafter, the film 4 is brought into close contact on to the TFT substrate 1. Accordingly, the opening pattern 6 of the deposition mask 14 is positioned on an anode electrode 2G for G of the TFT substrate 1.

Figure 40C:
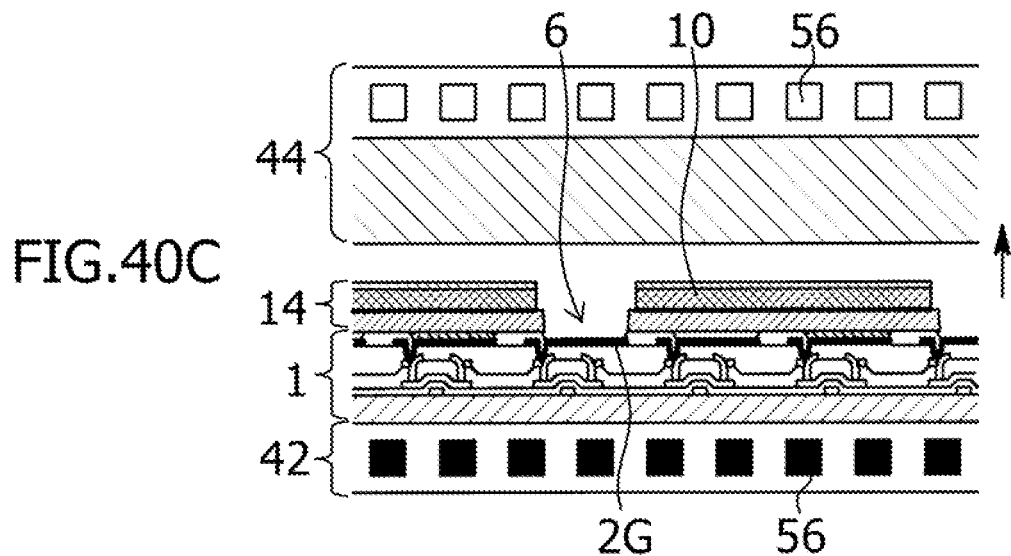

Thereafter, as illustrated in FIG. 40C, the electromagnet 56 of the first magnetic chuck 42 is turned on and the electromagnet 56 of the second magnetic chuck 44 is turned off so that the metal member 10 of the deposition mask 14 is attracted by the first magnetic chuck 42 to transfer the deposition mask 14 from the second magnetic chuck 44 on to the TFT substrate 1.

Figure 41A:
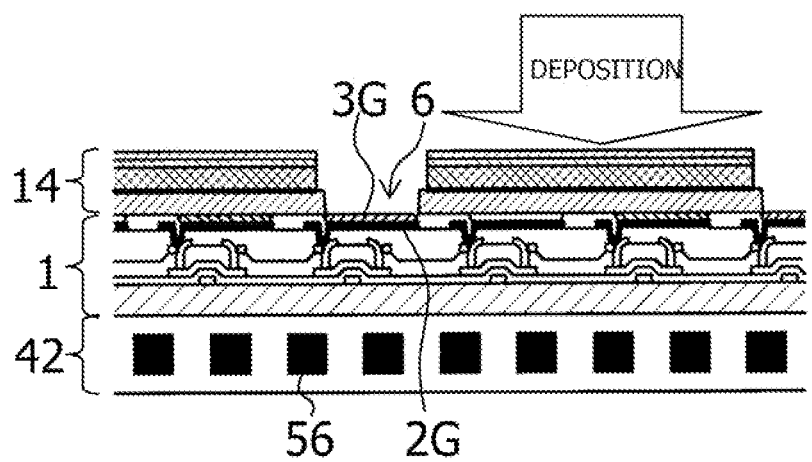
FIGS. 41A to 41C are cross-sectional views illustrating a second half process for forming the green organic EL layer.

Next, as illustrated in FIG. 41A, the substrate 1 and the deposition mask 14, that are integrally retained by the first magnetic chuck 42, are disposed in the vacuum chamber of the vacuum deposition apparatus, and vacuum deposition is performed through the opening pattern 6 of the deposition mask 14 to form a G organic EL layer 3G in a G organic EL layer forming region on an anode electrode 2G for G on the TFT substrate 1.

Figure 41B:
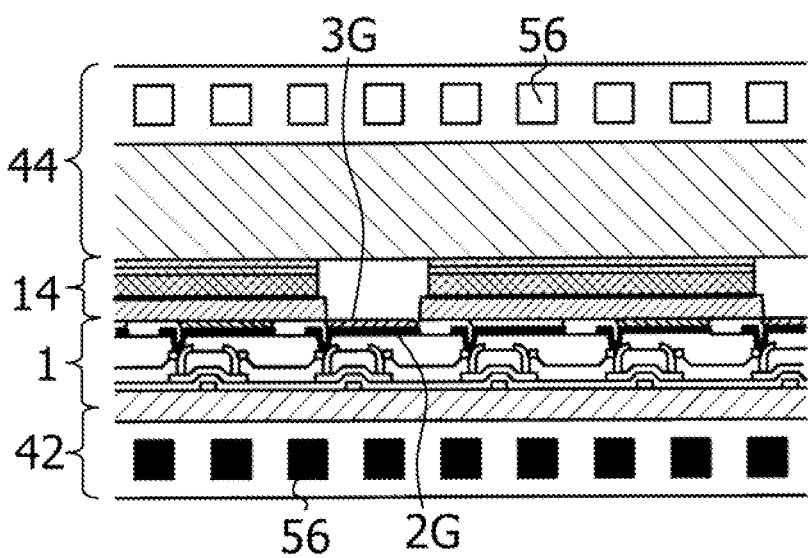
Figure 41C:
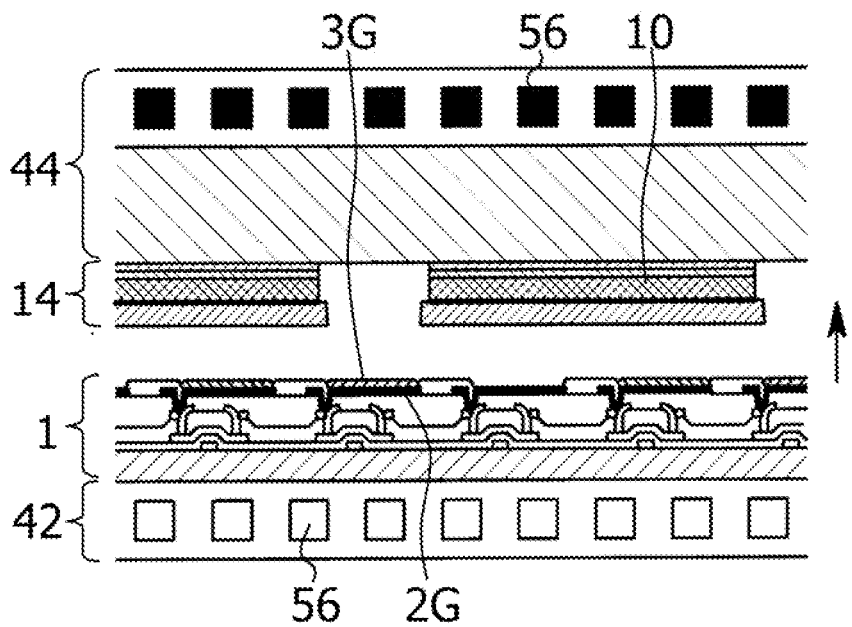

Subsequently, the first magnetic chuck 42 is taken out from the vacuum chamber, and as illustrated in FIG. 41B, the second magnetic chuck 44 is placed on the deposition mask 14, and as illustrated in FIG. 41C, an electromagnet 56 of the second magnetic chuck 44 is turned on and an electromagnet 56 of a first magnetic chuck 42 is turned off so as to attract the metal member 10 of the deposition mask 14 by the second magnetic chuck 44 to transfer the deposition mask 14 from the TFT substrate 1 side to the second magnetic chuck 44 side. By this method, a G organic EL layer 3G is formed on an anode electrode 2G for G on the TFT substrate 1.

Next, a case of forming a B organic EL layer on the TFT substrate 1 will be described with reference to FIGS. 42A to 42C and 43A to 43C.

Figure 42A:
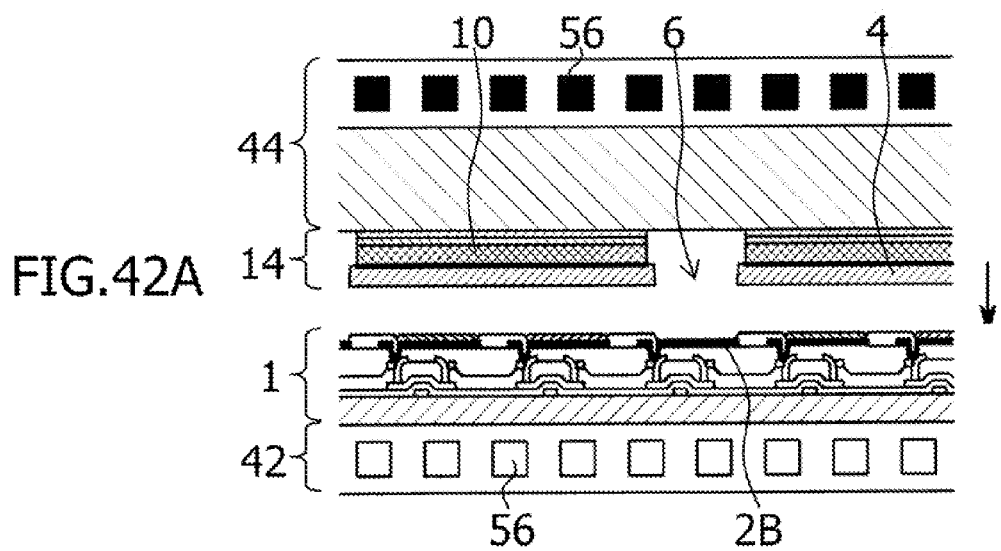
FIGS. 42A to 42C are cross-sectional views illustrating a first half process for forming a blue organic EL layer of the plurality of sorts of thin film patterns.
Figure 42B:
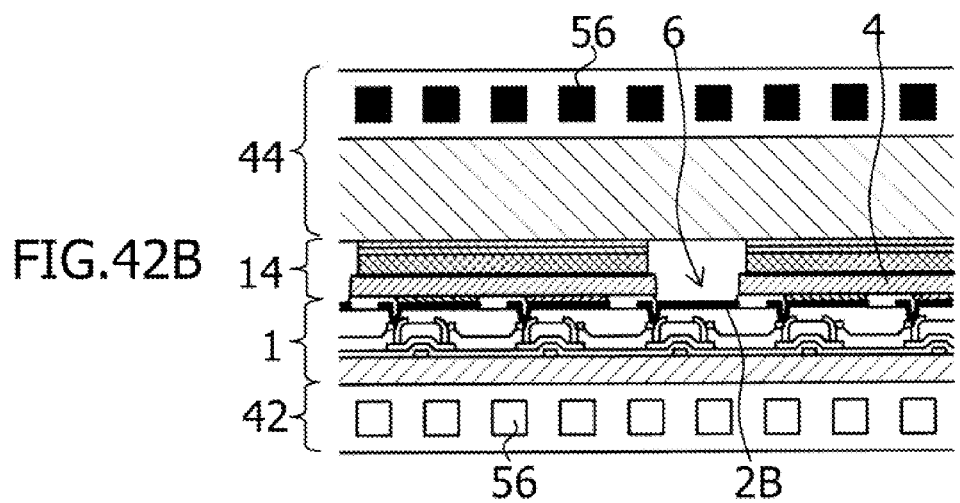

In this case, first, as illustrated in FIG. 42A, a deposition mask 14 attracted and retained by a second magnetic chuck 44 is positioned above the TFT substrate 1 placed on the first magnetic chuck 42, and as illustrated in FIG. 40B, while a mask-side alignment mark 40 and a substrate-side alignment mark for B are observed through a microscope, the deposition mask 14 is aligned to the TFT substrate 1 so that these marks have a predetermined positional relationship, and thereafter, the film 4 is brought into close contact on to the TFT substrate 1. By this method, the opening pattern 6 of the deposition mask 14 is positioned on an anode electrode 2B for B of the TFT substrate 1.

Figure 42C:
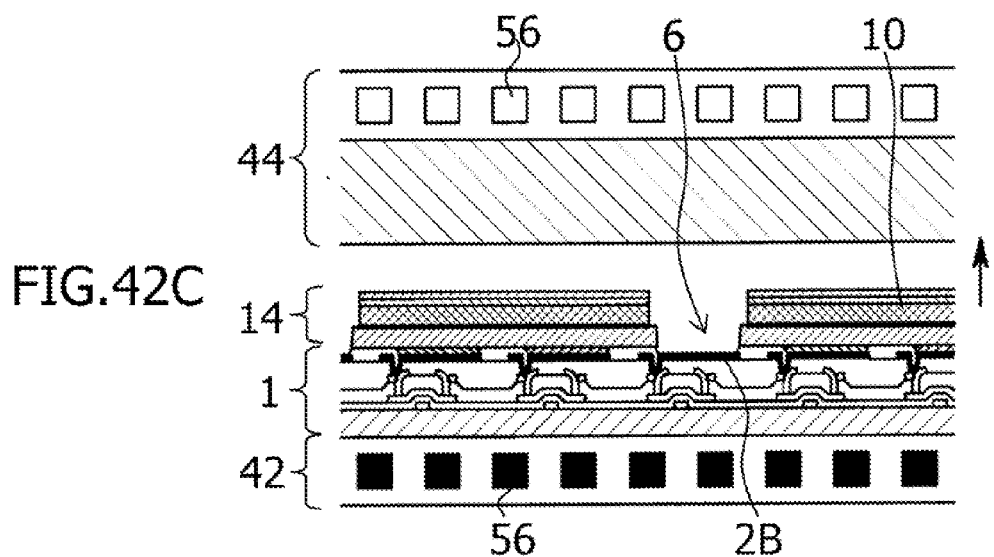

Thereafter, as illustrated in FIG. 42C, the electromagnet 56 of the first magnetic chuck 42 is turned on and the electromagnet 56 of the second magnetic chuck 44 is turned off so that the metal member 10 of the deposition mask 14 is attracted by the first magnetic chuck 42 to transfer the deposition mask 14 from the second magnetic chuck 44 on to the TFT substrate 1.

Figure 43A:
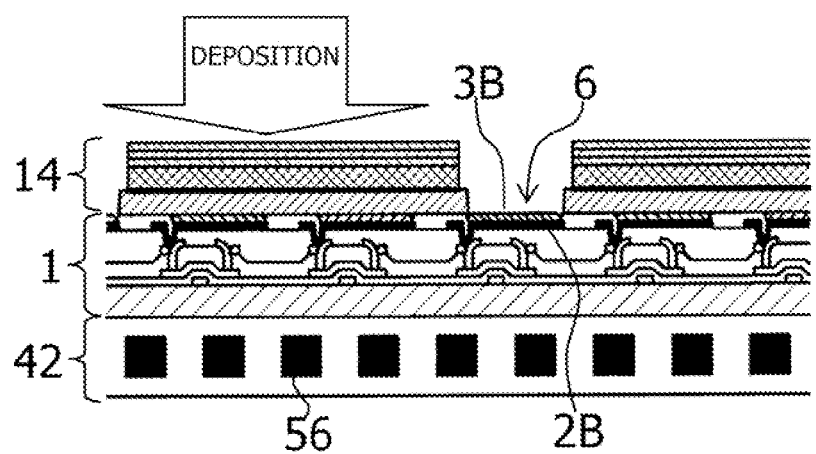
FIGS. 43A to 43C are cross-sectional diagrams illustrating a second half process for forming the blue organic EL layer.

Next, as illustrated in FIG. 43A, the substrate 1 and deposition mask 14, that are integrally retained by the first magnetic chuck 42, are disposed in the vacuum chamber of the vacuum deposition apparatus, and vacuum deposition is performed through the opening pattern 6 of the deposition mask 14 to form a B organic EL layer 3B in a B organic EL layer forming region on an anode electrode 2B for B on the TFT substrate 1.

Figure 43B:
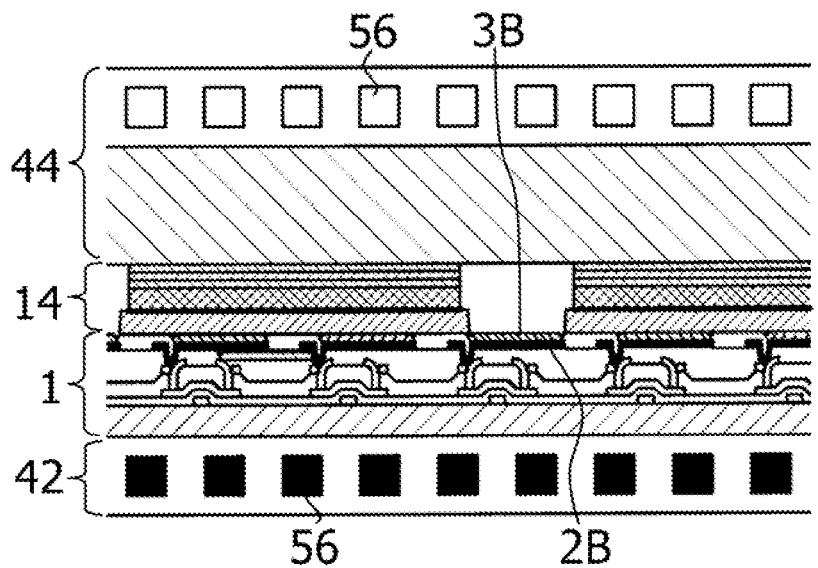
Figure 43C:
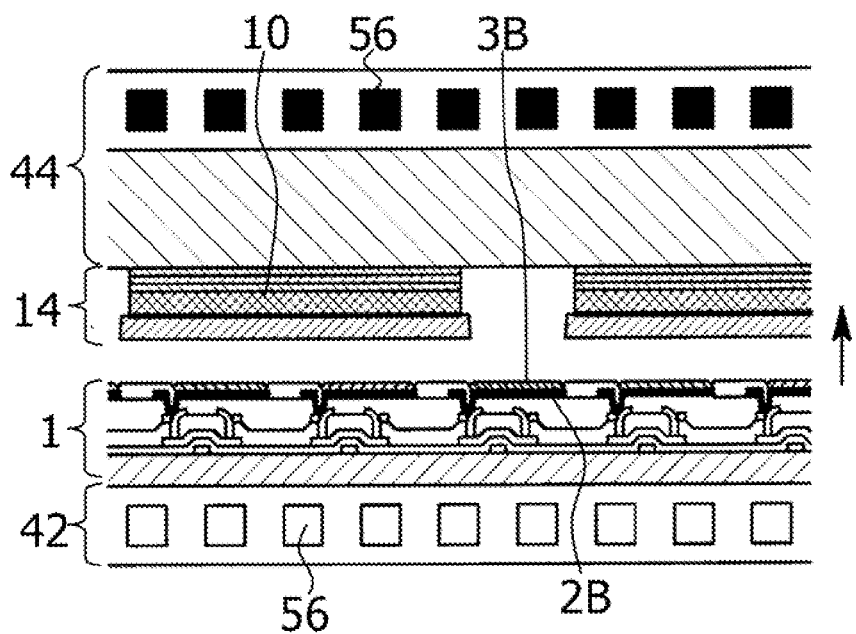

Subsequently, the first magnetic chuck 42 is taken out from the vacuum chamber, and as illustrated in FIG. 43B, the second magnetic chuck 44 is placed on the deposition mask 14, and as illustrated in FIG. 43C, the electromagnet 56 of the second magnetic chuck 44 is turned on and the electromagnet 56 of the first magnetic chuck 42 is turned off so as to attract the metal member 10 of the deposition mask 14 by the second magnetic chuck 44 to transfer the deposition mask 14 from the TFT substrate 1 side to the second magnetic chuck 44 side. Accordingly, a B organic EL layer 3B is formed on an anode electrode 2B for B on the TFT substrate 1.

Furthermore, the deposition mask 14 is transferred from the second magnetic chuck 44 side to the first magnetic chuck 42 side in the same manner as above, and subjected to a plasma treatment in a plasma treatment apparatus to remove an organic EL deposition material adhering on the deposition mask 14. Then, the deposition mask 14 thus cleaned is again transferred to the second magnetic chuck 44, and is reserved in a state in which it is retained by the second magnetic chuck 44 or the first magnetic chuck 42. Accordingly, there is no possibility that the deposition mask 14 is twisted or warped so that the shape of the opening pattern 6 is distorted or its position is shifted.

Here, the processes for forming the R organic EL layer 3R, the G organic EL layer 3G and the B organic EL layer 3B, may be performed as a continuous process by using the same deposition mask 14.

Figure 44A:
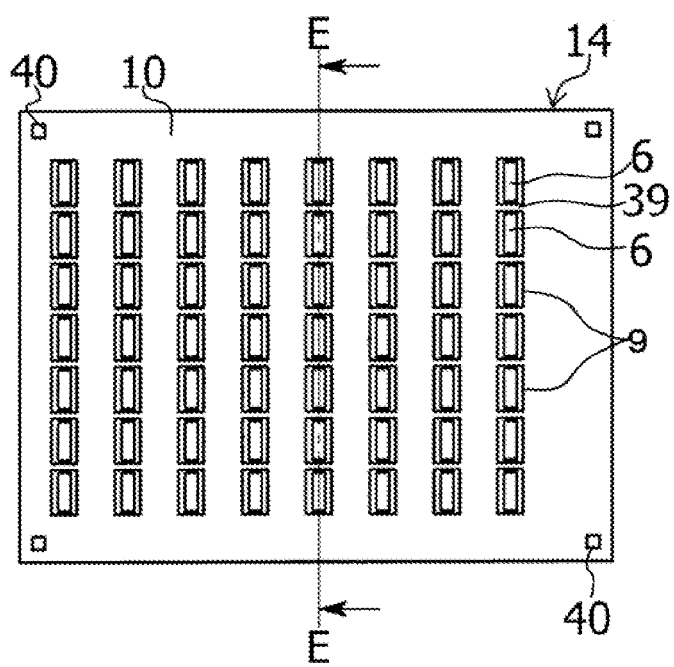
Figure 44C:
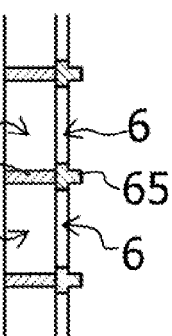
Figure 44D:
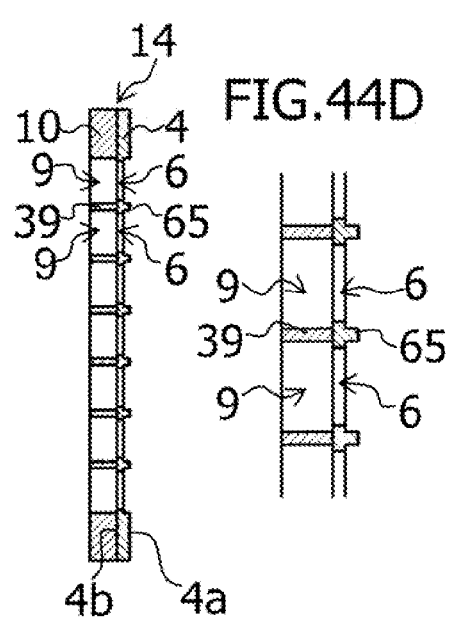
Figure 44B:
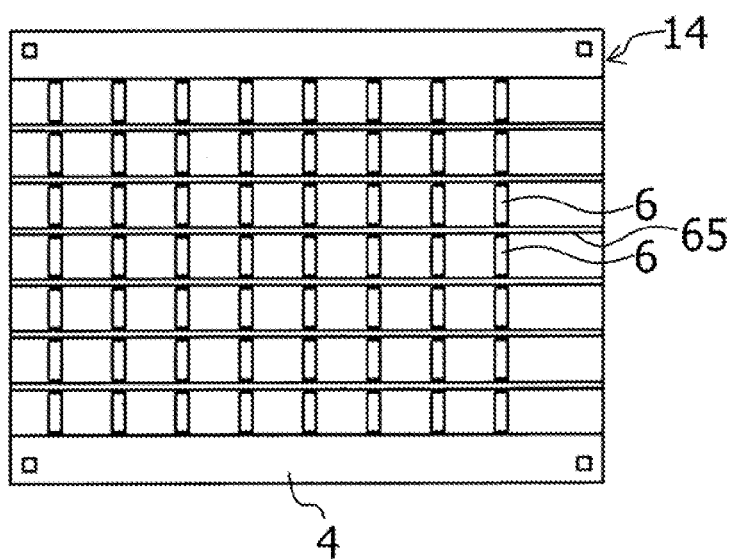

FIGS. 44A to 44D are views illustrating still another modified example of the deposition mask, in which FIG. 44A is a plan view, FIG. 44B is a bottom view, FIG. 44C is a cross-sectional view of an E-E section of FIG. 44A, and FIG. 44D is a partial enlarged view of FIG. 44C. Here, the differences of the abovementioned deposition masks are that, as illustrated in FIGS. 44A and 44B, the film 4 has a plurality of opening patterns 6 isolated from one another at positions corresponding to elongated bridges 39 of the metal member 10 to be described later, and that, as illustrated in FIG. 44C, a ridge portion 65 is formed on a contact surface 4a with the substrate in a position corresponding to a forming position of elongated bridges 39 of the metal member 10 so as to be in parallel to the longitudinal axis of the bridges 39.

Furthermore, in the metal member 10, as illustrated in FIG. 44A, there is formed a plurality of openings 9 which is separated by bridges 39 provided at predetermined portions that do not affect formation of the organic EL layer. Therefore, it is possible to increase the rigidity of the metal member 10 and to suppress warp. Accordingly, it is possible to further improve alignment accuracy of the deposition mask 14 to the substrate to thereby further improve formation accuracy of thin film pattern.

Next, production of the deposition mask having the abovementioned configuration will be described with reference to FIGS. 45A to 45F.

First, as illustrated in FIG. 45A, a surface 4b of the film 4 opposite from the contact surface 4a of the film 4 with the substrate, is surface-joined with the metal member 10 to form the masking member 11 illustrated in FIG. 45B. Here, the metal member 10 is made of e.g. a magnetic material and has a plurality of through openings 9 that is formed so as to correspond to a thin film pattern forming region on the substrate, that has a size greater than that of the thin film pattern, and that is separated by a plurality of elongated bridges 39.

Figure 46:
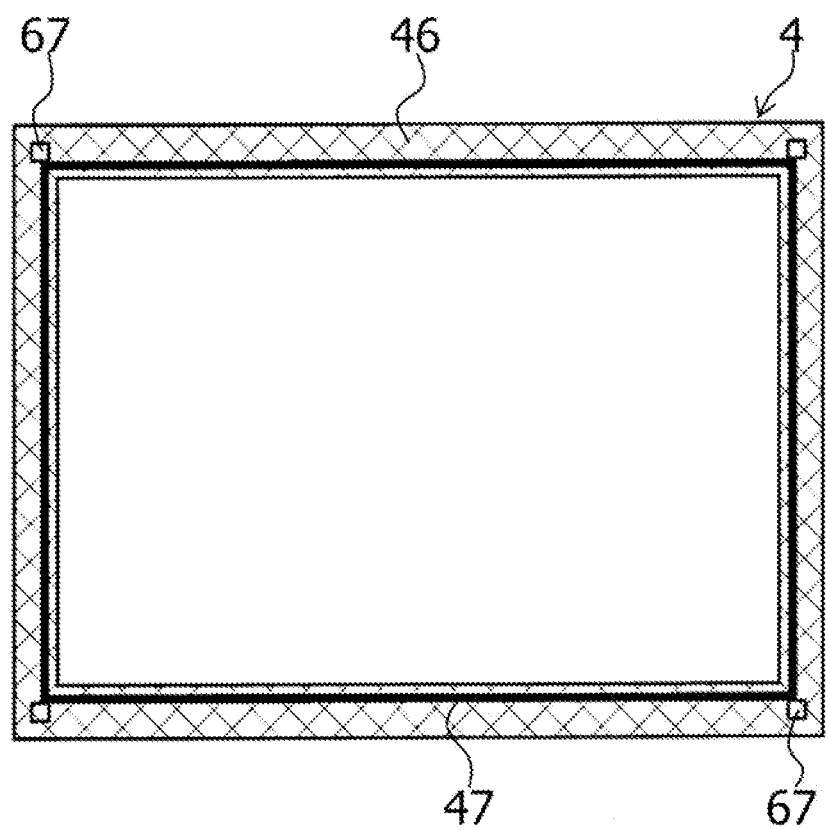
FIG. 46 is a plan view illustrating a construction example of a film to be used for the deposition mask of FIGS. 44A to 44D.
Figure 47:
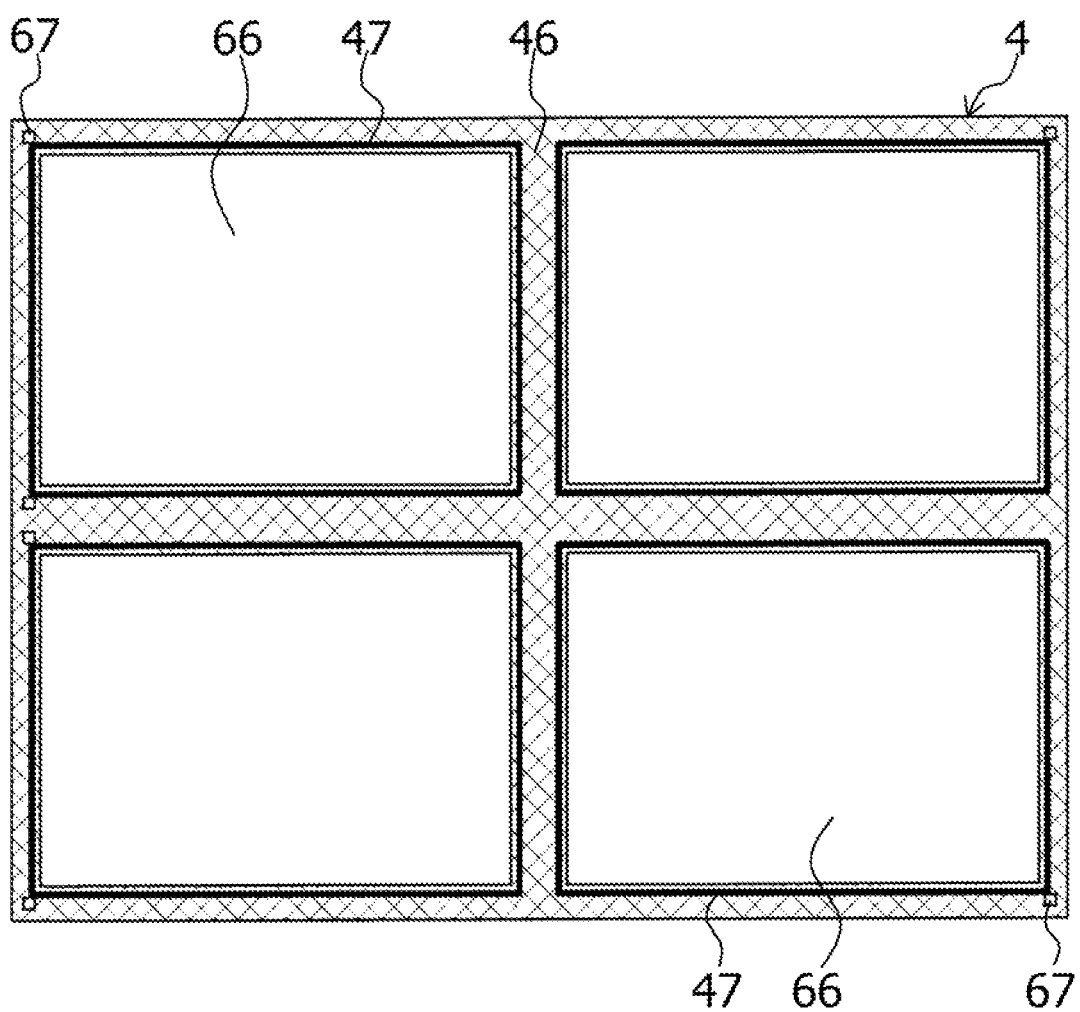
FIG. 47 is a plan view illustrating another construction example of a film to be used for the deposition mask of FIGS. 44A to 44D.

The abovementioned surface-joining is preferably such that, as illustrated in FIG. 46, a film 4 having a part (e.g. peripheral region) coated with a metal film 46 is employed and the film 4 is non-flux soldered with the metal member 10 by using a non-flux solder 47. Furthermore, in a case of forming groups of thin film patterns in a plurality of regions on a substrate, as illustrated in FIG. 47, it is preferred to use a film 4 having a plurality of regions 66 corresponding to the plurality of regions of the substrate, in which peripheral regions of the regions 66 are coated with the metal film 46 and further coated with the non-flux solder 47 so as to surround the plurality of regions 66. When a deposition mask 14 formed by non-flux soldering such a film 4 with the metal member 10 is employed, at a time of e.g. forming an organic EL layer as a thin film pattern by vacuum deposition, no outgas is generated from the solder and there is no possibility that the organic EL layer is damaged by impurities in the outgas. Here, a symbol 67 in FIGS. 46 and 47 indicates an opening formed so as to correspond to the mask-side alignment mark 40 formed in the metal member 10, which allows observation of a substrate-side alignment mark on the substrate through the film 4.

The abovementioned surface-joining includes the abovementioned process of compression bonding a film-shaped resin to the metal member 10, a process of adhesive bonding a film-shaped resin to the metal member 10, a process of compression bonding the metal member to a resin solution of half-dry state, and a process of coating the metal member 10 with a resin in solution form, and the like.

Next, as illustrated in FIG. 45C, the masking member 11 is placed on the reference substrate 38 (for example, it may be a dummy substrate of a TFT substrate for an organic EL display) on which the reference pattern 43 is formed, and thereafter, while the mask-side alignment mark 40 and a substrate-side alignment mark, not illustrated, are observed through e.g. a microscope, the masking member 11 is aligned to the reference substrate 38 so that both marks have a predetermined positional relationship.

Subsequently, by using a laser having a wavelength of 400 nm or shorter such as a KrF excimer laser of 248 nm, as illustrated in FIG. 45D, a portion of the film 4 positioning in the opening 9 of the metal member 10, that is a portion of the film 4 corresponding to a thin film pattern forming region on the reference pattern 43 of the reference substrate 38, is irradiated with laser light L having an energy density of from 0.1 J/cm$^2$ to 20 J/cm$^2$ to form a hole 5 having a predetermined depth leaving a thin layer of about 2 μm in the portion as illustrated in FIG. 45E. By using such laser light L of ultraviolet rays, since carbon bond of the film 4 is immediately destroyed by light energy of laser light L to be removed, it is possible to perform a clean penetrating process with no residue.

Thereafter, as illustrated in FIG. 45F, in a portion of a contact surface 4a of the film 4 to the reference substrate 38, a ridge portion 65 is to be formed, is masked, and light exposure, development and etching are performed to form a groove having a predetermined depth, to thereby form a ridge portion 65 on the contact surface 4a at a position corresponding to the forming position of a bridge 39 of the metal member 10 so as to be in parallel to the longitudinal axis of the bridge 39. Thus, production of the deposition mask 14 according to a fourth embodiment of the present invention is completed.

Next, a process for forming a thin film pattern using the fourth embodiment of the deposition mask 14 of the present invention will be described with reference to FIGS. 48A to 48C, and 50A to 50C. Here, explanation will be made with respect to a case in which the substrate is a TFT substrate 1 for an organic EL display device, which is provided in advance with a partition wall 68 made of e.g. a silicon nitride (SiN) film and having a height sufficient for protruding from a surfaces of organic EL layers 3R to 3B of respective colors, at boundary portions among an R organic EL layer 3R, a G organic EL layer 3G and a B organic EL layer 3B (regions on anode electrodes 2R, 2G and 2B for respective colors) that are thin film patterns as illustrated in FIG. 51.

Figure 48A:
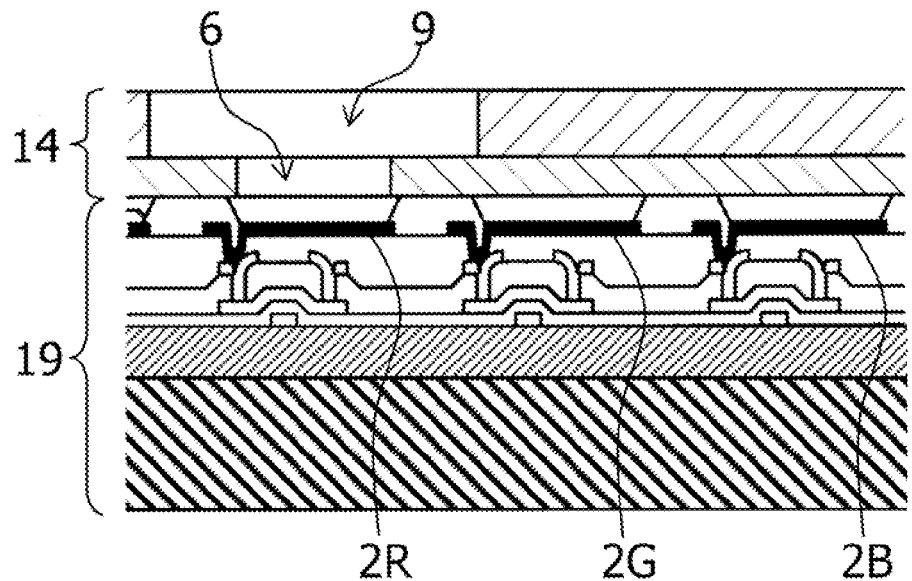
FIGS. 48A to 48B are views illustrating a method for forming a thin film pattern by using the deposition mask of FIGS. 44A to 44D, in which are process views illustrating a process for forming an R organic EL layer in the method.

First, in a first step, as illustrated in FIG. 48A, the deposition mask 14 is placed on the TFT substrate 1, and while the mask-side alignment mark 40 formed in the deposition mask 14 and a substrate-side alignment mark, not illustrated, provided on the TFT substrate 1 in advance, are observed by a microscope, the deposition mask 14 and the TFT substrate 1 are aligned so that both of the marks come into a predetermined positional relationship. Thus, as illustrated in FIG. 48A, the opening pattern 6 of the deposition mask 14 agrees with an anode electrode 2R for R on the TFT substrate 1.

Figure 48B:
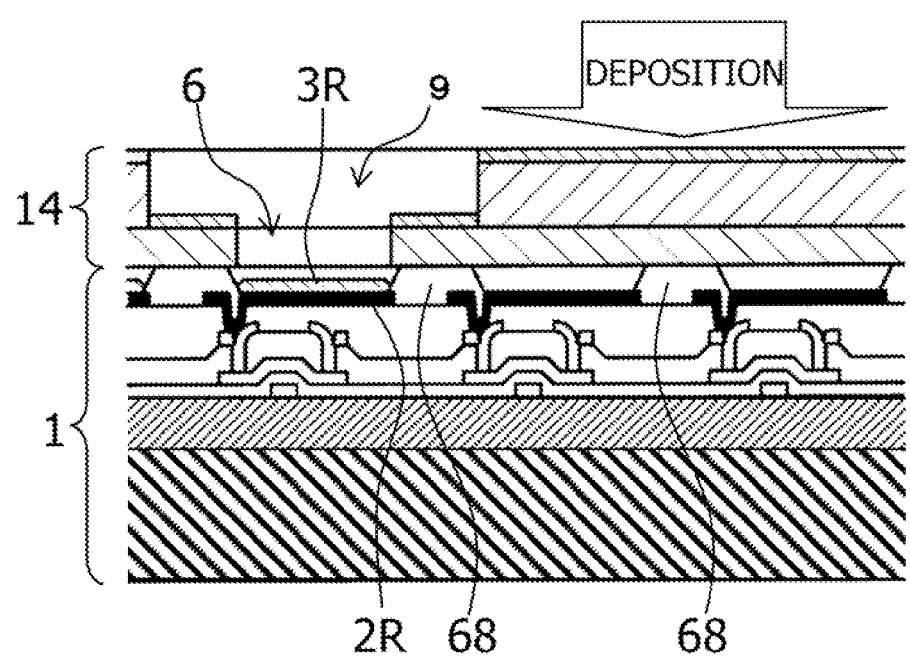

In a second step, the deposition mask 14 and the TFT substrate 1, that are brought into close contact with each other and integrated, are disposed in e.g. a vacuum chamber of a vacuum deposition apparatus, and as illustrated in FIG. 48B, an R organic EL layer 3R is formed by deposition on an anode electrode 2R for R on the TFT substrate 1 through the opening pattern 6 of the deposition mask 14.

Figure 49A:
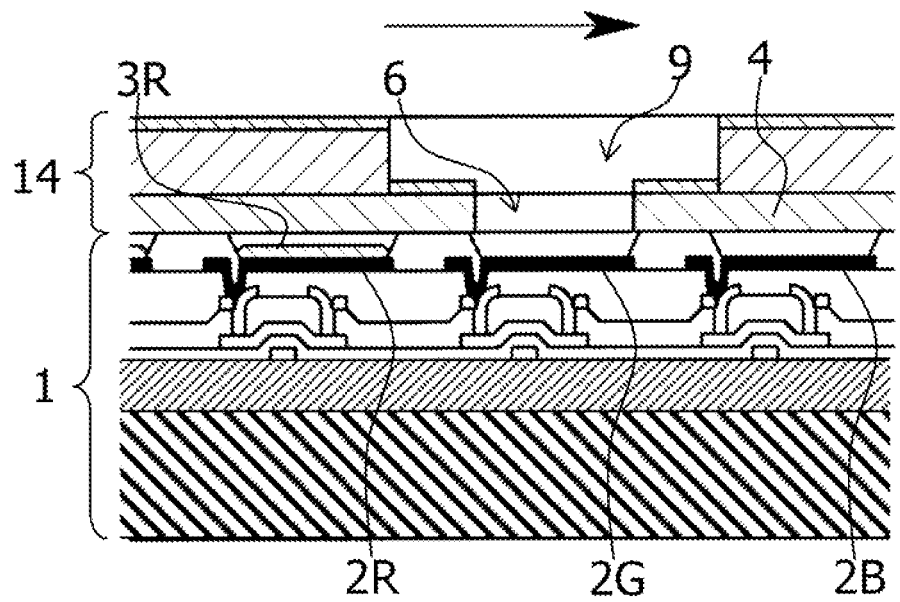
FIGS. 49A and 49B are process views illustrating a process for forming a G organic EL layer by using the deposition mask of FIGS. 44A to 44D.

In a third step, the deposition mask 14 and the TFT substrate 1, that are brought into close contact with each other and integrated, are taken out from the vacuum chamber of the vacuum deposition apparatus, and as indicated by an arrow in FIG. 49A, the deposition mask 14 is moved in a sliding manner on the TFT substrate 1 by a distance that is equal to an arrangement pitch of the organic EL layers 3R to 3B of respective colors in an arrangement direction of the organic EL layers 3R to 3B of respective colors. In this case, while a mask surface is observed through a microscope, adjustment may be made so that the opening pattern 6 of the deposition mask 14 comes on to an anode electrode 2G for G, or the adjustment may be made so that a substrate-side alignment mark for G formed on the TFT substrate 1 agrees with the mask-side alignment mark 40.

Figure 49B:
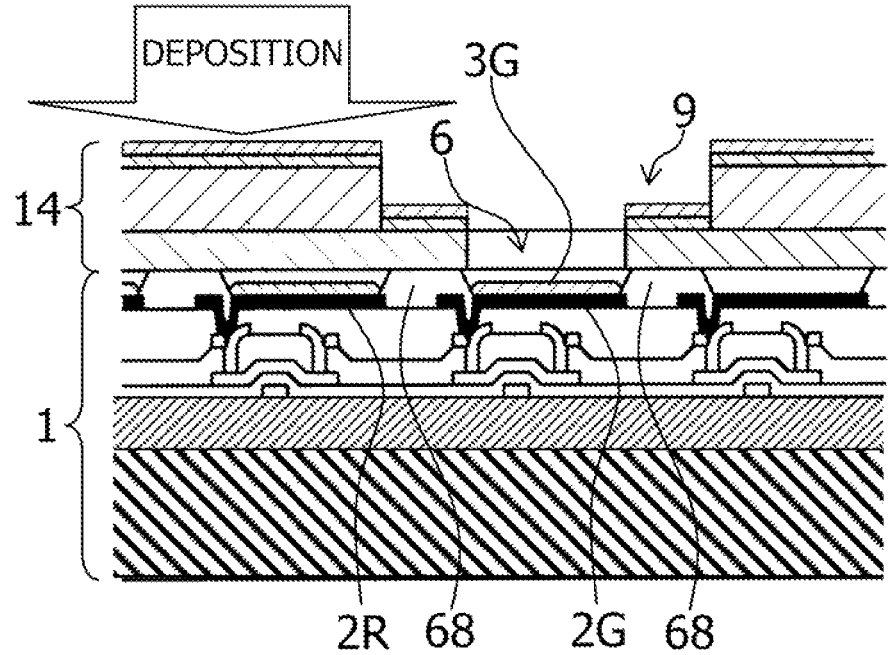

In a fourth step, in the same manner as the second step, the deposition mask 14 and the TFT substrate 1, that are brought into close contact with each other and integrated, are disposed in e.g. the vacuum chamber of the vacuum deposition apparatus, and as illustrated in FIG. 49B, an G organic EL layer 3G is formed by deposition on an anode electrode 2G for G on the TFT substrate 1 through the opening pattern 6 of the deposition mask 14.

Figure 50A:
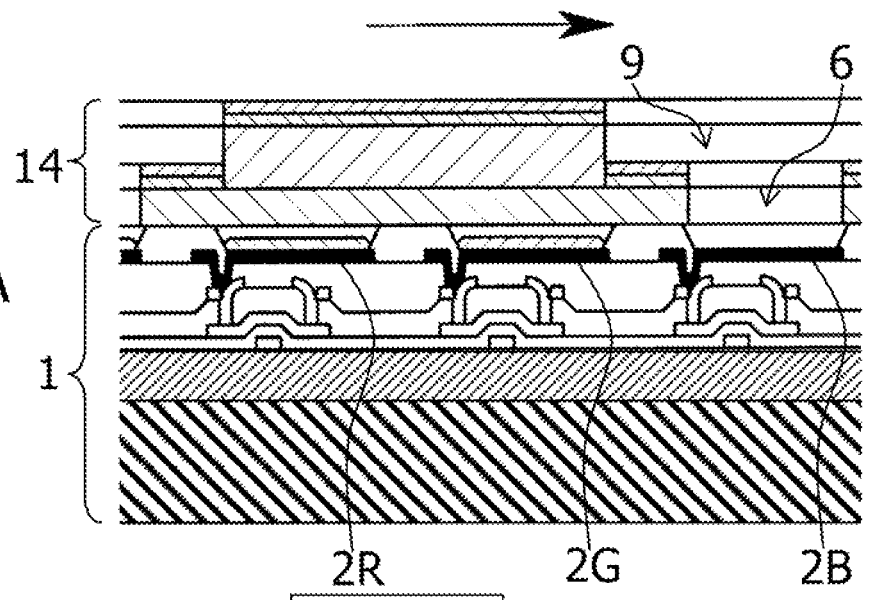
FIGS. 50A and 50B are process views illustrating a process for forming a B organic EL layer by using the deposition mask of FIGS. 44A to 44D.
Figure 51:
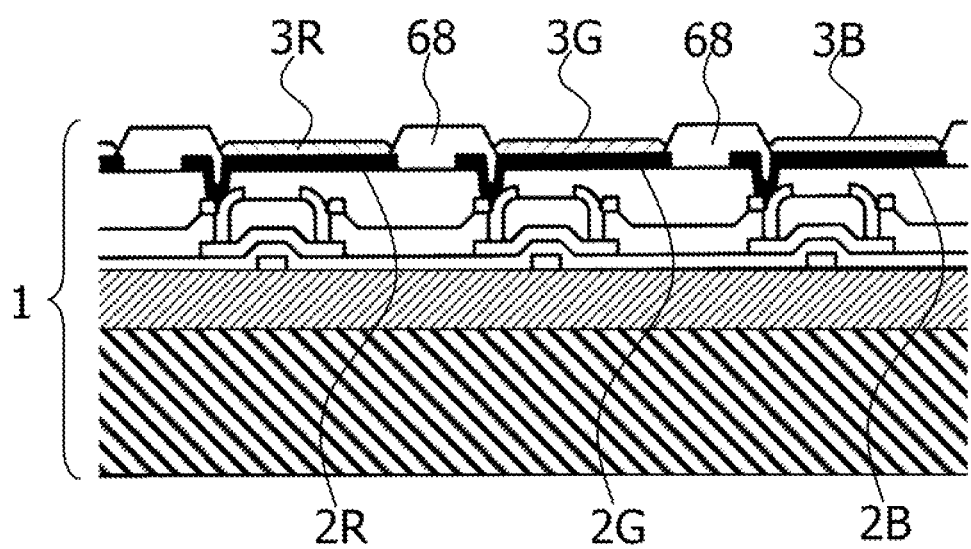
FIG. 51 is a cross-sectional view illustrating a construction example of a TFT (thin-film transistor) substrate for an organic EL display device.

In a fifth step, in the same manner as the third step, the deposition mask 14 and the TFT substrate 1, that are brought into close contact with each other and integrated, are taken out from the vacuum chamber of the vacuum deposition apparatus, and as indicated by an arrow in FIG. 50A, the deposition mask 14 is moved in a sliding manner on the TFT substrate 1 by a distance that is equal to an arrangement pitch of the organic EL layers 3R to 3B of respective colors in an arrangement direction of the organic EL layers 3R to 3B of respective colors so that the opening pattern 6 of the deposition mask 14 comes on to an anode electrode 2B for B.

Figure 50B:
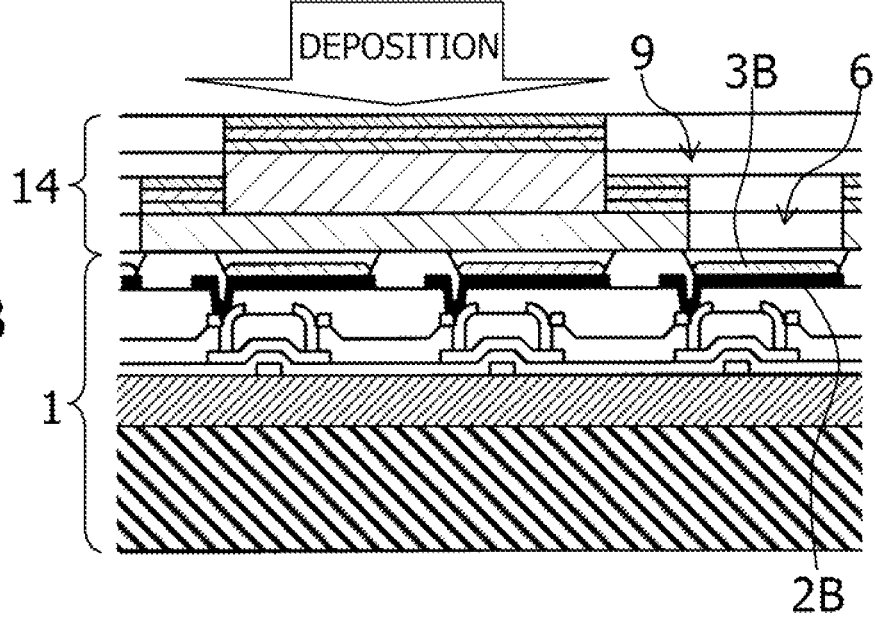

In a sixth step, in the same manner as the second or the fourth step, the deposition mask 14 and the TFT substrate 1, that are brought into close contact with each other to be integrated, are disposed in e.g. the vacuum chamber of the vacuum deposition apparatus, and as illustrated in FIG. 50B, a B organic EL layer 3B is formed by deposition on an anode electrode 2B for B on the TFT substrate 1 through the opening pattern 6 of the deposition mask 14. Therefore, it is possible to form the organic EL layers 3R to 3B of respective colors one after another by using a single mask 14 to thereby perform the process for forming organic EL layers efficiently.

In this case, at a time of moving the deposition mask 14 in a sliding manner in a lateral direction, since the surface 4a of the film 4 does not contact the organic EL layers 3R and 3G, and a ridge portion 65 provided on the surface 4a of the film 4 slides on the partition wall 68, it is possible to reduce a friction between the film 4 and the partition wall 68. Accordingly, it is possible to move the deposition mask 14 stably on the TFT substrate 1 in a sliding manner.

Here, in the above, description has been made with respect to a process for producing an organic EL layer of an organic EL display device as a thin film pattern. However, the present invention is not limited thereto, and is applicable to various applications for forming a fine thin film pattern, such as formation of a color filter of a liquid crystal display device, or formation of a wiring pattern of a semiconductor substrate.

It should be noted that the entire contents of Japanese Patent Applications No. 2011-203154 filed on Sep. 16, 2011, No. 2011-203155 filed on Sep. 16, 2011, No. 2011-232538 filed on Oct. 24, 2011, No. 2011-242089 filed on Nov. 4, 2011, No. 2011-242090 filed on Nov. 4, 2011, No. 2011-255298 filed on Nov. 22, 2011, No. 2012-033657 filed on Feb. 20, 2012, No. 2012-038101 filed on Feb. 24, 2012, No. 2012-079207 filed on Mar. 30, 2012, and No. 2012-080707 filed on Mar. 30, 2012, on which convention priority is claimed, are incorporated herein by reference.

It should also be understood that many modifications and variations of the described embodiments of the invention will be apparent to a person having an ordinary skill in the art without departing from the spirit and scope of the present invention as claimed in the appended claims.

What is claimed is:

1. A method for producing a deposition mask, in which the deposition mask is produced by forming through a resin film that transmits visible light an opening pattern having the same shape and dimension as those of a thin film pattern so as to correspond to a preliminarily determined forming region of the thin film pattern on a substrate, the method comprising:

a first step of bringing the film into close contact with a substrate on which the thin film pattern is to be formed, or with a reference substrate provided with a plurality of reference patterns having the same pitch as that of the thin film pattern and having the same shape and dimension of those of the thin film pattern; and a second step of processing a portion of the film corresponding to the forming region of the thin film pattern on the substrate on which the thin film pattern is to be formed or the reference patterns on the reference substrate, to form an opening pattern having the same shape and dimension as those of the thin film pattern.

2. The method for producing a deposition mask according to claim 1, wherein the first step is performed, after bringing a metal member having an opening formed so as to correspond to the thin film pattern and having a shape and size greater than those of the thin film pattern, into close contact with one surface of the film, thereby forming a masking member, by aligning the masking member so that the region corresponding to the forming region of the thin film pattern on the substrate on which the thin film pattern is to be formed, or the reference patterns on the reference substrate is within the openings.

3. The method for producing a deposition mask according to claim 2, wherein the masking member is formed by thermo compression bonding the metal member with the film under a predetermined temperature and pressure.

4. The method for producing a deposition mask according to claim 2, wherein the masking member is formed by adhesive bonding the metal member with the film.

5. The method for producing a deposition mask according to claim 2, wherein the masking member is formed by press-bonding the metal member with a resin for the film, that has been applied on an upper surface of a flat plate-shaped substrate and dried into a semi-dry state, followed by completely drying the resin.

6. The method for producing a deposition mask according to claim 2, wherein the masking member is formed by applying a resin solution for the film on an upper surface of the metal member placed on an upper surface of a flat plate-shaped substrate, and drying the solution into a film.

7. The method for producing a deposition mask according to claim 2, wherein the masking member is formed by plating one surface of the film with the metal member.

8. The method for producing a deposition mask according to claim 7, wherein the film is retained on a stage having a flat surface by electrostatic attraction.

9. The method for producing a deposition mask according to claim 7, wherein the film is formed by applying a resin transmitting visible light on a flat plate-shaped substrate, and drying the resin.

10. The method for producing a deposition mask according to claim 2, wherein the first step includes etching a surface of the film of the masking member to reduce the thickness of at least a portion of the film corresponding to the opening of the metal member, followed by performing the alignment of the masking member to the substrate on which the thin film pattern is to be formed or the reference substrate.

11. The method for producing a deposition mask according to claim 2, wherein the metal member is made of a magnetic material or a non-magnetic material, and the first step includes placing the substrate on which the thin film pattern is to be formed or the reference substrate on a stage having a chucking device provided therein, and attracting the metal member on to the substrate on which the thin film pattern is to be formed or the reference substrate by the chucking device to thereby sandwich the film.

12. The method for producing a deposition mask according to claim 2, wherein the reference substrate is a transparent substrate of which one surface is provided with the reference patterns, and the second step includes aligning the metal member to the reference substrate placed on the stage so that the reference patterns are on an under side of the reference substrate, so that the reference patterns are present in the openings of the metal member, followed by bringing the film into close contact with the other surface of the reference substrate and irradiating, with laser light, portions of the film corresponding to the reference patterns in the openings of the metal member, to form the opening pattern.

13. The method for producing a deposition mask according to claim 12, wherein the second step includes scanning the metal member, the film and the reference substrate together, meanwhile capturing images of the reference patterns by an image capturing device provided to be capable of capturing images of positions on the upstream side of an irradiation position of the laser light in the scanning direction, detecting the reference patterns based on the captured images, and performing the second step while controlling irradiation timings of the laser light based on the detection times.

14. The method for producing a deposition mask according to claim 13, wherein the second step is performed while confirming that the position error amount between the center of the opening of the metal member and the center of the reference pattern of the reference substrate is within a tolerable range based on a captured image of the image capturing device.

15. The method for producing a deposition mask according to claim 12, which includes peeling the film from the reference substrate after the second step.

16. A method for forming the thin film pattern, in which the thin film pattern is formed by using the deposition mask that has been produced by forming, through the resin film that transmits visible light, the opening pattern having the same shape and dimension as those of the thin film pattern so as to correspond to a preliminarily determined forming region of the thin film pattern on the substrate, by the method according to claim 2;

wherein the method for forming the thin film pattern comprises:

a third step of placing on the substrate the deposition mask that has been produced by providing a metal member on the outside portion of the opening pattern of the film, in a state in which the opening pattern is aligned to the forming region of the thin film pattern on the substrate; and a fourth step of performing deposition on the forming region of the thin film pattern on the substrate through the opening pattern of the deposition mask to form the thin film pattern.

17. The method for forming the thin film pattern according to claim 16, wherein the metal member is a thin plate having an opening having a shape and dimension greater than those of the opening pattern so as to correspond to the opening pattern, and the metal member is brought into close contact with one surface of the film.

18. The method for forming the thin film pattern according to claim 16, wherein the metal member is a plurality of thin pieces provided so as to be distributed on one surface of the film or inside of the film.

19. The method for forming the thin film pattern according to claim 16, wherein the third step includes retaining the deposition mask so that the metal member side thereof is attracted to contact a flat surface of a retaining device, meanwhile aligning the deposition mask so that the opening pattern is aligned to the forming region of the thin film pattern of the substrate placed on a chucking device, followed by attracting the metal member by the chucking device to transfer the deposition mask from the retaining device to on the substrate.

20. The method for forming the thin film pattern according to claim 16, wherein the thin film pattern is a plurality of sorts of thin film patterns and the opening pattern is formed through the film so as to correspond to one sort of thin film pattern among the plurality of sorts of thin film patterns and
wherein the method for forming the thin film pattern further comprises:
a step of peeling the deposition mask from the substrate after performing the first and the second steps to form one sort of thin film pattern;
a step of aligning the opening pattern of the deposition mask to the forming region of another thin film pattern of the substrate, and placing the deposition mask onto the substrate; and
a step of performing deposition on a forming region of another thin film pattern through the opening pattern of the deposition mask, to form another thin film pattern.

21. The method for forming the thin film pattern according to claim 20, wherein the substrate is a TFT substrate for an organic EL display, and the plurality of sorts of thin film patterns are organic EL layers for three colors.

22. The method for forming the thin film pattern according to claim 16, wherein the thin film pattern is a plurality of sorts of thin film patterns formed so as to be arranged at a predetermined pitch, and the opening pattern formed through the film is one formed so as to correspond to one sort of thin film pattern among the plurality of sorts of thin film patterns, and
wherein the method for forming the thin film pattern further comprises:
a step of sliding the deposition mask on the substrate along an arrangement direction of the plurality of sorts of thin film patterns by the same distance as the arrangement pitch of the plurality of sorts of thin film patterns after performing the third step and the fourth step to form one sort of thin film pattern; and
a step of performing deposition on a forming region of another thin film pattern through the opening pattern of the deposition mask, to form another thin film pattern.

23. The method for forming the thin film pattern according to claim 22, wherein the substrate is a TFT substrate for an organic EL display, and the plurality of sorts of thin film patterns are organic EL layers for three colors.

24. The method for producing a deposition mask according to claim 1, wherein the second step is performed by irradiating the portion of the film with laser light.

25. The method for producing a deposition mask according to claim 24, wherein the second step includes irradiating the film with laser light having a predetermined energy density to process the film at a predetermined speed to form a hole of a predetermined depth, followed by irradiating a bottom portion of the hole with laser light having a lowered energy density to process the portion at a lower speed than the above speed to make the hole penetrate through the film.

26. The method for producing a deposition mask according to claim 25, wherein the irradiation with laser light having a lowered energy density is performed in a reactive gas atmosphere that reacts with carbon of the film to evaporate the carbon.

27. The method for producing a deposition mask according to claim 24, wherein the laser light has a wavelength of 400 nm or shorter.

28. The method for producing a deposition mask according to claim 1, wherein the second step includes irradiating the film with laser light having a predetermined energy density to form the hole in the film, followed by etching the bottom portion of the hole by using a reactive gas that reacts with the carbon of the film to evaporate the carbon, or by using radical ions produced by ionizing the reactive gas, to make the hole penetrate through the film.

* * * * *